(12) United States Patent
Shimamoto et al.

(10) Patent No.: US 7,872,298 B2
(45) Date of Patent: Jan. 18, 2011

(54) SPLIT-GATE TYPE MEMORY DEVICE

(75) Inventors: Yasuhiro Shimamoto, Tokorozawa (JP);
Digh Hisamoto, Kokubunji (JP);
Tetsuya Ishimaru, Tachikawa (JP);
Shinichiro Kimura, Kunitachi (JP)

(73) Assignee: Renesas Electronics Corporation,
Kawasaki-shi (JP)

( * ) Notice: Subject to any disclaimer, the term of this patent is extended or adjusted under 35 U.S.C. 154(b) by 518 days.

(21) Appl. No.: 11/777,812

(22) Filed: Jul. 13, 2007

(65) Prior Publication Data

US 2008/0029805 A1 Feb. 7, 2008

(30) Foreign Application Priority Data

Aug. 3, 2006 (JP) .............................. 2006-212321

(51) Int. Cl.
*H01L 29/788* (2006.01)
(52) U.S. Cl. .................. 257/320; 257/410; 257/E29.3; 257/E29.309
(58) Field of Classification Search ................. 257/319, 257/320, 410, E29.3, E29.309
See application file for complete search history.

(56) References Cited

U.S. PATENT DOCUMENTS

| | | | | |
|---|---|---|---|---|
| 5,408,115 | A * | 4/1995 | Chang | 257/324 |
| 2003/0103382 | A1 | 6/2003 | Kobayashi | |
| 2004/0119107 | A1 | 6/2004 | Hisamoto et al. | |
| 2004/0232475 | A1* | 11/2004 | Kataoka et al. | 257/315 |
| 2006/0138603 | A1* | 6/2006 | Cabral et al. | 257/635 |
| 2006/0267116 | A1 | 11/2006 | Shimamoto et al. | |

FOREIGN PATENT DOCUMENTS

| | | |
|---|---|---|
| JP | 5-48113 A | 2/1993 |
| JP | 5-121700 A | 5/1993 |
| JP | 2003-168748 A | 6/2003 |
| JP | 2004-186452 A | 7/2004 |
| JP | 2006-332179 A | 12/2006 |

OTHER PUBLICATIONS

S. Kianian et al., "A Novel 3 Volts-Only, Small Sector Erase, High Density Flash $E^2PROM$," 1994 Symposium on VLSI Technology Digest of Technical Papers, pp. 71-72.
W. Chen et al., "A Novel Flash Memory Device with Split Gate Source Side Injection and ONO Charge Storage Stack SPIN," 1997 Symposium on VLSI Technology Digest of Technical Papers, pp. 63-64.

(Continued)

*Primary Examiner*—Lex Malsawma
(74) *Attorney, Agent, or Firm*—Miles & Stockbridge P.C.

(57) ABSTRACT

Performance and reliability of a semiconductor device including a non-volatile memory are improved. A memory cell of the non-volatile memory includes, over an upper portion of a semiconductor substrate, a select gate electrode formed via a first dielectric film and a memory gate electrode formed via a second dielectric film formed of an ONO multilayered film having a charge storing function. The first dielectric film functions as a gate dielectric film, and includes a third dielectric film made of silicon oxide or silicon oxynitride and a metal-element-containing layer made of a metal oxide or a metal silicate formed between the select gate electrode and the third dielectric film. A semiconductor region positioned under the memory gate electrode and the second dielectric film has a charge density of impurities lower than that of a semiconductor region positioned under the select gate electrode and the first dielectric film.

15 Claims, 41 Drawing Sheets

OTHER PUBLICATIONS

T. Y. Chan et al., "The Impact of Gate-Induced Drain Leakage Current on MOSFET Scaling," 1987 IEEE International Electron Devices Meeting, Technical Digest, pp. 718-721.

C. Hobbs et al., "Fermi Level Pinning at the PolySi/Metal Oxide Interface," 2003 Symposium on VLSI Technology Digest of Technical Papers, pp. 9-10.

T. Mizuno, "Experimental Study of Threshold Voltage Fluctuation Due to Statistical Variation of Channel Dopant Number in MOSFET's," IEEE Transactions on Electrical Devices, Vo. 41, No. 11, Nov. 1994, pp. 2216-2221.

C. Choi, "The Effects of Nitrogen and Silicon Profile on High-K MOSFET Performance and Bias Temperature Instability," 2004 Symposium on VLSI Technology Digest of Technical Papers, pp. 214-215.

* cited by examiner

| Operation \ Voltage | Vd | Vsg | Vmg | Vs | Vb |
|---|---|---|---|---|---|
| Program | 0.5V | 1.0V | 10.5V | 5.5V | 0V |
| Erase | open | 0V | −6.0V | 6.0V | 0V |
| Read | 1.5V | 1.5V | 0V | 0V | 0V |

FIG. 24

| Test-sample code | Amount of hafnium in the metal-element-containing layer 17b (Unit: atoms/cm²) | Dose amount of ion implantation 6 (Unit: ions/cm²) | Dose amount of ion implantation 18 (Unit: ions/cm²) | Center value of memory-transistor threshold voltages Vthi before rewriting (Unit: V) | Variation in Vthi (Unit: V) |
|---|---|---|---|---|---|
| B1 | No | $1.0 \times 10^{13}$ | No | 2.0 | 0.1 |
| B2 | No | $1.0 \times 10^{13}$ | $2.0 \times 10^{12}$ | 0.6 | 0.9 |
| B3 | No | $1.0 \times 10^{13}$ | $4.0 \times 10^{12}$ | −0.8 | 2.0 |
| B4 | No | $1.0 \times 10^{13}$ | $6.0 \times 10^{12}$ | −2.4 | 3.2 |
| C1 | $3.0 \times 10^{14}$ | $8.0 \times 10^{12}$ | No | −0.1 | 0.3 |
| C2 | $3.0 \times 10^{14}$ | $8.0 \times 10^{12}$ | $1.0 \times 10^{12}$ | −0.8 | 0.7 |
| C3 | $3.0 \times 10^{14}$ | $8.0 \times 10^{12}$ | $2.0 \times 10^{12}$ | −1.5 | 1.1 |
| C4 | $3.0 \times 10^{14}$ | $8.0 \times 10^{12}$ | $3.0 \times 10^{12}$ | −2.2 | 1.6 |

$$\text{Variation in Vthi} \propto \frac{q\sqrt{N_B+N_{AS}}}{C_{ox}\sqrt{LW}}$$

SPLIT-GATE TYPE MEMORY DEVICE

CROSS-REFERENCE TO RELATED APPLICATION

The present application claims priority from Japanese Patent Application No. JP 2006-212321 filed on Aug. 3, 2006, the content of which is hereby incorporated by reference into this application.

TECHNICAL FIELD OF THE INVENTION

The present invention relates to a semiconductor device and a method of manufacturing the same and, in particular, to a technology effective in application to a semiconductor device with a non-volatile memory and a method of manufacturing the same.

BACKGROUND OF THE INVENTION

One example of semiconductor storage devices is a non-volatile memory, which is an element in which information stored therein remains even if power is turned off. And, by mounting such a non-volatile memory cell and a logical semiconductor device together on the same silicon substrate, a high-performance semiconductor device can be achieved. Such a high-performance semiconductor device is widely used as an embedded-type microcomputer in industrial machines, household electrical appliances, automobile-mounted devices and the like.

One example of cell structures of such non-volatile memories is a split-gate-type memory cell formed of a MOS transistor for selection (a select transistor or a memory-cell select transistor) and a MOS transistor for storage (a memory transistor) (for example, refer to Japanese Patent Application Laid-Open Publication No. 5-48113 (Patent Document 1), Japanese Patent Application Laid-Open Publication No. 5-121700 (Patent Document 2), "IEEE Symposium on VLSI Technology", U.S.A., 1994, pp. 71-72 (Non-Patent Document 1), and "IEEE Symposium on VLSI Technology", U.S.A., 1997, pp. 63-64 (Non-Patent Document 2)). In this structure, a source side injection (SSI) scheme with high injection efficiency can be used. Therefore, features of this structure include increase in writing speed, reduction in an area of a power supply unit, and also reduction in an area of peripheral circuits because the memory-cell select transistor and a transistor connected thereto can be composed of low-voltage system transistors with small element area.

Charge-holding schemes in a MOS transistor for storage include a floating-gate scheme in which charges are stored in electrically-isolated conductive polycrystalline silicon (for example, refer to Patent Document 2 and Non-Patent Document 1) and a MONOS scheme in which charges are stored in a dielectric film having a property of storing charges, such as a silicon nitride film (for example, refer to Patent Document 1 and Non-Patent Document 2). To get memory chips and memory modules to operate at high speed by using any of these memory-cell structures, it is effective to increase a so-called "cell current" in reading of the memory cell.

For the select transistor, a normal MOS transistor using silicon oxide ($SiO_2$) or silicon oxynitride (SiN) as a gate dielectric film can be used. In this case, according to a process dimension, by using a known technology such as optimization of an impurity density profile of a channel, it is possible to manufacture a high-performance select transistor, with suppressing a leak current in an OFF state. And, as for a memory transistor, by decreasing a threshold voltage determined by a polarity and amount of held charges and the impurity density profile of the channel, a larger "cell current" can be achieved with respect to the same voltage of a memory gate (a gate of the memory transistor).

In the MONOS scheme, the following technology has been known as a technology for decreasing the threshold voltage.

In the case of an n-type memory transistor in which conductive carriers of a channel are electrons, by applying a positive potential to a diffusion layer on a memory-gate side (source region or drain region), a strong inversion can be generated in a region where a memory gate at an end of the diffusion layer and the diffusion layer overlap each other. With this, a band-to-band tunneling occurs, therefore, holes can be generated (for example, refer to "1987 IEEE International Electron Devices meeting, TECHNICAL DIGEST", U.S.A., 1987, pp. 718-721 (Non-Patent Document 3)). In this memory cell, the generated holes are accelerated in a channel direction and drawn by a bias of the memory gate to be implanted into a silicon nitride (SiN) film, therefore, a state of the memory transistor with a low threshold voltage (erase state) can be realized.

Also, Japanese Patent Application Laid-Open Publication No. 2004-186452 (Patent Document 3) discloses a technology in which a channel region of a MONOS memory transistor is doped with counter impurities to decrease a threshold voltage of the memory transistor. At this time, a channel below the memory transistor includes both of an acceptor-type impurity doped into a channel region of a select transistor and a donor-type impurity which is a counter impurity doped into a channel under the memory transistor only. And, the acceptor-type impurity doped into the channel region of the select transistor is adjusted so that an OFF leak is small.

Furthermore, a technology about a flat-band voltage of a MISFET is described in "Symp. on VLSI technology", U.S.A., 2003, p. 9, C. Hobbs, L. Fonseca, V. Dhandapani, S. Samavedam, B. Taylor, J. Grant, L. Dip, D. Triyoso, R. Hedge, D. Gilmer, R. Garcia, D. Roan, L. Lovejoy, R, Rai, L. Hebert, H. Tseng, B. White, and P. Tobin (Non-Patent Document 4).

Still further, a technology about variation in threshold voltage due to fluctuations of impurities is described in "IEEE Transactions on Electron Devices, ED-41", U.S.A., 1994, p. 2216, T. Mizuno et al (Non-Patent Document 5).

And, a technology about Fermi level pinning is described in "IEEE Symposium on VLSI Technology", U.S.A., 2004, p, 214 by L. Pantisano et al (Non-Patent Document 6).

SUMMARY OF THE INVENTION

According to studies by the present inventors, the following has been found.

The present inventors have conducted various studies on advancing performance of a non-volatile semiconductor storage device. For example, a structure of device and the like to achieve improvement in tolerance for rewriting (program/erase) of a split-gate-type memory cell and improvement in a data holding characteristic have been studied.

FIG. 51 is a cross-section view showing a split-gate-type memory cell formed of a select transistor (transistor for selecting a memory cell) 301 and a memory transistor (transistor for storage) 302, which has been studied by the present inventors. In FIG. 51, 303 denotes a gate electrode (select gate) of the select transistor 301, 304 denotes a gate electrode (memory gate) of the memory transistor 302, 305 denotes a gate dielectric film of the select transistor 301, and 306 denotes a gate dielectric film of the memory transistor 302. The gate dielectric film 305 of the select transistor 301 is formed of a silicon oxide film. The gate dielectric film 306 of the memory transistor 302 is formed of an ONO film (a multilayered film of a silicon oxide film, a silicon nitride film, and a silicon oxide film) having a charge storing function. Also in FIG. 51, 307 denotes a semiconductor substrate, 308 and 309 denote impurity diffusion layers functioning as a source or a drain, 310 denotes a channel region of the select transistor 301, and 311 denotes a channel region of the memory transistor 302.

The present inventors have studied the data holding characteristic after rewriting of the memory cell in detail for the split-gate-type memory cell of the MONOS scheme as shown in FIG. 51. Here, electrons are written (injected) into a silicon nitride film (the silicon nitride film in the gate dielectric film 306) using a source side injection (SSI) scheme to cause a state in which a threshold voltage of the memory transistor 302 is high (a program state). Also, holes are injected (into the silicon nitride film in the gate dielectric film 306) by band-to-band tunneling to cause a state in which the threshold voltage of the memory transistor 302 is low (erase state).

In the memory cell using such an injection scheme as described above, it has been known that hot carriers damage a dielectric film (silicon oxide film or silicon nitride film in the gate dielectric film 306) and its interface. This causes deterioration in the charge holding characteristic. That is, an interface state and a trap are generated to cause injection and discharge with respect to these or injection and discharge therethrough.

FIG. 52 is a graph showing changes with time in threshold voltage in an erase state after rewriting hundred thousand times. A horizontal axis in the graph of FIG. 52 corresponds to an elapsed time from setting the state to an erase state after rewriting hundred thousand times, and a vertical axis in the graph of FIG. 52 corresponds to a threshold voltage of the memory transistor after elapsing time corresponding to the horizontal axis. Note that, in FIG. 52, the case where an initial threshold voltage Vthi of the memory transistor before rewriting (initial threshold voltage Vthi before injecting charges into the gate electrode of the memory transistor) is 0.6 V and the case where the initial threshold voltage Vthi is −0.9 V are both plotted on the graph.

In order to obtain a sufficiently large cell current with the voltage applied to the memory gate 304 at reading being 0 V, the present inventors adjusted the threshold voltage in an erase state with density of impurities doped into the channel region 311 of the memory transistor 302, or the amount of holes injected into the silicon nitride film in an erase state. As a result, it has been found that, in the case where counter impurities (impurities of a conducting type reverse to a conducting type of impurities doped into the channel region 310 of the select transistor 301) are doped into the channel region 311 of the memory transistor 302 in FIG. 51, as the amount of counter impurities is larger, the initial threshold voltage (Vthi) of the memory transistor 302 before injecting charges into the ONO film (the gate dielectric film 306) is lower, and the amount of holes trapped in the silicon nitride film (the silicon nitride film in the gate dielectric film 306) in an erase state is smaller. It has also been found that, as shown in FIG. 52, as the initial threshold voltage Vthi is decreased by increasing the amount of counter impurities, an increase in threshold voltage due to rewriting can be more suppressed.

However, the studies by the present inventors about variation in the initial threshold voltages Vthi of a plurality of memory transistors 302 in a memory chip shows that as the amount of counter impurities in the channel region 311 of the memory transistor 302 is larger and a center value of the initial threshold voltages Vthi (corresponding to an average value of initial threshold voltages Vthi of the plurality of memory transistors 302 in the memory chip) is smaller, variation in the initial threshold voltages Vthi are larger.

In order to increase program and erase speeds, a scheme of rewriting (program and erase) a plurality of memory cells simultaneously is used. However, in the case where variation in the threshold voltage Vthi for each memory transistor 302 in the memory chip is large, it is required to increase the amount of electrons injected or the amount of holes to ensure a sufficient margin of the threshold voltage between a program state and an erase state. In this case, since the amount of hot carriers injected per rewriting is increased, the damage is increased, as a result, problems of deterioration in the data holding characteristic and deterioration in tolerance for rewriting occur. This deteriorates performance and reliability of the semiconductor device including the non-volatile memory.

Here, it is desired to provide a non-volatile semiconductor storage device including a split-gate-type memory cell of a MONOS type, achieving both an increase in tolerance for rewriting and improvement in a data holding characteristic, capable of solving above mentioned problems.

Also, the present inventors have studied a split-gate-type memory cell of a floating-gate type. In the case of the floating-gate type, since charges are stored in a conductive material, if at least one defect which may cause a leak path exists over an oxide film around the floating gate, a charge-holding life is extremely deteriorated. Therefore, injection of hot holes through band-to-band tunneling used in the MONOS scheme cannot be adopted because the damage on the oxide film is huge. Thus, in order to decrease a threshold voltage of the memory transistor, a scheme of increasing the amount of counter impurities doped into the channel region of the memory transistor can be used. However, as with the above-described MONOS scheme, due to a large amount of counter impurities or a large density of impurities doped into the channel regions of the select transistor and the memory transistor in common for adjusting the threshold voltage of the select transistor, variation in threshold voltages of the memory transistors (corresponding to above mentioned Vthi) becomes large. An increase in variation in the threshold voltages (Vthi) of the memory transistors causes an increase in the amount of electrons injected to the floating gate through a source side injection (SSI) scheme and an increase in stress at an erasing operation pulling electrons to ensure a window of the threshold voltage. Therefore, the damage to the oxide film around the floating gate is increased, and problems of deterioration in data holding characteristic and decrease in tolerance for rewriting occur. This deteriorates performance and reliability of the semiconductor device including the non-volatile memory.

Therefore, it is desired to provide a non-volatile semiconductor storage device capable of suppressing variation in threshold voltage of a memory transistor even in a split-gate-type memory cell of a floating-gate type, achieving both an increase in tolerance for rewriting and improvement in a data holding characteristic.

An object of the present invention is to provide a technology capable of improving performance of a semiconductor device.

And, another object of the present invention is to provide a technology capable of increasing reliability of a semiconductor device.

The above-described and other objects and novel characteristics of the present invention will become apparent from the description of the specification and the attached drawings.

An outline of typical elements of the invention disclosed in this application is described briefly as follows.

The present invention provides a semiconductor device comprising a first gate electrode and a second gate electrode formed over an upper portion of a semiconductor substrate so as to be adjacent to each other, a first layer formed between the first gate electrode and the semiconductor substrate functioning as a gate dielectric film of the first gate electrode, a second layer formed between the second gate electrode and the semiconductor substrate including a charge storage portion, a first channel region formed over the semiconductor substrate so as to be positioned under the first gate electrode and the first layer, and a second channel region formed over the semiconductor substrate so as to be positioned under the second gate electrode and the second layer, in which the first layer includes a metal element, and charge density of impurities in the first channel region is different from charge density of impurities in the second channel region.

And, the present invention provides a method of manufacturing a semiconductor device including a first gate electrode and a second gate electrode formed over an upper portion of a semiconductor substrate so as to be adjacent to each other, a first gate dielectric film formed between the first gate electrode and the semiconductor substrate, a second layer formed between the second gate electrode and the semiconductor substrate including a charge storage portion, a first channel region formed over the semiconductor substrate so as to be positioned under the first gate electrode and the first gate dielectric film and a second channel region formed over the semiconductor substrate so as to be positioned under the second gate electrode and the second layer. The method comprises steps of (a) preparing the semiconductor substrate, (b) doping impurities of a first conducting type into regions of the semiconductor substrate that are supposed to be the first channel region and the second channel region, (c) forming a first dielectric film for forming the first gate dielectric film over the semiconductor substrate from a silicon oxide film or a silicon oxynitride film, (d) depositing a metal-element-containing layer made of a metal oxide or a metal silicate over the first dielectric film, (e) forming a silicon film for forming the first gate electrode over the first dielectric film deposited with the metal-element-containing layer, (f) forming the first gate electrode by patterning the silicon film and (g) after the step (f), doping impurities of a second conducting type inverse to the first conducting type into a region of the semiconductor substrate supposed to be the second channel region.

And, the present invention provides a method of manufacturing a semiconductor device including a first gate electrode and a second gate electrode formed over an upper portion of a semiconductor substrate so as to be adjacent to each other, a first gate dielectric film formed between the first gate electrode and the semiconductor substrate, a second layer including a charge storage portion formed between the second gate electrode and the semiconductor substrate, a first channel region formed over the semiconductor substrate so as to be positioned under the first gate electrode and the first gate dielectric film and a second channel region formed over the semiconductor substrate so as to be positioned under the second gate electrode and the second layer. The method comprises steps of (a) preparing the semiconductor substrate, (b) doping impurities of a first conducting type into regions of the semiconductor substrate that are supposed to be the first channel region and the second channel region, (c) forming a first dielectric film for forming the first gate dielectric film over the semiconductor substrate from a silicon oxide film or a silicon oxynitride film, (d) forming a silicon film for forming the first gate electrode over the first dielectric film, (e) ion-implanting a metal element near an interface between the first dielectric film and the silicon film, (f) forming the first gate electrode by patterning the silicon film and (g) after the step (f), doping impurities of a second conducting type inverse to the first conducting type into a region of the semiconductor substrate supposed to be the second channel region.

Also, the present invention provides a semiconductor device in which a gate dielectric film of a select transistor composing a memory cell includes a multilayered film formed of a dielectric film made of silicon oxide or silicon oxynitride and a high-k gate dielectric film over the dielectric film. The threshold voltage of the select transistor is controlled by a change of a work function of a select gate caused by Fermi level pinning in interface between the high-k gate dielectric film and a select gate. With this, charge densities of impurities of a channel region controlled by the select gate and a channel region controlled by a memory gate are controlled.

Effects obtained by the typical elements of the invention disclosed in this application are described briefly as follows.

It is possible to improve performance of a semiconductor device.

Also, it is possible to improve reliability of a semiconductor device.

BRIEF DESCRIPTIONS OF THE DRAWINGS

FIG. 24 is a table showing conditions for manufacturing a non-volatile semiconductor storage device and characteristics thereof;

DESCRIPTIONS OF THE PREFERRED EMBODIMENTS

Figure 1:
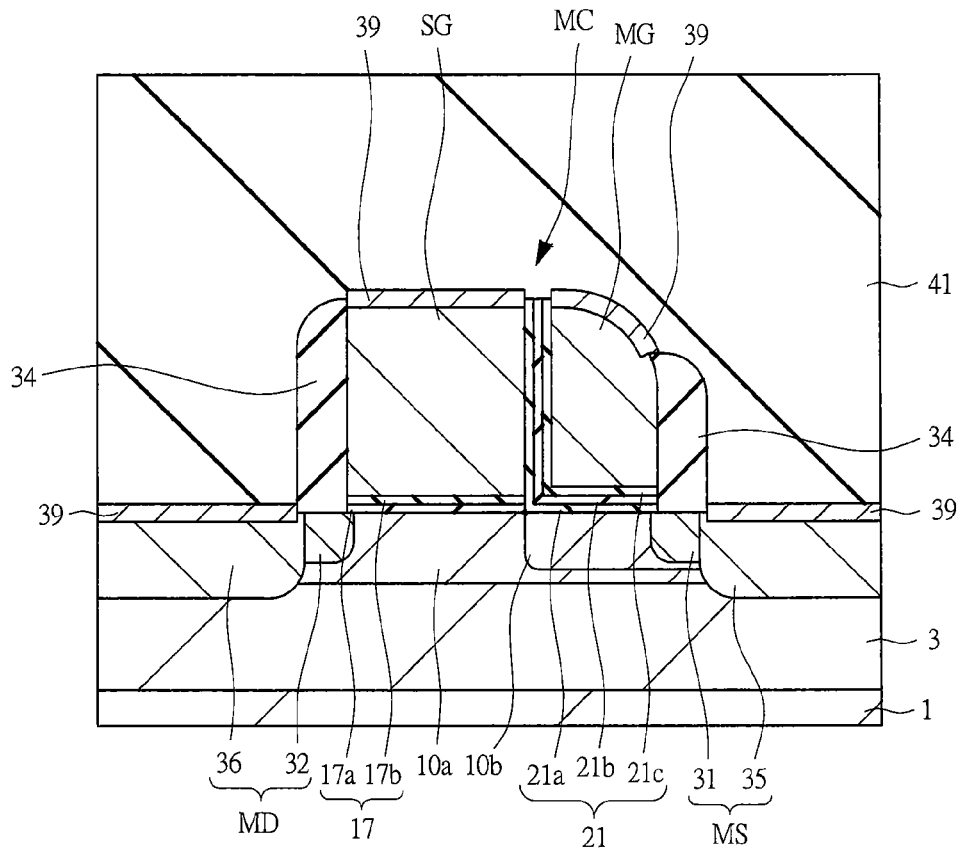
FIG. 1 is a cross-sectional diagram of main parts of a semiconductor device according to an embodiment of the present invention.

In the following embodiments, if necessary for convenience, the invention is described with a plurality of sections or embodiments in a divided manner. However, unless explicitly mentioned, these sections or embodiments are not unrelated to one another. One is a modification example, a detail, a supplement, or the like of all or part of the others. Also, in the following embodiments, when the number of elements and others (including the numbers, numerical values, amounts, ranges, and the like) are referred to, such number is not restricted to a specific number, and can be above or below the specific number, unless explicitly mentioned or the number is apparently restricted to the specific number according to the principle. Furthermore, in the following embodiments, it is needless to say that the components (including component steps and the like) are not necessarily essential unless explicitly mentioned or they are apparently essential according to the principle. Similarly, in the following embodiments, when the shape, position, relation, and the like of the components and the like are referred to, it is assumed that they can include those substantially close to or similar to the shapes and the like, unless explicitly mentioned or such inclusion can be apparently not considered to be the case according to the principle. The same goes for the numerical values and ranges mentioned above.

The embodiments of the present invention are described in detail below based on the drawings. Note that, in all drawings for explaining the embodiments, members having the same function are provided with the same reference symbols, and repeated explanation of such members is omitted. Also, in the following embodiments, in principle, the same or similar portions are not repeatedly explained unless particularly necessary.

Also, in the drawing used in the embodiments, hatching may be omitted even in a cross-sectional diagram for the purpose of easy viewing of the drawing. Furthermore, hatching may be provided even in a plan diagram for the purpose of easy viewing.

First Embodiment

In a first embodiment, a trap dielectric film (a dielectric film capable of storing charge) is used mainly as a charge storage portion. Therefore, in the following, an explanation is made to a memory cell using a trap dielectric film based on an n-channel-type MISFET (Metal Insulator Semiconductor Field Effect Transistor). And, polarities in the following embodiments (polarity of an applied voltage at program, erase, or read and polarity of carriers) are for explaining operation in the case of the memory cell based on the n-channel-type MISFET. In the case of a memory cell based on a p-channel-type MISFET, by reversing all polarities of an applied voltage, carriers, and conducting type of impurity, the same operation is obtained in principle.

A semiconductor device and method of manufacturing the same according to the present embodiment are described with reference to the drawings.

Figure 2:
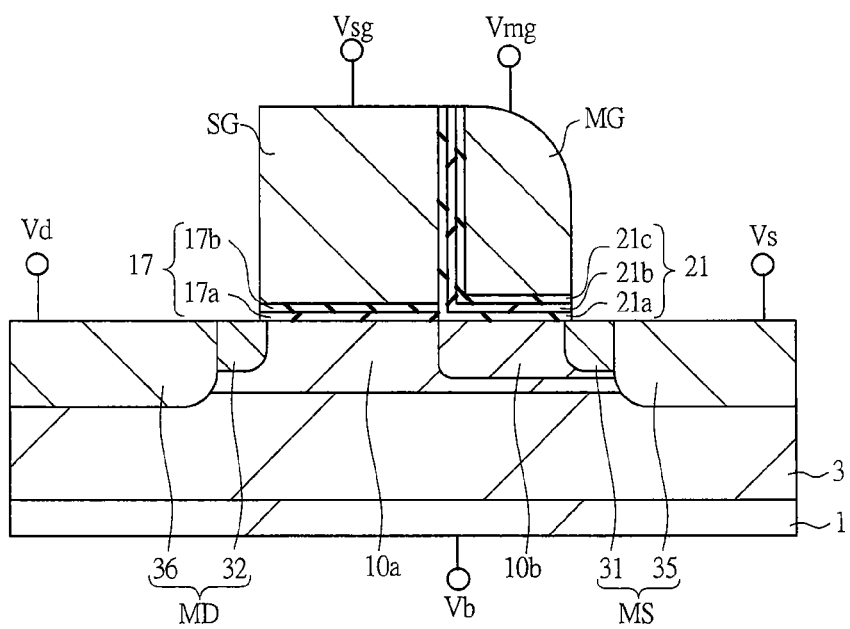
FIG. 2 is a cross-sectional diagram of main parts of the semiconductor device according to an embodiment of the present invention.
Figures 3, 4:
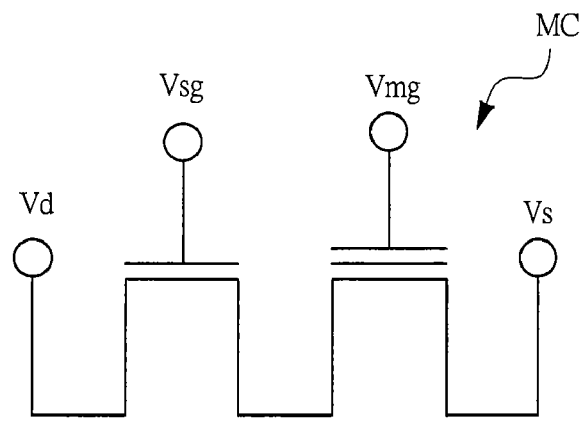
FIG. 3 is an equivalent circuit diagram of a memory cell.
FIG. 4 is a table showing an example of conditions for applying a voltage to each portion of a select memory cell at the time of "program", "erase", and "read"

FIG. 1 is a cross-sectional diagram of main parts of the semiconductor device according to the present embodiment. The semiconductor device according to the present embodiment is a semiconductor device (non-volatile semiconductor storage device) including a non-volatile memory (a non-volatile storage element, a flash memory, or a non-volatile semiconductor storage device), and FIG. 1 shows a cross-sectional diagram of main parts of a memory cell region in the non-volatile memory of the present embodiment. FIG. 2 is a cross-sectional diagram showing a schematic cross-sectional structure of a memory cell MC of the semiconductor device according to the present embodiment. FIG. 3 is an equivalent circuit diagram of the memory cell MC. For simplification, among the structure of FIG. 1, FIG. 2 shows only a p-type well 3, dielectric films 17 and 21, a select gate electrode SG, a memory gate electrode MG, and semiconductor regions MS and MD, and side-wall dielectric films 34, a metal silicide layer 39, and a dielectric film 41 are omitted. Also, for easy understanding, voltages Vd, Vsg, Vmg, Vs, and Vb to be applied to the respective components are schematically shown in FIG. 2.

As shown in FIGS. 1 and 2, over a semiconductor substrate (semiconductor wafer) 1 made of p-type monocrystalline silicon or the like having a resistivity of, for example, 1 to 10 Ωcm, an element isolation region for isolating an element is formed (not shown). On an active region isolated by the element isolation region, the p-type well 3 is formed. On the p-type well 3 of the memory cell region, a memory cell MC, which is a non-volatile memory formed of a memory transistor and a select transistor (control transistor) as shown in FIGS. 1 and 2 is formed. On each memory cell region, a plurality of memory cells MC are formed in an array and each memory cell region is electrically isolated from another region by the element isolation region.

As shown in FIGS. 1 to 3, the memory cell MC of the non-volatile memory in the semiconductor device according to the present embodiment is a split-gate-type memory cell using a MONOS film, and is formed of two MISFETs (a select transistor and a memory transistor) connected together. The select transistor is formed of a select gate electrode (a control gate electrode, a select gate, or a gate electrode of the select transistor) SG and the memory transistor is formed of a memory gate electrode (a memory gate or a gate electrode of the memory transistor) MG.

Here, the MISFET (Metal Insulator Semiconductor Field Effect Transistor) formed of the memory gate electrode MG is referred to as a memory transistor (transistor for storage), and the MISFET formed of the select gate electrode SG is referred to as a select transistor (transistor for selecting a memory cell, or control transistor). Therefore, the select gate electrode SG and the memory gate electrode MG are gate electrodes forming (a memory cell of) a non-volatile memory.

As shown in FIGS. 1 and 2, the memory cell MC of the non-volatile memory in the semiconductor device according to the present embodiment includes the n-type semiconductor regions MS and MD for source and drain formed in the p-type well 3 over a semiconductor substrate 1, the select gate electrode (first gate electrode) SG and the memory gate electrode (second gate electrode) MG formed over an upper portion of the semiconductor substrate 1 (semiconductor regions 10a and 10b in the p-type well 3), the dielectric film (gate dielectric film or first layer) 17 formed between the select gate electrode SG and the semiconductor substrate 1 (semiconductor regions 10a in the p-type well 3), and the dielectric film 21 formed between the memory gate electrode MG and the semiconductor substrate 1 (semiconductor region 10b in the p-type well 3) and between the memory gate electrode MG and the select gate electrode SG.

The select gate electrode SG and the memory gate electrode MG forming a non-volatile memory extend along a main surface of the semiconductor substrate 1 in a state where the dielectric film 21 is interposed between their side surface facing each other, and are disposed beside each other. The select gate electrode SG and the memory gate electrode MG of the memory cell MC are formed over the upper surface of the semiconductor substrate 1 between the semiconductor region MD and the semiconductor region MS (semiconductor regions 10a and 10b in the p-type well 3) via the dielectric films 17 and 21, respectively, and the memory gate electrode MG is positioned on a semiconductor region MS side and the select gate electrode SG is positioned on a semiconductor region MD side. The select gate electrode SG and the memory gate electrode MG are adjacent to each other, between which the dielectric film 21 is interposed. The memory gate electrode MG is formed in a shape of a side wall spacer over a side wall of the select gate electrode SG via the dielectric film 21. And, the dielectric film 21 extends over both of a region between the memory gate electrode MG and the semiconductor substrate 1 (semiconductor region 10b in the p-type well 3) and a region between the memory gate electrode MG and the select gate electrode SG.

The dielectric film 21 between the memory gate electrode MG and the semiconductor substrate 1 (p-type well 3) (that is, the dielectric film 2 under the memory gate electrode MG) functions as a gate dielectric film (gate dielectric film including a charge storage portion therein) of the memory transistor.

The dielectric film 21 is a dielectric film (ONO film) formed of a multilayered film of a silicon nitride film 21b for storing charges (that is, a charge storage portion) and a multilayered film of silicon oxide films 21a and 21c positioned below and above the silicon nitride film 21b, respectively. That is, the dielectric film 21 is configured of an ONO (oxide-nitride-oxide) film in which the silicon oxide film 21a, the silicon nitride film 21b, and the silicon oxide film 21c are multilayered in order of decreasing distance from the memory gate electrode MG. The silicon nitride film 21b is a trap dielectric film formed in the dielectric film 21, and functions as a charge storage film (charge storage portion) for storing charges. Therefore, the dielectric film 21 can be regarded as a dielectric film including a charge storage portion therein. Therefore, the dielectric film 21 is a layer (second layer) formed between the memory gate electrode MG and the semiconductor substrate 1 (semiconductor region 10b) and including a charge storage portion therein.

Thus, as a gate dielectric film of a memory transistor, the dielectric film 21, which is an ONO (Oxide Nitride Oxide) multilayered film is used, and a so-called MONOS (Metal Oxide Nitride Oxide Semiconductor) structure is formed and charges can be held in (the silicon nitride film 21b of) this dielectric film 21.

The dielectric film 17 formed between the select gate electrode SG and the semiconductor substrate 1 (semiconductor region 10a in the p-type well 3) (that is, the dielectric film 17 under the select gate electrode SG) functions as a gate dielectric film of the select transistor (select gate electrode SG). That is, the dielectric film 17 is a layer (first layer) formed between the select gate electrode SG and the semiconductor substrate 1 (semiconductor region 10a), functioning as a gate dielectric film of the select gate electrode SG (select transistor).

The dielectric film 17 functioning as a gate dielectric film of the select gate electrode SG (select transistor) includes a dielectric film (dielectric layer or first dielectric film) 17a made of silicon oxide or silicon oxynitride formed over the semiconductor substrate 1 (semiconductor region 10a in the p-type well 3) and a metal-element-containing layer (threshold voltage adjusting layer) 17b formed (at an interface) between the select gate electrode SG and the dielectric film 17a. That is, the dielectric film 17 is formed of the multilayered film (multilayered structure) of the dielectric film 17a made of silicon oxide or silicon oxynitride and the metal-element-containing layer 17b formed over the dielectric film 17a. Since the metal-element-containing layer 17b includes a metal element, the dielectric film 17 including the metal-element-containing layer 17b can be regarded as a layer containing a metal element.

The metal-element-containing layer 17b includes a metal element. The metal element forming the metal-element-containing layer 17b is preferably hafnium (Hf), zirconium (Zr), or aluminum (Al). And, the metal-element-containing layer 17b is preferably made of a metal oxide or a metal silicate (a compound formed of a metal oxide and a silicon oxide), but may be configured of a material obtained by injecting nitrogen into it (a metal oxide or a metal silicate).

The semiconductor region MS is a semiconductor region functioning as one of a source region or a drain region, and the semiconductor region MD is a semiconductor region functioning as the other one of the source region and the drain region. Here, the semiconductor region MS is a semiconductor region functioning as a source region, and the semiconductor region MD is a semiconductor region functioning as a drain region. The semiconductor regions MS and MD are formed of semiconductor regions doped with n-type impurities (n-type impurity diffusion layer), and each have an LDD (lightly doped drain) structure. That is, the semiconductor region MS for source includes an $n^-$-type semiconductor region 31 and an $n^+$-type semiconductor region 35 with impurity density higher than that of the $n^-$-type semiconductor region 31. The semiconductor region MD for drain includes an $n^-$-type semiconductor region 32 and an $n^+$-type semiconductor region 36 with impurity density higher than that of the $n^-$-type semiconductor region 32.

On side walls of the memory gate electrode MG and the select gate electrode SG (side walls on a side where these electrode are not adjacent to each other), side-wall dielectric films (side walls or side-wall spacers) 34 made of dielectric material (silicon oxide film or dielectric film), such as silicon oxide, are formed.

The $n^-$-type semiconductor region 31 of the source portion is formed in a self-aligned manner with respect to the side wall of the memory gate electrode MG, and the $n^+$-type semiconductor region 35 is formed in a self-aligned manner with respect to a side surface of the side-wall dielectric film 34 over the side wall of the memory gate electrode MG (a side surface opposite to a side in contact with the memory gate electrode MG). Therefore, the low-density $n^-$-type semiconductor region 31 is formed so as to be adjacent to the channel region of the memory transistor, and the high-density $n^+$-type semiconductor region 35 is formed so as to be in contact with the low-density $n^-$-type semiconductor region 31 and be spaced an amount of the $n^-$-type semiconductor region 31 away from the channel region of the memory transistor.

The $n^-$-type semiconductor region 32 of the drain portion is formed in a self-aligned manner with respect to the side wall of the select gate electrode SG, and the $n^+$-type semiconductor region 36 is formed in a self-aligned manner with respect to a side surface of the side-wall dielectric film 34 over the side wall of the select gate electrode SG (a side surface opposite to a side in contact with the select gate electrode SG). Therefore, the low-density $n^-$-type semiconductor region 32 is formed so as to be adjacent to the channel region of the select transistor, and the high-density $n^+$-type semiconductor region 36 is formed so as to be in contact with the low-density $n^-$-type semiconductor region 32 and be spaced an amount of the $n^-$-type semiconductor region 32 away from the channel region of the select transistor.

The channel region of the memory transistor is formed under the dielectric film 21 under the memory gate electrode MG, and the channel region of the select transistor is formed under the dielectric film 17 under the select gate electrode SG. In the channel formation region of the select transistor under the dielectric film 17 under the select gate electrode SG, a semiconductor region (p-type semiconductor region) 10a for adjusting a threshold of the select transistor is formed. In the channel formation region of the memory transistor under the dielectric film 21 under the memory gate electrode MG, a semiconductor region (p-type semiconductor region or n-type semiconductor region) 10b for adjusting a threshold of the memory transistor is formed.

That is, a channel portion (a channel region) positioned between the semiconductor region MS functioning as one of a source and a drain (here, as a source) and the semiconductor region MD functioning as the other one of a source and a drain (here, as a drain) is composed of a semiconductor region (a region or a first channel region) 10a under the select gate electrode SG that can be controlled by the select gate electrode SG and a semiconductor region (a region or a second channel region) 10b under the memory gate electrode MG that can be controlled by the memory gate electrode MG. Precisely, (a region corresponding to) a region interposed between these two gate electrodes (the memory gate electrode MG and the select gate electrode SG) is formed (as a channel portion), and this region can be made extremely narrow with a width of approximately the film thickness of the ONO film (dielectric film 21).

The semiconductor region 10a is formed so as to be positioned under the select gate electrode SG and the multilayered structure of the dielectric film 17 and be in contact with the dielectric film 17. Since the channel region of the select transistor is formed in the semiconductor region 10a positioned under the select gate electrode SG and the multilayered structure of the dielectric film 17, the semiconductor region 10a positioned under the select gate electrode SG and the multilayered structure of the dielectric film 17 can be regarded as a channel region (first channel region) of the select transistor. The semiconductor region 10a is formed by doping (introducing) p-type impurities into the p-type well 3 through ion implantation or the like, and therefore p-type impurities are introduced (doped or diffused). Therefore, the semiconductor region 10a is a p-type semiconductor region.

The semiconductor region 10b is formed so as to be positioned under the memory gate electrode MG and the multilayered structure of the dielectric film 21 and be in contact with the dielectric film 21. Since the channel region of the memory transistor is formed in the semiconductor region 10b positioned under the memory gate electrode MG and the multilayered structure of the dielectric film 21, the semiconductor region 10b positioned under the memory gate electrode MG and the multilayered structure of the dielectric film 21 can be regarded as a channel region (a second channel region) of the memory transistor. The semiconductor region 10b is formed by doping n-type impurities into the semiconductor region 10a through ion implantation or the like. In addition to the p-type impurities, the same with the p-type impurities doped into the semiconductor region 10a, n-type impurities are further introduced (doped or diffused). The semiconductor region 10b is a p-type or n-type semiconductor region.

Although in FIGS. 1 and 2, a part of the semiconductor region 10a also extends under the semiconductor region 10b, in another embodiment, the semiconductor regions 10a and 10b may be formed so that the semiconductor region 10a does not extend under the semiconductor region 10b and a lower portion of the semiconductor region 10b is directly in contact with the p-type well 3. In the present embodiment, at least, the semiconductor region 10a is formed under the dielectric film 17 under the select gate electrode SG at a position in contact with the dielectric film 17, and the semiconductor region 10b is formed under the dielectric film 21 under the memory gate electrode MG at a position in contact with the dielectric film 21.

A charge density of the impurities in the semiconductor region 10a forming the channel region of the select transistor is adjusted so that the threshold voltage of the select transistor has a desired value, and a charge density of the impurities in the semiconductor region 10b forming the channel region of the memory transistor is adjusted so that the threshold voltage of the memory transistor has a desired value. In the present embodiment, although described in detail further below, the charge density of the impurities in the semiconductor region 10b forming the channel region (the second channel region) of the memory transistor is different from the charge density of the impurities in the semiconductor region 10a forming the channel region (the first channel region) of the select transistor. Preferably, the charge density of the impurities in the semiconductor region 10b forming the channel region of the memory transistor is lower than the charge density of the impurities in the semiconductor region 10a forming the channel region of the select transistor.

The memory gate electrode MG and the select gate electrode SG are formed of a silicon film (a conductive film), such as n-type polysilicon (polycrystalline silicon doped with n-type impurities or doped polysilicon), respectively. The select gate electrode SG is formed by patterning a polycrystalline silicon film (polycrystalline silicon film introduced or doped with n-type impurities, corresponding to a polycrystalline silicon film 16, which will be described further below) formed over the semiconductor substrate 1. The memory gate electrode MG is formed by executing anisotropic etching of a polycrystalline silicon film (polycrystalline silicon film introduced or doped with n-type impurities, corresponding to a polycrystalline silicon film 22, which will be described further below) formed over the semiconductor substrate 1 so as to cover the select gate electrode SG and by leaving this polycrystalline silicon film over a side wall of the select gate electrode SG via the dielectric film 21.

On upper portions (upper surfaces) of the select gate electrode SG and the memory gate electrode MG and upper surfaces (surfaces) of the $n^+$-type semiconductor region 35 and 36, the metal silicide film (a metal silicide layer) 39 (for example, a cobalt silicide film) is formed by salicide process or the like. With this metal silicide film 39, diffusion resistance and contact resistance can be lowered.

On the semiconductor substrate 1, a dielectric film (an interlayer dielectric film) 41 is formed so as to cover the select gate electrode SG and the memory gate electrode MG. The dielectric film 41 is composed of a single film of a silicon oxide film or a multilayered film of a silicon nitride film and a silicon oxide film, or the like. As will be described below, a contact hole 42 is formed over the dielectric film 41, a plug 43 is buried in the contact hole 42, and a wiring 46 and the like are formed over the dielectric film 41 in which the plug 43 is buried, but these are omitted in FIGS. 1 and 2.

FIG. 4 is a table showing examples of conditions for applying voltages to each portion of the select memory cell at "program", "erase", and "read" according to the present embodiment. In the table of FIG. 4, for each of "program", "erase", and "read", a voltage Vd to be applied to the drain region (the semiconductor region MD) of the memory cell (the select memory cell), a voltage Vsg to be applied to the select gate electrode SG, a voltage Vmg to be applied to the memory gate electrode MG, a voltage Vs to be applied to the source region (the semiconductor region MS), and a base voltage Vb to be applied to the p-type well 3 as shown in FIGS. 2 and 3 are shown. Note that, the voltages in the table of FIG. 4 are merely an example of conditions for applying voltages, and are not restrictive. The conditions can be variously changed as required. And, in the present embodiment, injection of electrons into the silicon nitride film 21b, which is a charge storage portion in the dielectric film 21 of the memory transistor is defined as "program", and injection of holes (positive holes) is defined as "erase".

As a programming scheme, a hot-electron programming, a so-called source side injection scheme can be used. For example, the voltages shown in the "program" field in FIG. 4 are applied to the respective portions of the select memory cell to be programmed to inject electrons into the silicon nitride film 21b in the dielectric film 21 of the select memory cell. Hot electrons are generated in the channel region (between the source and the drain) under a portion between two gate electrodes (the memory gate electrode MG and the select gate electrode SG). These hot electrons are locally injected into a region on a select transistor side of the silicon nitride film 21b, which is a charge storage portion in the dielectric film 21 under the memory gate electrode MG. The injected hot electrons are trapped by a trap in the silicon nitrided film 21b in the dielectric film 21, as a result, the threshold voltage of the memory transistor increases.

As an erasing scheme, a BTBT (Band-To-Band Tunneling) hot-hole injection erasing scheme can be used. That is, erasing is performed by injecting holes (positive holes) generated by BTBT (Band-To-Band Tunneling) into the charge storage portion (the silicon nitride film 21b in the dielectric film 21). For example, the voltages as shown in the "erase" field in FIG. 4 are applied to the respective portions of the select memory cell to be erased, and hot holes (positive holes) are generated by BTBT (Band-To-Band Tunneling) and accelerated by electric field, therefore, the holes are injected into the silicon nitride film 21b in the dielectric film 21 of the select memory cell. Thus, the threshold voltage of the memory transistor is decreased.

At reading, for example, the voltages as shown in the "read" field in FIG. 4 are applied to the respective portions of the select memory cell to be read. By setting the voltage Vmg to be applied to the memory gate electrode MG at reading at a value between the threshold voltage of the memory transistor at the programming state and the threshold voltage thereof at the erasing state, the writing state and the erasing state can be distinguished.

Next, a method of manufacturing a semiconductor device according to the present embodiment is described.

FIGS. 5 to 20 are cross-sectional diagrams of main portions of the semiconductor device (non-volatile semiconductor storage device) during manufacturing process according to the present embodiment.

FIGS. 5 to 20 show how semiconductor elements are formed over a memory cell portion (a region on which a memory cell of a non-volatile memory is to be formed) A1 and memory periphery circuit portions. And, in particular, since a high voltage is required for programming or the like, how a high-voltage element portion A2 and a normal element portion A3 are formed in the memory periphery circuit portion is shown. Here, although FIGS. 5 to 11 and FIGS. 13 to 20 show cross-sectional diagrams (cross-sectional diagrams of main parts) of the memory cell portion A1, the high-voltage element portion A2 and the normal element portion A3, FIG. 12, which corresponds to a process after a process of FIG. 11 and before a process of FIG. 13, shows a cross-sectional diagram (partial enlarged cross-sectional diagram or cross-sectional diagram of main parts) of only the memory cell portion A1. Although the memory cell portion A1 and the memory periphery circuit portion (a high-voltage element portion A2 and a normal element portion A3) do not have to be adjacent to each other, in FIGS. 5 to 11 and FIGS. 13 to 20, the memory periphery circuit portion is shown so as to be adjacent to the memory cell portion A1 for easy understanding.

And, in the present embodiment, the case in which an n-channel MISFET is formed over the memory cell portion A1 is explained, but, by reversing the conducting type, a p-channel MISFET can be formed over the memory cell portion A1. Similarly, the case in the present embodiment in which an n-channel MISFET is formed over the memory periphery circuit portion is explained, but, by reversing the conducting type, a p-channel MISFET can be formed over the memory periphery circuit portion. Furthermore, a CMOSFET (Complementary MOSFET), a CMISFET (Complementary MISFET), or the like can be formed over the memory periphery circuit portion.

And, the structure according to the present embodiment (for providing a high electric field) essentially does not depend on a scheme of forming an element isolation region. After an element isolating process that has been conventionally and widely used, for example, STI (Shallow Trench Isolation) or LOCOS (Local Oxidization of Silicon) is performed, a gate dielectric film forming process can be performed.

Figure 5:
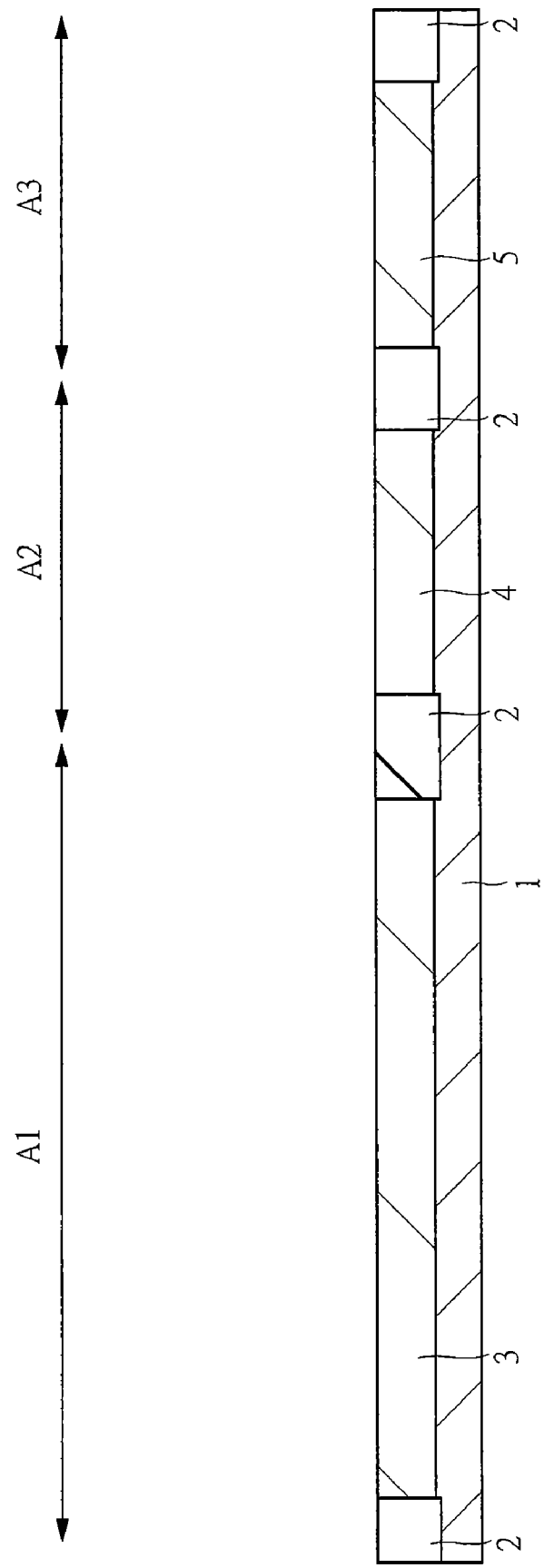
FIG. 5 is a cross-sectional diagram of main parts of the semiconductor device during manufacturing process according to an embodiment of the present invention.

As shown in FIG. 5, firstly, the semiconductor substrate (semiconductor wafer) 1 made of p-type monocrystalline silicon having a resistivity of, for example 1 to 10 Ωcm, and the like, is prepared. Then, the element isolation region (inter-element isolation insulation region) 2 delimiting an active region is formed over a main surface of the semiconductor substrate 1. The element isolation region 2 is made of a dielectric material, such as silicon oxide, and can be formed by, for example, an STI (Shallow Trench Isolation) method, a LOCOS (Local Oxidization of Silicon) method or the like.

Next, by an ion implantation method (ion-implantation of, for example, p-type impurities, such as boron) or the like, for example, p-type wells 3, 4, and 5 are formed over the surface of the semiconductor substrate 1. The p-type wells 3, 4, and 5 are formed from the main surface of the semiconductor substrate 1 up to a predetermined depth. Note that, the p-type well 3 is formed over the memory cell portion A1, the p-type well 4 is formed over the high-voltage element portion A2 in the memory periphery circuit portion, and the p-type well 5 is formed over the normal element portion A3 in the memory periphery circuit portion.

Figure 6:
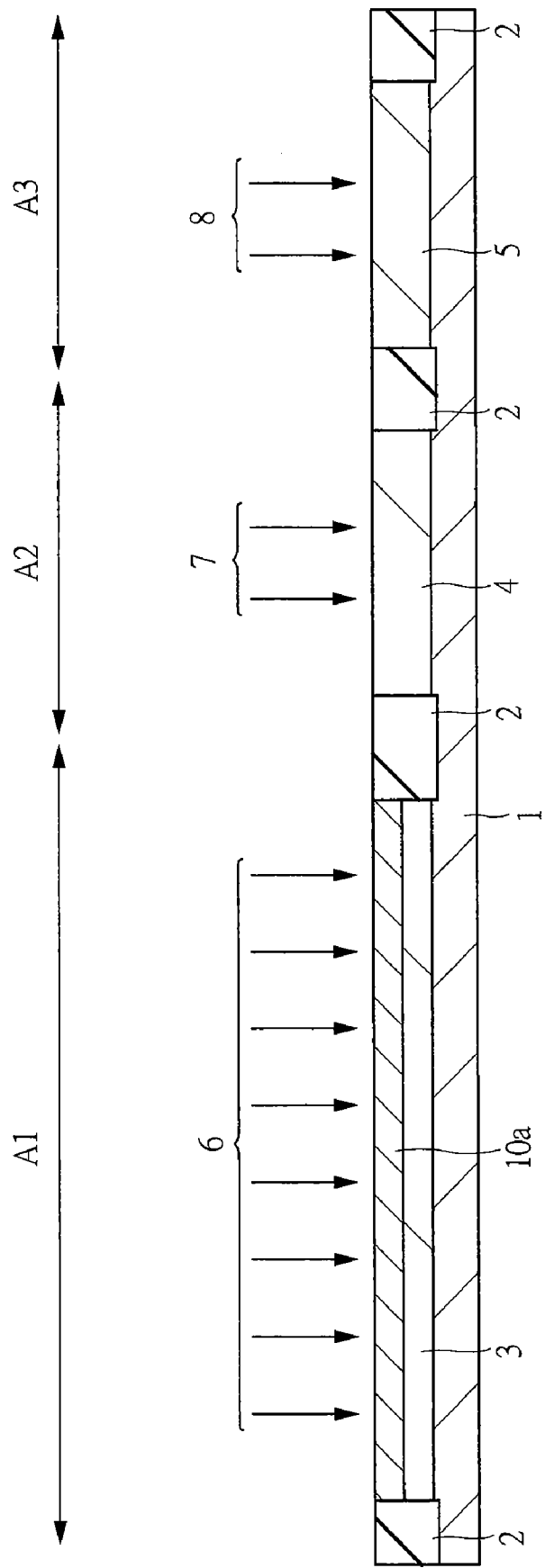
FIG. 6 is a cross-sectional diagram of the main parts of the semiconductor device during manufacturing process continued from FIG. 5.

Next, as shown in FIG. 6, in order to adjust the threshold voltage of the select transistor to be formed later over the memory cell portion A1, an ion implantation 6 is performed onto the p-type well 3 in the memory cell portion A1. Also, in order to adjust the threshold voltage of the MISFET to be formed later over the high-voltage element portion A2, an ion implantation 7 is performed onto the p-type well 4 in the high-voltage element portion A2. Furthermore, in order to adjust the threshold voltage of the MISFET to be formed later over the normal element portion A3, an ion implantation 8 is performed onto the p-type well 5 in the normal element portion A3. In each of ion implantations 6, 7, and 8, p-type impurities (impurities functioning as an acceptor) are ion-implanted, such as boron (B), for example.

In the ion implantation 6, using a photoresist pattern (not shown) covering regions other than the memory cell portion A1 and exposing the memory cell portion A1 as an ion-implantation inhibiting mask, the ion implantation 6 is performed over the p-type well 3 of the memory cell portion A1, by this operation, the semiconductor region (the p-type semiconductor region) 10a is formed over an upper-layer portion of the p-type well 3. In the ion implantation 7, using another photoresist pattern (not shown) covering regions other than the high-voltage element portion A2 and exposing the high-voltage element portion A2 as an ion-implantation inhibiting mask, the ion implantation 7 is performed on the p-type well 4 of the high-voltage element portion A2, by this operation, the p-type semiconductor region (not shown) is formed over an upper-layer portion of the p-type well 4. In the ion implantation 8, using still another photoresist pattern (not shown) covering regions other than the normal element portion A3 and exposing the normal element portion A3 as an ion-implantation inhibiting mask, the ion implantation 8 is performed on the p-type well 5 of the normal element portion A3, by this operation, the p-type semiconductor region (not shown) is formed over an upper-layer portion of the p-type well 5. Therefore, although FIG. 6 schematically shows the ion implantations 6, 7, and 8 by arrows, each of these ion implantations 6, 7, and 8 is performed as a separate ion implanting process. Note that, among these ion implantations 6, 7, and 8, those that can be with the same dose amount can be performed as the same ion implanting processes.

Here, for easy viewing of the drawing, FIG. 6 shows the semiconductor region 10*a* formed by the ion implantation 6 (that is, with its impurity density being adjusted), but does not show p-type semiconductor regions formed by the ion implantations 7 and 8 (that is, with their impurity densities being adjusted).

And, the ion implantation 6 on the memory cell portion A1 is performed in order to adjust the impurity density of the semiconductor region 10*a* functioning later as a channel region of a select transistor so that the threshold of the select transistor formed over the memory cell portion A1 has a desired value. Although details will be described further below, in the present embodiment, since the metal-element-containing layer 17*b* (which has not yet been formed at this stage) is formed, a threshold voltage of the select transistor higher than that of the case in which the metal-element-containing layer 17*b* is not formed is obtained. Therefore, taking these into consideration, the ion implantation 6 is performed with a less dose amount than a dose amount required in the case where the metal-element containing layer 17*b* is not formed.

Figure 7:
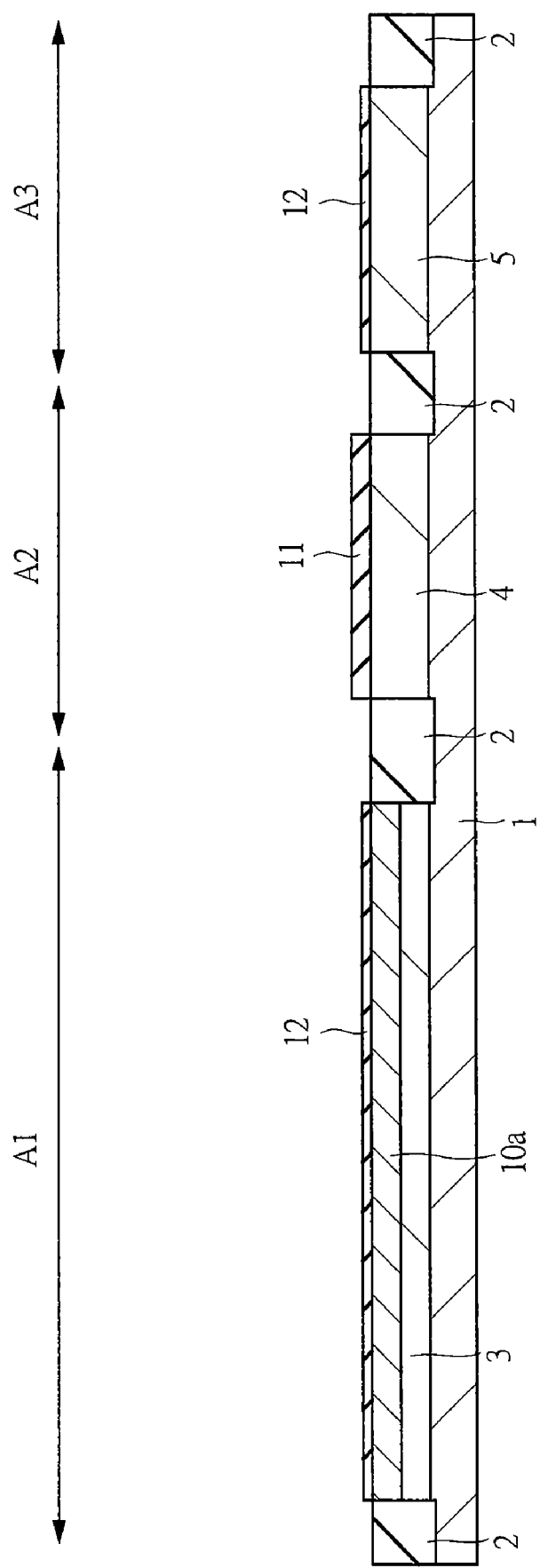
FIG. 7 is a cross-sectional diagram of the main parts of the semiconductor device during manufacturing process continued from FIG. 6.

Next, as shown in FIG. 7, a gate dielectric film (gate oxide film) forming process is performed. At this time, since the thickest gate dielectric film is required over the high-voltage element portion (high-voltage portion) A2, oxidation is performed according to the film thickness (film thickness of the gate dielectric film required over the high-voltage element portion A2) to form a gate dielectric film 11 over the high-voltage element portion A2. The oxide films of other portions (regions other than the high-voltage element portion A2) are removed by using photolithography method or the like. Next, oxidation is performed according to (the film thicknesses of the gate dielectric films required on) the other regions A1 and A3, therefore, a gate dielectric films 12 having a film thickness of, for example, 3 nm, are formed over the memory cell portion A1 and the element portion A3. At the time of this second oxidation (at the time of forming the gate dielectric film 12), the gate dielectric film 11 over the high-voltage region A2 formed first becomes thicker. Therefore, at the time of the first oxidation, oxidation should be performed considering this change in film thickness (of the gate dielectric film 11). If there is a need for more types of film thickness, films can be formed by repeating the above-mentioned process.

Figure 8:
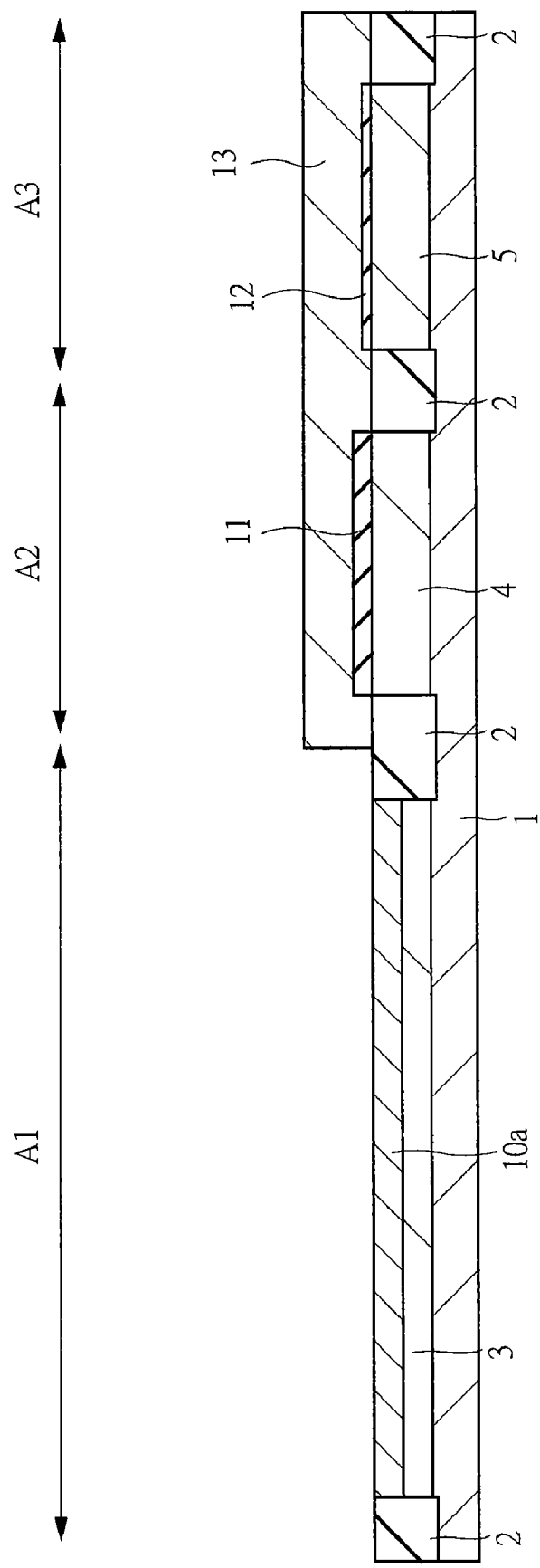
FIG. 8 is a cross-sectional diagram of the main parts of the semiconductor device during manufacturing process continued from FIG. 7.

Next, as shown in FIG. 8, a polycrystalline silicon film 13 having a thickness on the order of 150 nm, for example, is deposited by, for example, CVD method or the like. Then, the polycrystalline silicon film 13 and the gate dielectric film 12 over the memory cell portion A1 are removed by using, for example, photolithography method, dry etching method and the like. Note that, the above-described ion implantation 6 over the memory cell portion A1 (the process of forming the semiconductor region 10*a*) can be performed at this state also.

Figure 9:
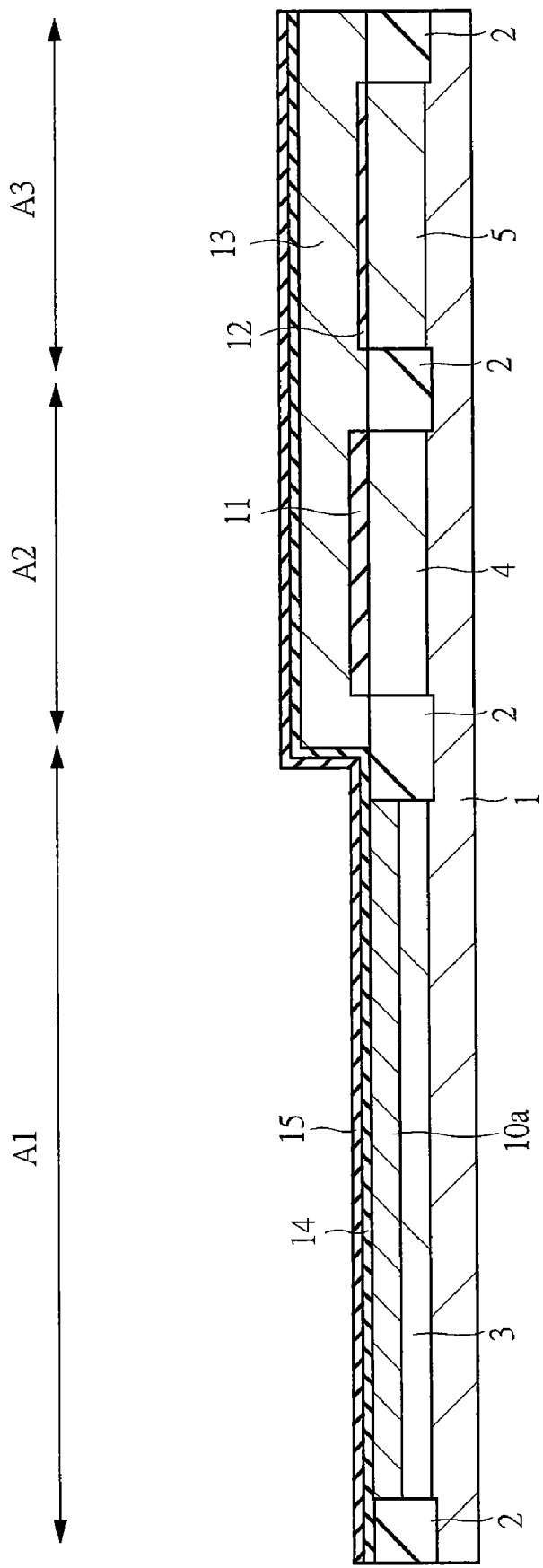
FIG. 9 is a cross-sectional diagram of the main parts of the semiconductor device during manufacturing process continued from FIG. 8.

Next, after removing a natural oxide film over the surface of the semiconductor substrate 1 by, for example, cleaning with dilute hydrofluoric acid, oxidation (thermal oxidation) is performed to form a dielectric film (a silicon oxide film) 14, as shown in FIG. 9. Oxidation is performed under oxidation conditions (conditions for forming the dielectric film 14 formed of a silicon oxide film) in which, for example, a silicon oxide film (dielectric film 14) having a thickness on the order of 1 to 3 nm is formed over the semiconductor substrate 1. With this, the dielectric film 14 formed of a silicon oxide film having a thickness of, for example, 2 nm, is formed over the semiconductor substrate 1 of the memory cell portion A1 (the surface of the p-type well 3, that is, the surface of the semiconductor region 10*a*). At this time, the oxide film (the dielectric film 14 formed of a silicon oxide film) grows also over the polycrystalline silicon film 13. Note that, as the dielectric film 14, a silicon oxynitride film can be formed in place of a silicon oxide film. Therefore, in the present embodiment, the dielectric film 14 is formed of a silicon oxide film or a silicon oxynitride film. This dielectric film 14 becomes the dielectric film 17*a* later.

Next, over the dielectric film 14, the metal-element-containing layer (the metal-element-containing film) 15 is deposited (formed). The metal-element-containing layer 15 contains a metal element (here, hafnium (Hf), zirconium (Zr), or aluminum (Al)). For example, the metal-element-containing layer 15 can be formed by depositing a metal oxide (a metal oxide film) or a metal silicate (a metal silicate film) over the dielectric film 14 by using CVD (Chemical Vapor Deposition) method, such as MOCVD (Metal Organic Chemical Vapor Deposition) or ALCVD (Atomic Layer Chemical Vapor Deposition), for example. Therefore, the metal-element-containing layer 15 is composed of a metal oxide or a metal silicate and, more preferably, the metal-element-containing layer 15 is composed of hafnium oxide, zirconium oxide, aluminum oxide, a silicate made of silicon oxide and hafnium oxide (that is, hafnium silicate), or a silicate made of silicon oxide and zirconium oxide (that is, zirconium silicate). Note that, the metal-element-containing layer 15 composed of a metal oxide or a metal silicate has a dielectric constant higher than that of silicon oxide, and therefore can be regarded as a high-k gate dielectric film. And, although the reason will be described later, the surface density of the metal element in the metal-element-containing layer 15 deposited over the dielectric film 14 is preferably controlled within a range of $1 \times 10^{12}$ to $2 \times 10^{15}$ atoms/cm$^2$. This metal-element-containing layer 15 becomes the metal-element-containing layer 17*b* later.

Furthermore, although details will be described later, the threshold voltage of the select transistor can be adjusted by the amount of metal element contained in the metal-element-containing layer 15 (17*b*) and the impurity density of the channel region under the select gate electrode of the memory cell formed over the memory cell portion A1 (corresponding to the semiconductor region 10*a*). For example, the select gate transistor can be set to have a current value of $10^{-9}$ A/μm in an OFF state where the voltage to be applied to the select gate electrode is zero.

After depositing the metal-element-containing layer 15, according to need, nitrogen may be introduced into the metal-element-containing layer 15 by, for example, plasma nitriding processing or heat treatment in an atmosphere of ammonia. Thereafter, according to need, superfluous nitrogen can be vaporized by, for example, heat treatment at relatively high temperature in dilute oxygen.

Figure 10:
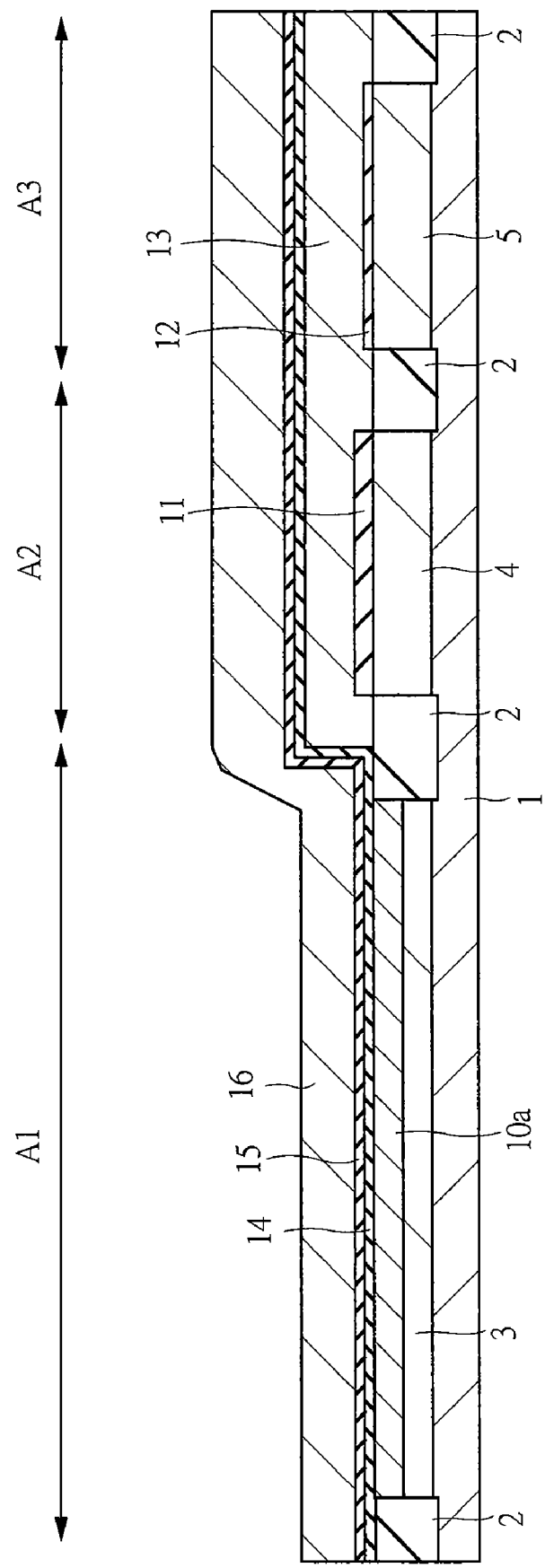
FIG. 10 is a cross-sectional diagram of the main parts of the semiconductor device during manufacturing process continued from FIG. 9.

Next, as shown in FIG. 10, the polycrystalline silicon film (the silicon film) 16 having a thickness on the order of, for example, 150 nm, is deposited over the semiconductor substrate 1 (that is, over the dielectric film 14 on which the metal-element-containing layer 15 is deposited) by using, for example, CVD method or the like. This polycrystalline silicon film is a silicon film for forming the select gate electrode SG. Then, after doping the polycrystalline silicon film 16 with n-type impurities, such as phosphorus (P), with high density, a heat treatment is performed for activating the introduced impurities. In the memory cell portion A1, the polycrystalline silicon film 16 is formed over the dielectric film 14 on which the metal-element-containing layer 15 is deposited (that is, over the multilayered film of the dielectric film 14 and the metal-element-containing layer 15).

Figure 11:
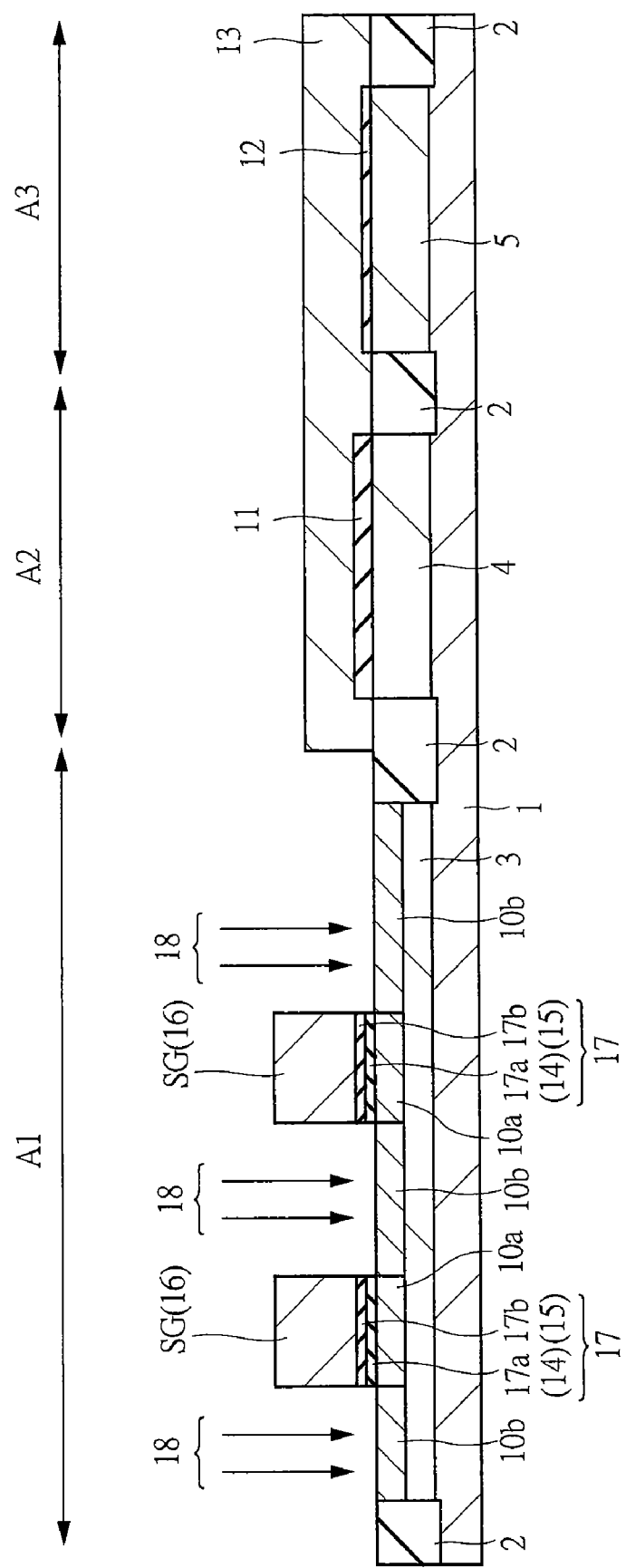
FIG. 11 is a cross-sectional diagram of the main parts of the semiconductor device during manufacturing process continued from FIG. 10.

Next, as shown in FIG. 11, the polycrystalline silicon film 16 is selectively etched (that is, patterned) by using photolithography method, dry etching method and the like, to form the select gate electrode SG formed of the patterned polycrystalline silicon film 16 over the memory cell portion A1. With this, in the memory cell portion A1, a formation planned region for forming the memory gate electrode MG later is exposed.

The dielectric film 14 and the metal-element-containing layer 15 left under the select gate electrode SG become the dielectric film (the gate dielectric film or the first film) 17 positioned between the select gate electrode SG and the channel region (the semiconductor region 10a) and functioning as a gate dielectric film of the select transistor. Therefore, the dielectric film 17, which is the gate dielectric film of the select transistor, includes a multilayered structure of the dielectric film (dielectric layer) 17a formed of the dielectric film 14 and the metal-element-containing layer 17b formed of the metal-element-containing layer 15 over the dielectric film 17a (14). As described above, since the dielectric film 14 is formed of a silicon oxide film or a silicon oxynitride film, the dielectric film 17a is formed of a silicon oxide film or a silicon oxynitride film.

Next, by using the patterned polycrystalline silicon film 16 (the select gate electrode SG) as an ion-implantation inhibiting mask, an ion implantation 18 of impurities is performed. As the impurities doped in the ion implantation 18, n-type impurities (for example, arsenic or phosphorus) can be selected according to need. By this ion implantation 18, in the memory cell portion A1, impurities are ion-implanted into a region not covered with the select gate electrode SG. With this, the semiconductor region 10b doped with the impurities through the ion implantation 18 is formed in the region not covered with the select gate electrode SG of (the semiconductor region 10a in) the p-type well 3.

With the impurities doped in this ion implantation 18 and the impurities doped in the above-described ion implantation 6, the impurity density (charge density of the impurities) of the region under the memory gate electrode MG (channel region) which will be formed later is adjusted. And, although details will be described later, in the present embodiment, by providing the metal-element-containing layer 17b, the amount of impurities (dose amount) introduced in the ion implantation 6 can be decreased compared with the case where the metal-element-containing layer 17 is not provided. Therefore, the doping amount (dose amount) of impurities in the ion implantation 18 required for decreasing the threshold voltage of the memory transistor can be decreased.

Figure 12:
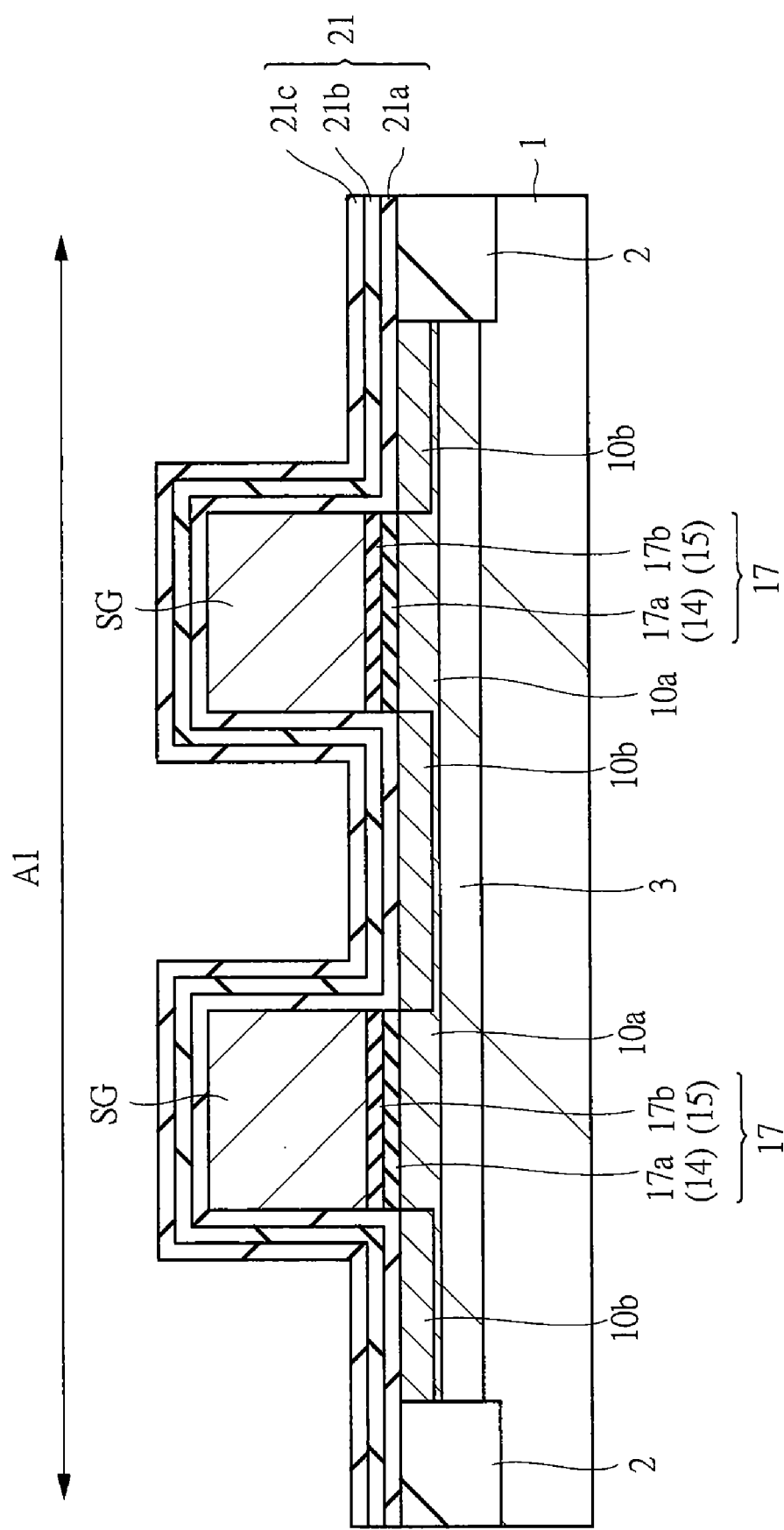
FIG. 12 is a cross-sectional diagram of the main parts of the semiconductor device during manufacturing process continued from FIG. 11.
Figure 13:
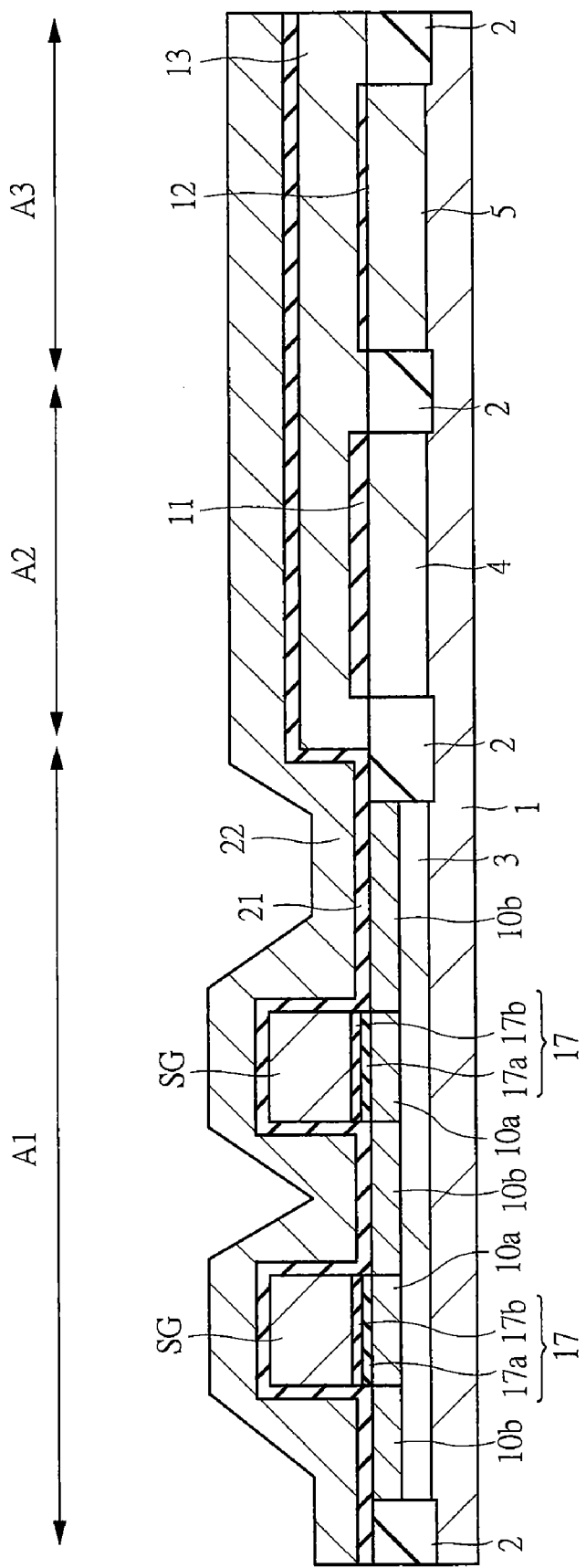
FIG. 13 is a cross-sectional diagram of the main parts of the semiconductor device during manufacturing process continued from FIG. 12.

Next, as shown in FIG. 12, after sacrificial oxidation, the silicon oxide film 21a having a thickness on the order of, for example, 4 to 7 nm, is formed over the semiconductor substrate 1 by thermal oxidation. On that silicon oxide film 21a, the silicon nitride film 21b having a thickness on the order of, for example, 8 to 10 nm, is deposited (formed). On that silicon nitride film 21b, the silicon oxide film 21c having a thickness on the order of, for example, 7 to 8 nm, is deposited (formed). Thus, the dielectric film 21 made from an ONO multilayered film is formed. For easy viewing of the drawing, FIG. 12 does not show the memory periphery circuit portion (the high-voltage element portion A2 and the normal element portion A3), but shows only the memory cell portion A1. Therefore, the thickness of the dielectric film 21 becomes on the order of, for example, 21 to 24 nm. The last oxide film (the silicon oxide film 21c over the top layer of the dielectric film 21) can form a high-voltage film by forming by oxidizing the upper layer portion of the nitride film (the silicon nitride film 21b over the middle layer of the dielectric film 21). In this case, the deposition film thickness of the silicon nitride film 21b is set higher than the above-mentioned value, for example, on the order of 11 to 13 nm.

The dielectric film 21 functions as a gate dielectric film of the memory gate electrode MG formed later, and has a charge holding function. Therefore, the dielectric film 21 has a multilayered structure having at least three layers, with the height of a potential barrier of an inner layer being lower than the height of a potential barrier of an outside layer. This can be achieved by, for example, as in the present embodiment, forming the dielectric film 21 as a multilayered film of the silicon oxide film 21a, the silicon nitride film 21b, and the silicon oxide film 21c.

The silicon oxide film 21c can be formed only by oxidizing the upper layer portion of the silicon nitride film 21b. But, since the growth of an oxide film (growth speed of the silicon oxide film due to oxidation of the silicon nitride film 21b) is relatively slow, a silicon oxide film having a thickness on the order of, for example, 6 nm, may be deposited over the silicon nitride film 21b, and then an upper layer portion of the silicon nitride film 21b may be oxidized for 1 nm, for example, to form the silicon oxide film 21c having the total thickness on the order of 7 nm, as a result, an excellent film can be obtained.

The structure of the film thickness of each of the films forming the dielectric film 21 (film thicknesses of the silicon oxide film 21a, the silicon nitride film 21b, and the silicon oxide film 21c) varies depending on how to use the semiconductor device (non-volatile semiconductor storage device) to be formed. Therefore, typical structures (values) are exemplarily described herein, and these values are not meant to be restrictive.

Next, as shown in FIG. 13, the polycrystalline silicon film (the silicon film) 22 doped with phosphorus (P) or the like is deposited over the entire main surface of the semiconductor substrate 1 by CVD method or the like. Therefore, the polycrystalline silicon film 22 is formed over the dielectric film 21. The polycrystalline silicon film 22 is a silicon film for forming the memory gate electrode MG. The deposition film thickness of the polycrystalline silicon film 22 is on the order of, for example, 100 nm. Note that, in FIGS. 13 to 20, for easy viewing of the drawings, the multilayered film of the silicon oxide film 21a, the silicon nitride film 21b, and the silicon oxide film 21c is simply shown as the dielectric film 21.

Figure 14:
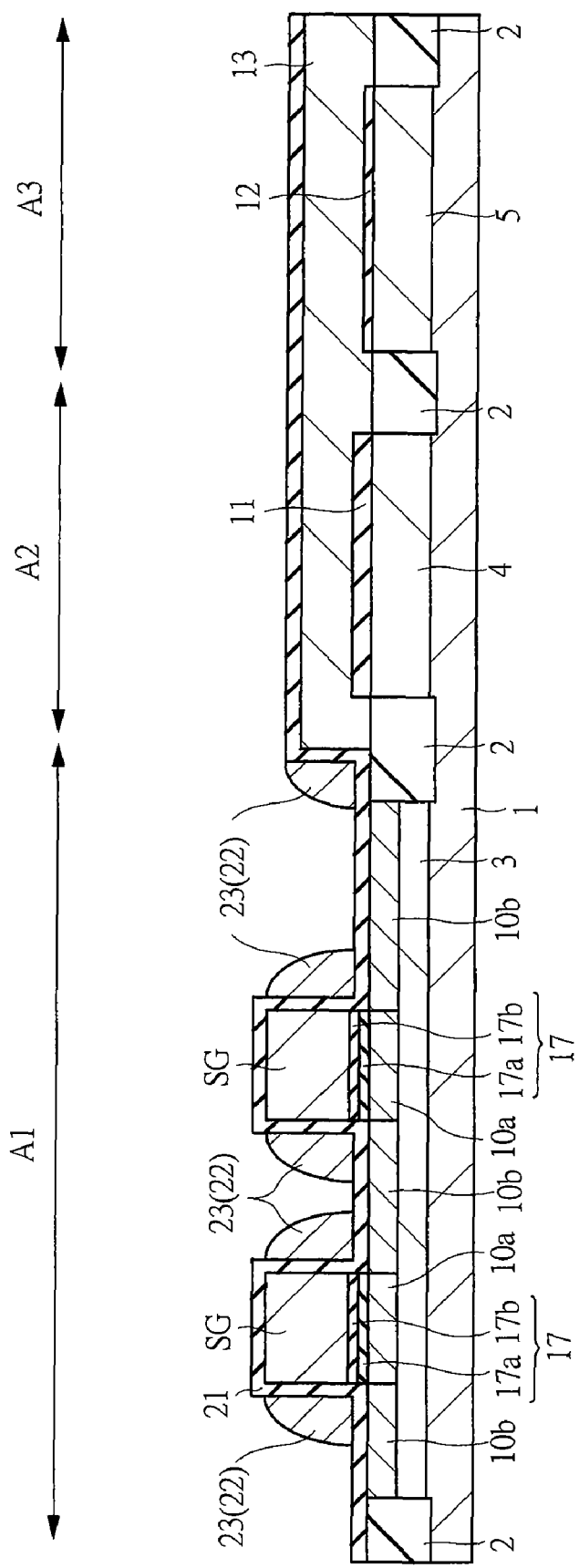
FIG. 14 is a cross-sectional diagram of the main parts of the semiconductor device during manufacturing process continued from FIG. 13.

Next, as shown in FIG. 14, by etching (dry etching, anisotropic etching, or etched back) the polycrystalline silicon film 22 for the deposition film thickness (on the order of 100 nm), a polycrystalline silicon spacers (a memory gate electrode) 23, which become the memory gate electrode MG later, is formed over the side surfaces of the select gate electrode SG and the multilayered structure of the dielectric film (a gate dielectric film) 17. That is, by using a scheme similar to the scheme of forming side walls (side-wall spacers or side-wall dielectric films) of the dielectric film over the side walls of the gate electrode, the polycrystalline silicon spacers 23 can be formed. Also, at the time of processing the polycrystalline silicon spacers 23, although not shown, patterning of a drawn portion is performed by photolithography method. That is, in a formation planned region for contact holes to be connected to the memory gate later, the polycrystalline silicon film 22 is not etched, but is left.

Also, the deposition film thickness of the polycrystalline silicon film 22 can define a memory gate length (a gate length of the memory gate electrode). By adjusting the film thickness of the polycrystalline silicon film 22 deposited over the semiconductor substrate 1, the memory gate length can be adjusted. For example, by decreasing the deposition film thickness of the polycrystalline silicon film 22, the gate length can be decreased. If the deposition film thickness of the polycrystalline silicon film 22 is increased, the gate length can be increased. Since a relation between channel controllability and program/erase characteristic is trade-off, the deposition film thickness of the polycrystalline silicon film 22 is preferably 30 to 150 nm, but if the gate length of the select gate electrode is on the order of 200 nm, the deposition film thickness of the polycrystalline silicon film 22 is preferably 50 to 100 nm. With this, the gate length of the memory gate length can be made on the order of 50 to 100 nm.

Figure 15:
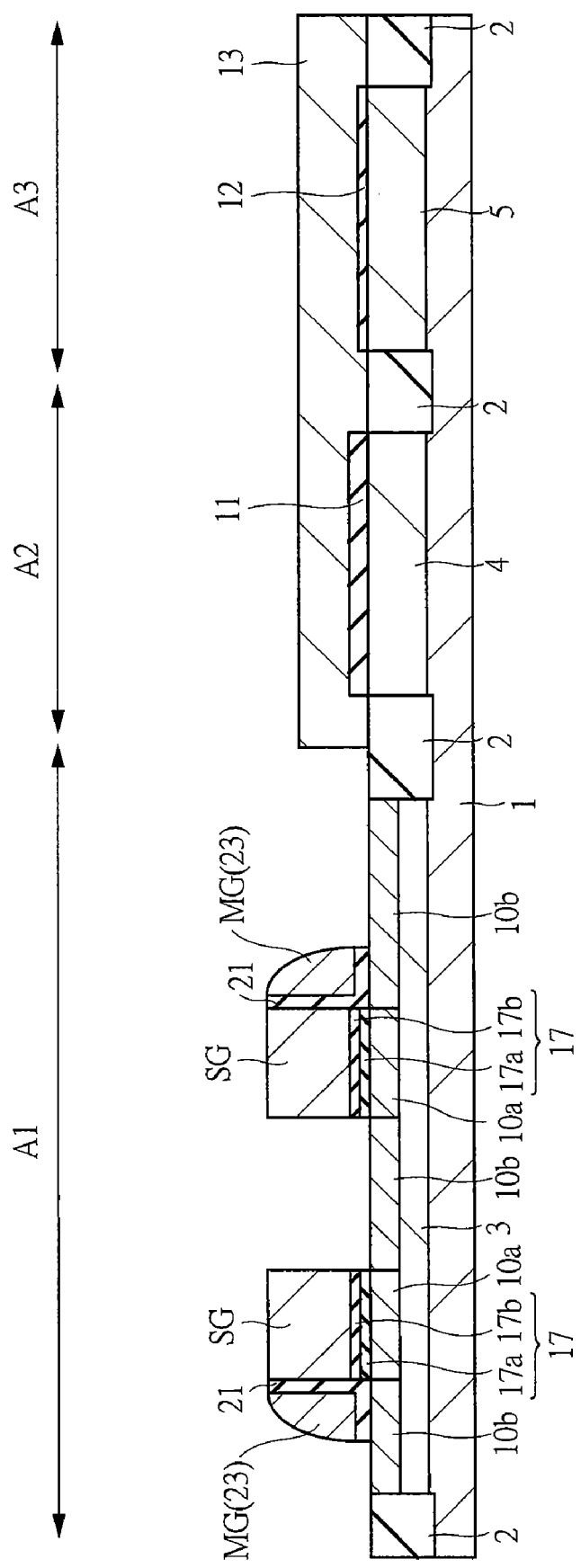
FIG. 15 is a cross-sectional diagram of the main parts of the semiconductor device during manufacturing process continued from FIG. 14.

Next, as shown in FIG. 15, the polycrystalline silicon spacer 23, the dielectric film 21, and others on one side of the select gate electrode SG are eliminated by photolithography method, dry etching method and the like. The polycrystalline silicon spacer 23 left adjacently to the other side of the select gate electrode SG via the dielectric film 21 becomes the memory gate electrode MG.

Figure 16:
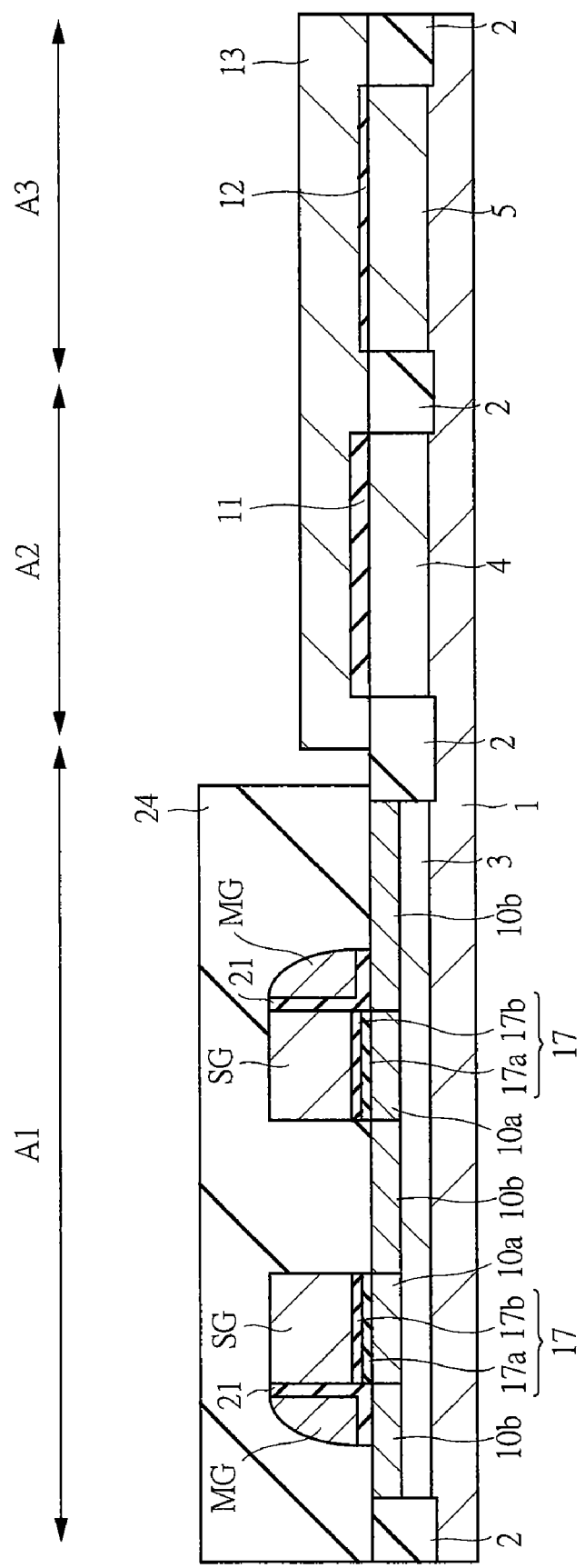
FIG. 16 is a cross-sectional diagram of the main parts of the semiconductor device during manufacturing process continued from FIG. 15.

Next, as shown in FIG. 16, a silicon oxide film 24 is deposited over the entire main surface of the semiconductor substrate 1 by, for example, CVD method. Then, by using, for example, photolithography method and dry etching method, the silicon oxide film 24 other than that over the memory cell portion A1 is removed to expose the surface of the polycrystalline silicon film 13. The memory cell portion A1 is in the state of being covered with the silicon oxide film 24.

Figure 17:
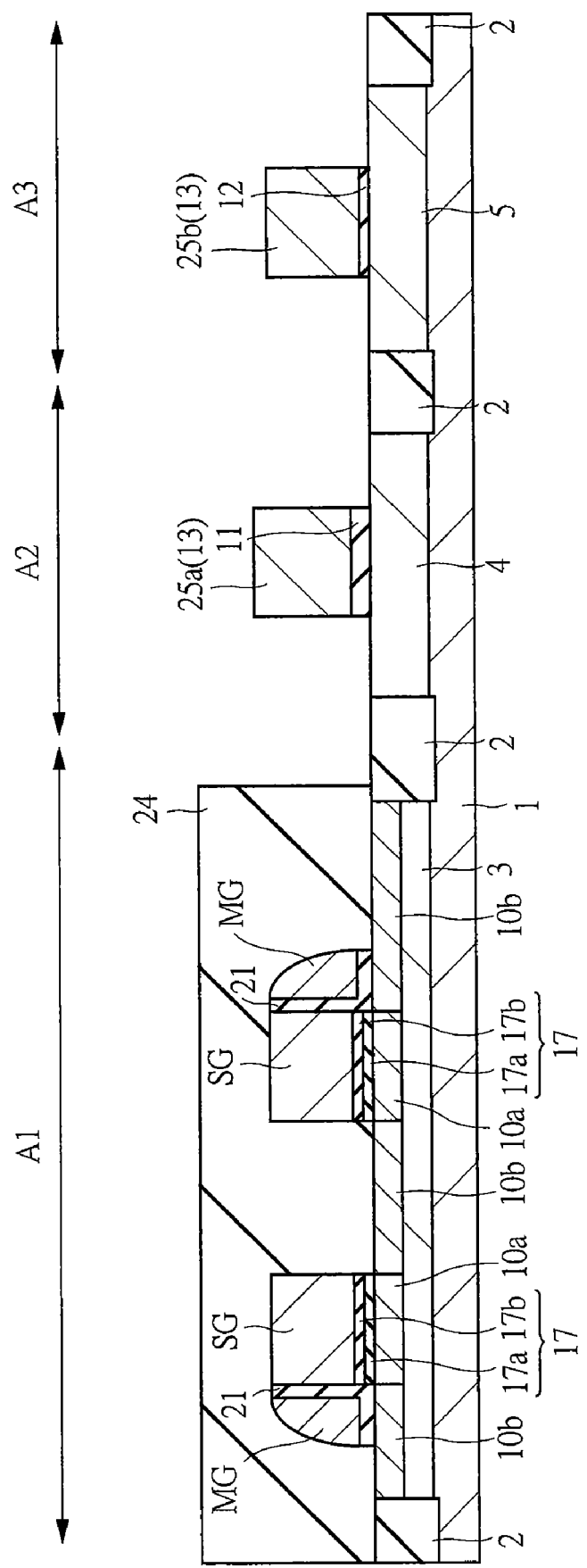
FIG. 17 is a cross-sectional diagram of the main parts of the semiconductor device during manufacturing process continued from FIG. 16.

Next, doping n-type impurities into the polycrystalline silicon film 13 of formation planned regions for n-channel MISFETs of the high-voltage element portion A2 and the normal element portion A3 is executed. Also, the polycrystalline silicon film 13 in a formation planned region for a p-channel MISFET (not shown) is doped with p-type impurities. Then, after heat treatment for activation is performed, as shown in FIG. 17, a gate process for peripheral transistors is performed. That is, the polycrystalline silicon film 13 is patterned by using, for example, photolithography method and dry etching method to form the gate electrodes 25a and 25b of the peripheral transistors (transistors, such as MISFETs formed in the high-voltage element portion A2 and the normal element portion A3). Of these electrodes, the gate electrode 25a is formed in the high-voltage element portion A2, and the gate electrode 25b is formed in the normal element portion A3.

Figure 18:
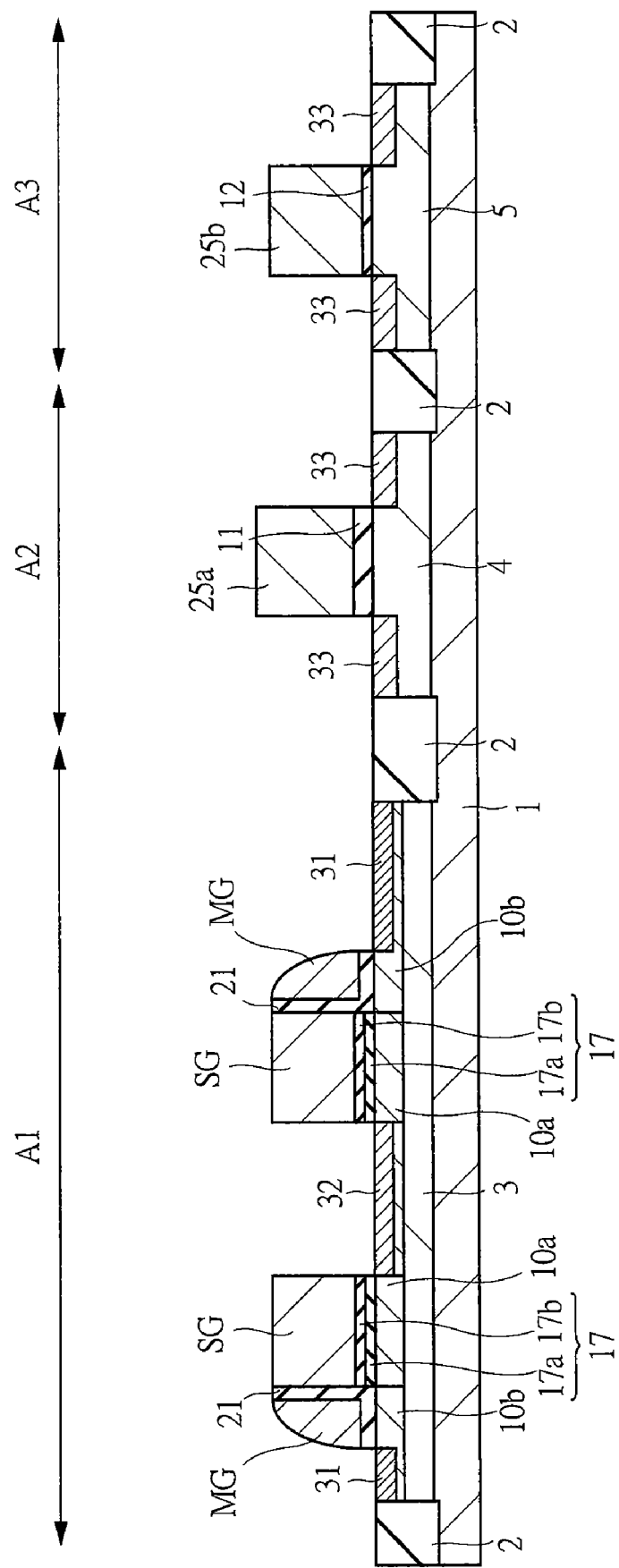
FIG. 18 is a cross-sectional diagram of the main parts of the semiconductor device during manufacturing process continued from FIG. 17.

Next, as shown in FIG. 18, in a state of the high-voltage element portion A2 and the normal element portion A3 being covered (masked) with a photoresist pattern (not shown) formed by photolithography method, the silicon oxide film 24 protecting the memory cell portion A1 is removed.

Next, using ion injection (ion implantation) or the like, by executing doping n-type impurities, for example, arsenic (As), using the memory gate electrode MG, the select gate electrode SG, and the gate electrode 25 as ion-implantation inhibiting masks, n$^-$-type semiconductor regions (impurity diffusion layers or impurity diffusion layer electrodes) 31, 32, and 33 to become a source or a drain (a source electrode or a drain electrode) are formed. The n$^-$-type semiconductor region 31 is formed in a self-aligned manner with respect to a side wall of the memory gate electrode MG, the n$^-$-type semiconductor region 32 is formed in a self-aligned manner with respect to a side wall of the select gate electrode SG, and the n$^-$-type semiconductor region 33 is formed in a self-aligned manner with respect to both side walls of the gate electrode 25. The n$^-$-type semiconductor region (impurity diffusion layer) 31 and the n$^-$-type semiconductor region (impurity diffusion layer) 32 can function as a source or a drain of the memory cell formed in the memory cell portion A1, and the n$^-$-type semiconductor region (impurity diffusion layer) 33 can function as a source or a drain of a MISFET formed in the peripheral circuit portions (the high-voltage element portion A2 and the normal element portion A3).

Note that, in the memory cell structure according to the present embodiment, at erasing, holes are generated at an end of the n$^-$-type semiconductor region 31 by using so-called band-to-band tunneling. Efficiency of generating holes by this tunneling depends on the impurity density (charge density of impurities) on an n$^-$-type semiconductor region 31 side, and it has been known that there is an optimum density. Therefore, at the time of forming this n$^-$-type semiconductor region 31, by ion-implanting phosphorus (P) or the like in an amount of ion implantation (dose amount) of, for example, $10^{13}$ to $10^{14}$ cm$^{-2}$ together with arsenic (As), an optimum density region (a region with a charge density of impurities suitable for generating holes) can be formed beside (at an end) of the impurity diffusion layer (n$^-$-type semiconductor region 31) formed of arsenic (As). That is, of phosphorus and arsenic that are ion-implanted, phosphorus tends to diffuse more than arsenic in a lateral direction (direction parallel to the main surface of the semiconductor substrate 1), therefore, a region with a relatively lower impurity density than that of the center portion is formed at the end of the n$^-$-type semiconductor region 31. With this, extremely effective generation of holes can be performed.

And, when arsenic (As) is used to form the n$^-$-type semiconductor regions 31 and 32 using ion implantation, by ion-injecting (ion-implanting) boron (B) at the same time, a structure generally called Halo, in which an arsenic diffusion layer (n$^-$-type semiconductor regions 31 and 32) is surrounded by a boron diffusion layer (p-type semiconductor region with diffused boron) can be formed.

Figure 19:
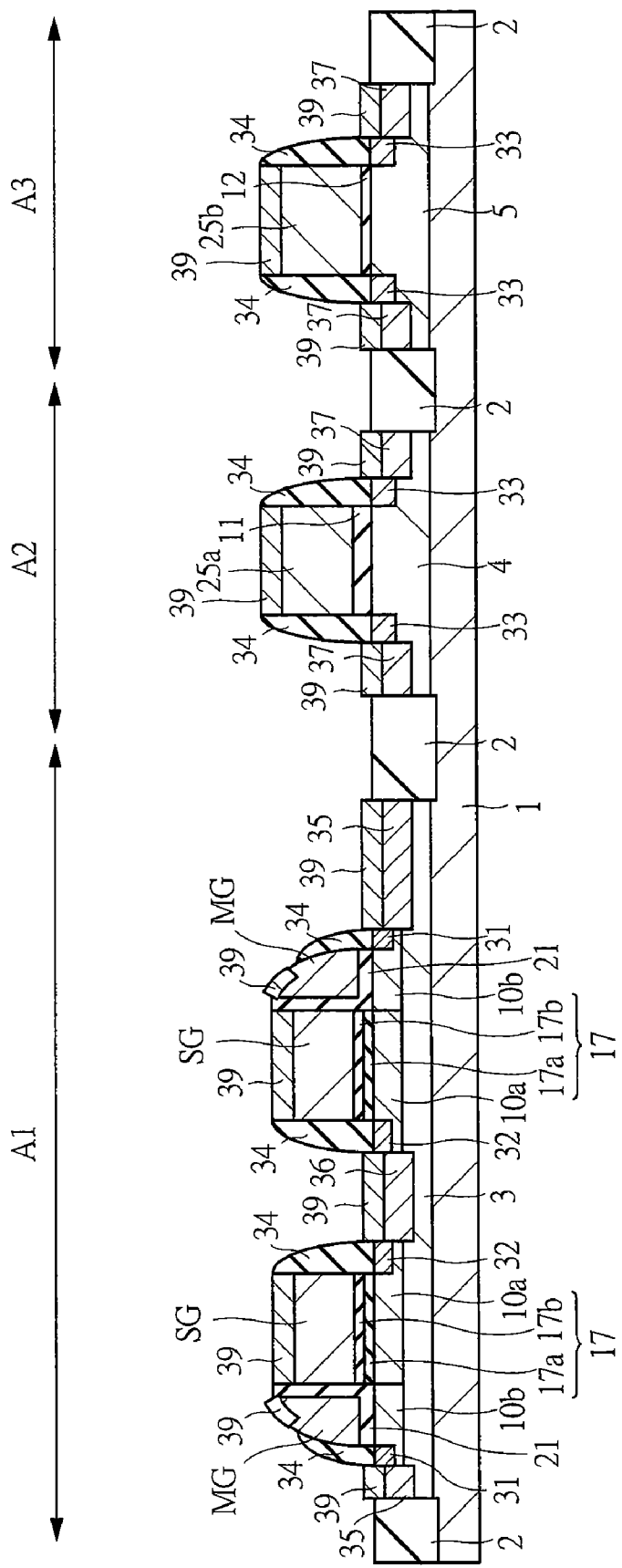
FIG. 19 is a cross-sectional diagram of the main parts of the semiconductor device during manufacturing process continued from FIG. 18.

Next, as shown in FIG. 19, the side-wall dielectric films (side walls or side wall spacers) 34 made of a dielectric material, for example, silicon oxide, are formed over the side walls of the select gate electrode SG, the memory gate electrode MG, and the gate electrode 25. The side-wall dielectric films 34 can be formed by, for example, depositing a silicon oxide film over the semiconductor substrate 1 and then performing anisotropic etching of this silicon oxide film. For example, the side-wall dielectric films 34 can be formed by depositing a silicon oxide film having a film thickness on the order of 80 nm over the entire surface of the semiconductor substrate 1 at a low temperature on the order of 400 degrees Celsius by plasma-assisted depositing scheme, and then selectively leaving the silicon oxide film only over the side wall portions of the select gate electrode SG, the memory gate electrode MG, and the gate electrode 25 by anisotropic dry etching.

Next, by doping n-type impurities, for example, arsenic (As), into regions on both sides of the select gate electrode SG, the memory gate electrode MG, and the gate electrode 25 and the side-wall dielectric films 34 over the side walls of these electrodes using ion implantation technique or the like, n$^+$-type semiconductor regions (impurity diffusion layers) 35, 36, and 37 with high impurity density are formed. The n$^+$-type semiconductor region 35 is formed in a self-aligned manner with respect to the side-wall dielectric film 34 over the side wall of the memory gate electrode MG. The n$^+$-type semiconductor region 36 is formed in a self-aligned manner with respect to the side-wall dielectric film 34 over the side wall of the select gate electrode SG. The n+-type semiconductor region 37 is formed in a self-aligned manner with respect to the side-wall dielectric film 34 over both side walls of the gate electrode 25. Thus, an LDD (lightly doped drain) structure is formed. In this manner, the n-type semiconductor region MS functioning as a source region of the memory transistor is formed by the n−-type semiconductor region 31 and the n+-type semiconductor region 35 with a higher impurity density than that of the n−-type semiconductor region 31, and the n-type semiconductor region MD functioning as a drain region of the select transistor is formed by the n−-type semiconductor region 32 and the n+-type semiconductor region 36 with a higher impurity concentration than that of the n−-type semiconductor region 32.

Next, the metal silicide layer 39 is formed by using a known salicide scheme using cobalt or the like. That is, by depositing cobalt (Co) film over the semiconductor substrate 1 and performing heat treatment, the metal silicide layer 39 is formed over the select gate electrode SG, the memory gate electrode MG, and the gate electrode 25, and over the n+-type semiconductor region 35, 36, and 37. Then, an unreacted cobalt film is removed.

Figure 20:
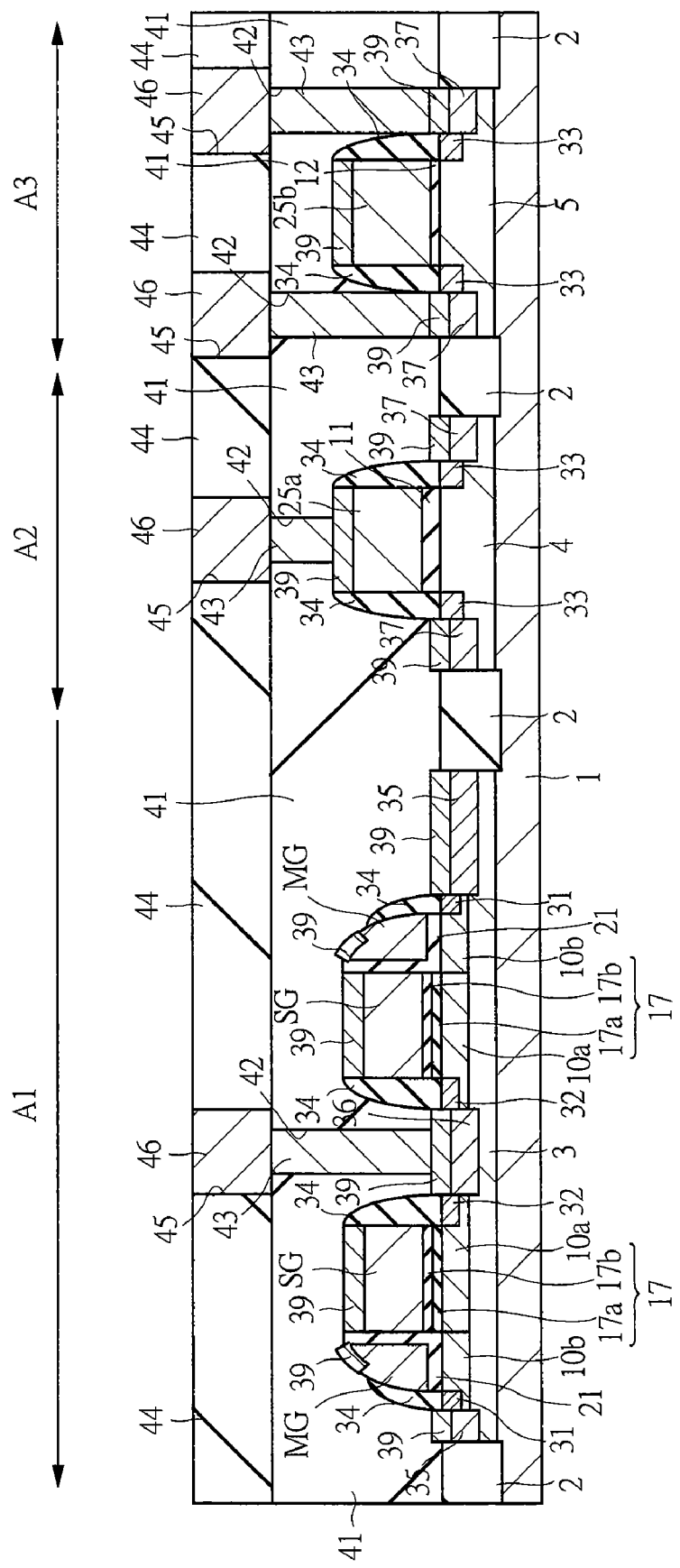
FIG. 20 is a cross-sectional diagram of the main parts of the semiconductor device during manufacturing process continued from FIG. 19.

Next, as shown in FIG. 20, the interlayer dielectric film (dielectric film) 41 made of silicon oxide and the like is formed over the semiconductor substrate 1. Then, contact holes (opening portions or through holes) 42 are formed in the interlayer dielectric film 41 by using, for example, photolithography method, dry etching method and the like. On a bottom portion of each contact hole 42, a part of the main surface of the semiconductor substrate 1, such as, for example, a part of the n+-type semiconductor regions 35, 36, and 37 (or the metal silicide layer 39 thereon), a part of the select gate electrode SG, the memory gate electrode MG, or the gate electrode 25 (or the metal silicide layer 39 thereon), or the like is exposed.

Next, the plug 43 made of tungsten (W) or the like is formed in the contact hole 42. The plug 43 is formed by forming, for example, a titanium nitride film, as a barrier film over the interlayer dielectric film 41 including an inside (a bottom portion and a side wall) of the contact hole 42, then, forming a tungsten film over the titanium nitride film by CVD method or the like so that the contact hole 42 is buried, and then, removing unnecessary portions of the tungsten film and the titanium nitride film over the interlayer dielectric film 41 by CMP or an etch-back scheme.

Next, an interlayer dielectric film (dielectric film) 44 made of silicon oxide or the like is formed over the interlayer dielectric film 41 in which the plug 43 buried.

Next, a wiring opening portion (opening portion) 45 is formed in the interlayer dielectric film 44 by using, for example, photolithography method, dry etching method and the like. Then, a barrier film made of titanium nitride or the like and a copper film are formed over the interlayer dielectric film 44 so as to bury in the wiring opening portion 45. Then, by polishing these copper film and barrier film by using CMP or the like, wiring (first-layer wiring) 46 is formed in the wiring opening portion 45. The wiring 46 is electrically connected via the plug 43 to the n+-type semiconductor regions 35, 36, and 37, the select gate electrode SG, the memory gate electrode MG, or the gate electrode 25, and the like. The wiring 46 may be tungsten wiring or aluminum wiring. For example, over the interlayer dielectric film 41 in which the plug 43 is buried, a titanium film, a titanium nitride film, an aluminum film, a titanium film, and a titanium nitride film are multilayered, and the multilayered film is then patterned by photolithography method or the like, as a result, the aluminum wiring is formed.

Then, according to need, an interlayer dielectric film for a further upper layer, wiring for a further upper layer, and others are formed, but they are not described herein. In this manner, the semiconductor device (non-volatile semiconductor storage device) according to the present embodiment is manufactured.

Next, features and effects of the present embodiment are described in more detail.

In the present embodiment, as the gate dielectric film of the select transistor, the dielectric film 17 having a multilayered structure of the dielectric film 17a made of silicon oxide or silicon oxynitride and the metal-element containing layer (the high-k dielectric film) 17b made of a metal oxide or a metal silicate over the dielectric film 17a is used. With this, with the low charge density of impurities (impurity concentration) under the select gate electrode SG (a semiconductor region 10a in FIG. 1), the threshold voltage of the select transistor can be increased. This is a first feature of the present embodiment.

Figure 21:
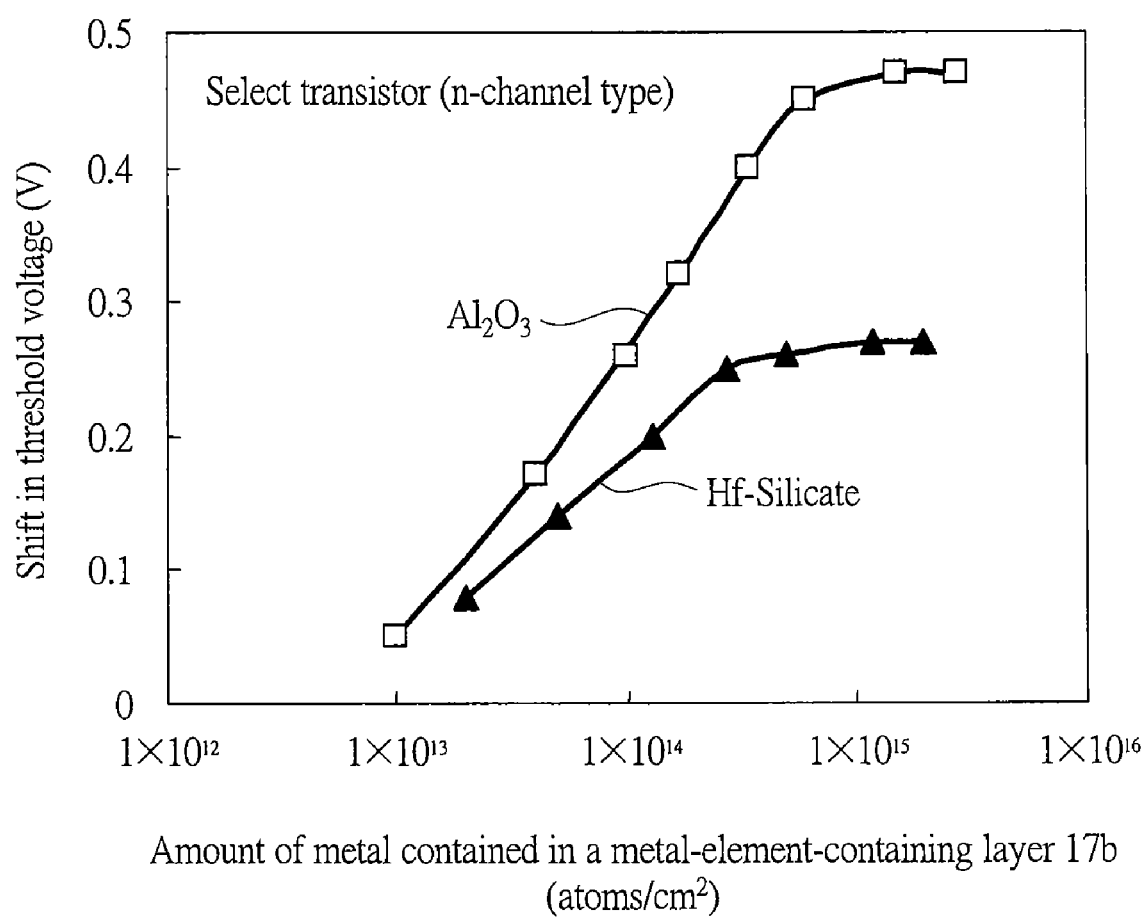
FIG. 21 is a graph showing a relation between an amount obtained by converting an amount of metal contained in a metal-element-containing layer to surface density and an amount of shift in threshold voltage.

FIG. 21 is a graph showing a relation between an amount obtained by converting an amount of metal contained in the metal-element-containing layer 17b to surface density and an amount of shift in threshold voltage (or an amount of shift in flat-band voltage). The horizontal axis on the graph of FIG. 21 corresponds to a value obtained by converting the amount of metal contained in the metal-element-containing layer 17b to surface density. The vertical axis on the graph of FIG. 21 corresponds to the amount of change in threshold voltage (that is, the amount of change in flat-band voltage) of the select transistor due to provision of the metal-element-containing layer 17b. The value on the vertical axis on the graph of FIG. 21 takes, as a reference value, the threshold voltage of the select transistor in the case where the metal-element-containing layer 17b does not exist and the gate dielectric film of the select transistor is composed of the dielectric film 17a only, and represents the amount of change (the amount of shift) in threshold voltage of the select transistor from that reference value. And, in the graph of FIG. 21, the case where hafnium silicate made of hafnium, silicon, and oxygen is used as the metal-element-containing layer 17b (represented by black triangles in the graph of FIG. 21) and the case where alumina (aluminum oxide) is used as the metal-element-containing layer 17b (represented by white squares in the graph of FIG. 21) are plotted on the graph. Furthermore, the graph of FIG. 21 shows the case where the select transistor is an n-channel-type MISFET and the dielectric film 17a is formed of a silicon oxide film.

As can be seen from the graph of FIG. 21, if a metal introduction amount in the gate dielectric film (dielectric film 17) of the select transistor (corresponding to the horizontal axis on the graph of FIG. 21) is increased, the threshold voltage of the select transistor (or flat-band voltage) is shifted (changed) in a positive direction, and the amount of shift in threshold voltage (corresponding to the vertical axis on the graph of FIG. 21) is approximately saturated with an amount of metal on the order of $5 \times 10^{14}$ to $1 \times 10^{15}$ atoms/cm$^2$. This can be described by Fermi level pinning on a gate electrode side (for example, refer to the above-mentioned Non-Patent Document 4). This phenomenon can be described as follows. That is, an interface state is formed in a band gap of Si of the select gate electrode MG and a Fermi level of the Si gate electrode (select gate electrode SG) is pinned at the level (interface state). Therefore, at least a region of the select gate electrode SG in contact with the dielectric film 17 is made of silicon (here, polycrystalline silicon).

Note that, the amount of metal with its surface density on the order of $5 \times 10^{14}$ to $1 \times 10^{15}$ atoms/cm² corresponds to an amount of metal when hafnium oxide or alumina is formed with a thickness on the order of 0.5 to 1.0 nm. That is, in a range of a metal deposition amount in which threshold voltage changes (with the surface density equal to or lower than $5 \times 10^{14}$ atoms/cm²), this is not the case where the metal-element-containing layer 17b is formed as a film, but the state is such that a metal (metal element forming the metal-element-containing layer 17b, in the case of FIG. 21, hafnium or aluminum) is localized in a narrow range from the proximity of an interface between the dielectric film 17a formed from silicon oxide or silicon oxynitride and the select gate electrode SG formed from polycrystalline silicon. A preferable range of the surface density in the dielectric film 17 of the metal element forming the metal-element-containing layer 17b is, as will be described later, $1 \times 10^{12}$ to $2 \times 10^{15}$ atoms/cm². In the present embodiment, although the "metal-element-containing layer 17b" is represented with the word "layer", the metal-element-containing layer 17b may be not only in the state (case) where the metal-element-containing layer 17b is formed as a film (layer), but also in the state (case) where the surface density of the metal element forming the metal-element-containing layer 17b is low and the metal-element-containing layer 17b is not formed as a film (layer).

As shown in the graph of FIG. 21, by providing the metal-element-containing layer 17b formed from a metal oxide (alumina in FIG. 21) or a metal silicate (hafnium silicate in FIG. 21) (at the interface) between the dielectric film 17a formed from silicon oxide or silicon oxynitride and the select gate electrode SG formed of polycrystalline silicon, and adjusting the surface density of the metal element forming the metal-element-containing layer 17b in the dielectric film 17 (corresponding to the horizontal axis in FIG. 21), the threshold voltage of the select transistor can be controlled. Therefore, the metal-element-containing layer 17b can be regarded as a threshold-voltage adjusting layer introduced for adjusting the threshold voltage of the select transistor. Therefore, compared with the case different from the present embodiment where the gate dielectric film of the select transistor is configured only of the dielectric film 17a made of silicon oxide or silicon oxynitride without forming the metal-element-containing layer 17b, in the case where the metal-element-containing layer 17b is provided (interposed or formed) (at the interface) between the dielectric film 17a and the select gate electrode SG as the present embodiment, the threshold voltage of the select transistor can be increased.

Figure 22:
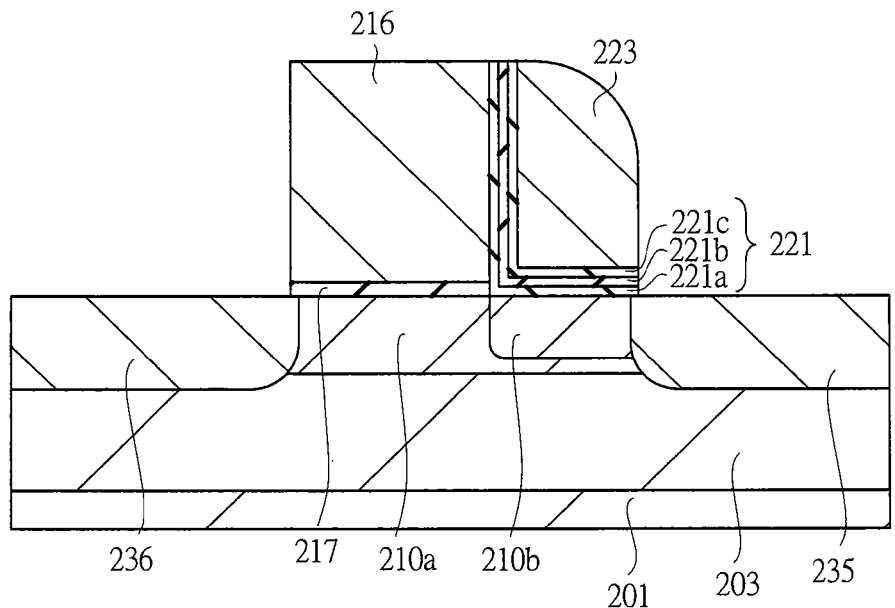
FIG. 22 is a cross-sectional diagram of main parts of a semiconductor for comparison.

FIG. 22 is a cross-sectional diagram of main parts of a semiconductor device (non-volatile semiconductor storage device) according to a comparative example, and corresponds to FIG. 2 in the present embodiment. Also in the semiconductor device according to the comparative example shown in FIG. 22, a split-gate-type memory cell using a MONOS film is formed. A semiconductor substrate 201 of FIG. 22 corresponds to the semiconductor substrate 1 described above, a p-type well 203 corresponds to the p-type well 3 described above, a select gate electrode 216 corresponds to the select gate electrode SG described above, a memory gate electrode 223 corresponds to the memory gate electrode MG described above, and a dielectric film 221 formed of a multilayered film of the silicon oxide films 221a, 221c and silicon nitride film 221b corresponds to the dielectric film 21. Furthermore, a source region 235 in FIG. 22 corresponds to the semiconductor region MS described above, a drain region 236 corresponds to the semiconductor region MD described above, a semiconductor region 210a under the select gate electrode 216 corresponds to the semiconductor region 10a described above, and a semiconductor region 210b under the memory gate electrode 223 corresponds to the semiconductor region 10b described above. However, in the semiconductor device in the comparative example of FIG. 22, unlike the present embodiment, no component corresponding to the metal-element-containing layer 17b as described above is formed, and the gate dielectric film of the select transistor is formed of a dielectric film 217, which is a single film (single layer) of a silicon oxide film or a silicon oxynitride film positioned under the select gate electrode 216. That is, the semiconductor device in the comparative example of FIG. 22 corresponds to a device in which the gate dielectric film of the select transistor is formed only of the dielectric film 217 corresponding to the dielectric film 17a (14) described above, without forming the metal-element-containing layer 17b (15).

In the case where the dielectric film of the select transistor is formed only of the dielectric film 217 made of silicon oxide or silicon oxynitride without forming a component corresponding to the metal-element-containing layer 17b as in the semiconductor device according to the comparative example of FIG. 22, unlike the present embodiment, the impurity density (charge density of impurities) of the channel region under the select gate electrode (corresponding to the semiconductor region 210a) has to be increased to increase the threshold voltage of the select transistor.

However, in the present embodiment, the metal-element-containing layer 17b is provided (formed or interposed) between the dielectric film 17a and the select gate electrode SG. With this, compared with the semiconductor device according to the comparative example of FIG. 22 in which a component corresponding to the metal-element-containing layer 17b does not exist, the threshold voltage of the select transistor can be increased (an absolute value of the threshold voltage of the select transistor can be increased). Therefore, if the threshold voltage of the select transistor is the same, compared with the semiconductor device according to the comparative example of FIG. 22, in the semiconductor device according to the present embodiment provided with the metal-element-containing layer 17b, the impurity density (charge density of impurities) of the channel region (semiconductor region 10a) under the select gate electrode SG can be decreased more.

That is, if the threshold voltage of the select transistor is the same between the semiconductor device according to the comparative example of FIG. 22 and the semiconductor device according to the present embodiment of FIGS. 1 and 2, the impurity density (charge density of impurities) can be decreased more in the semiconductor region 10a of the semiconductor device according to the present embodiment of FIGS. 1 and 2 than the semiconductor region 210a of the semiconductor device according to the comparative example of FIG. 22.

As shown, in the present embodiment where the metal-element-containing layer 17b is formed between the dielectric film 17a and the select gate electrode SG, by change in threshold voltage as shown in FIG. 21, the impurity density (charge density of impurities) of the channel region (semiconductor region 10a) under the select gate electrode SG can be decreased compared with the comparative example of FIG. 22 where the metal-element-containing layer 17b is not deposited.

For example, in order to set the threshold value (threshold voltage) of the select transistor at a current value of $10^{-10}$ A/μm in an OFF state, in the case of the comparative example of FIG. 22 (that is, if no component corresponding to the metal-element-containing layer 17b exists), the dose amount of ion implantation of impurities of boron (B) into the channel region (this ion implanting process corresponds to the ion implantation 6) has to be equal to or larger than $1\times10^{13}/cm^2$, and the impurity density of the channel region (semiconductor region 210a) of the select transistor is equal to or larger than $6\times10^{17}/cm^3$. However, as in the present embodiment, if the metal-element-containing layer 17b is formed over the dielectric film 17a and hafnium silicate or alumina is introduced so that the threshold voltage is increased by approximately 0.3V according to the graph of FIG. 21 (when the surface density of Hf or Al forming the metal-element-containing layer 17b is adjusted so that the amount of change in threshold voltage represented on the vertical axis in the graph of FIG. 21 is approximately 0.3V), the dose amount of ion implantation of impurities of boron (B) into the channel region (semiconductor region 10a) (this ion implanting process corresponds to the ion implantation 6) is decreased to be a value equal to or lower than $8\times10^{12}/cm^2$. Thus, with the impurity density of the channel region (semiconductor region 10a) of the select transistor being equal to or lower than $5\times10^{17}/cm^3$, the drain current of the select transistor in an OFF state can be suppressed to a value equal to or lower than $10^{-10}$ A/μm. Therefore, by adjusting both of the amount of metal in the metal-element-containing layer 17b (the surface density of the metal element forming the metal-element-containing layer 17b in the dielectric film 17) and the dose amount of the ion implantation 6 of boron (B) into the channel region (semiconductor region 10a) under the select gate electrode SG, the amount of impurities introduced to the channel region (semiconductor region 10a) of the select transistor can be decreased compared with the comparative example of FIG. 22 (that is, the case where no component corresponding to the metal-element-containing layer 17b exists).

The surface density of the metal element forming the metal-element-containing layer 17b in the dielectric film 17 (the amount of metal in the metal-element-containing layer 17b) is preferably equal to or lower than $2\times10^{15}$ atoms/$cm^2$ and, more preferably, equal to or lower than $1\times10^{15}$ atoms/$cm^2$. With this, the threshold voltage of the select transistor can be controlled while preventing adverse effects due to the use of the metal-element-containing layer 17b as the gate dielectric film.

Also, the surface density of the metal element forming the metal-element-containing layer 17b in the dielectric film 17 (the amount of metal in the metal-element-containing layer 17b) is preferably equal to or higher than $1\times10^{12}$ atoms/$cm^2$. With this, an effect of an increase in threshold voltage of the select transistor due to the provision of the metal-element-containing layer 17b can be obtained. Note that, in the case where the surface density is $1\times10^{12}$ atoms/$cm^2$ to $1\times10^{13}$ atoms/$cm^2$, the amount of change (amount of increase) in threshold voltage of the select transistor due to the provision of the metal-element-containing layer 17b is small. Therefore, the surface density of the metal element forming the metal-element-containing layer 17b in the dielectric film 17 (the amount of metal in the metal-element-containing layer 17b) is more preferably equal to or higher than $1\times10^{13}$ atoms/$cm^2$. By making the surface density equal to or high than $1\times10^{13}$ atoms/$cm^2$, the amount of change (amount of increase) in threshold voltage of the select transistor due to the provision of the metal-element-containing layer 17b is increased, therefore, it becomes easy to adjust the threshold voltage of the select transistor. And, by making the surface density of the metal element forming the metal-element-containing layer 17b in the dielectric film 17 (the amount of metal in the metal-element-containing layer 17b) preferably equal to or higher than $1\times10^{12}$ atoms/$cm^2$ and, more preferably, equal to or higher than $1\times10^{13}$ atoms/$cm^2$, the amount of formation (deposition) of the metal-element-containing layer 15 (17b) in the dielectric film 17 can be easily controlled in the process of forming the metal-element-containing layer 15 (17b).

Therefore, the surface density of the metal element forming the metal-element-containing layer 17b in the dielectric film 17 is preferably $1\times10^{12}$ to $2\times10^{15}$ atoms/$cm^2$ and, more preferably, $1\times10^{13}$ to $1\times10^{15}$ atoms/$cm^2$.

Also, an upper limit of the amount of metal in the metal-element-containing layer 17b (surface density of the metal element forming the metal-element-containing layer 17b in the dielectric film 17) is further preferably within a range in which the amount of change in threshold voltage in FIG. 21 (corresponding to the vertical axis on the graph of FIG. 21) can be suppressed equal to or lower than 0.4V so that variations in threshold voltage can be prevented from occurring due to a short-channel effect of the select transistor.

Furthermore, although depending on the setting of degree of the threshold voltage of the select transistor, the charge density of impurities in the semiconductor region 10a (a first channel region) positioned under the select gate electrode SG and the dielectric film 17 is preferably $5\times10^{16}$ to $1\times10^{18}/cm^3$.

Still further, in order to increase the threshold voltage of the select transistor by changing the work function (flat-band voltage) of the select gate electrode SG due to the provision of the metal-element-containing layer 17b, the metal element forming the metal-element-containing layer 17b is preferably hafnium (Hf), zirconium (Zr), or aluminum (Al). With this, by the introduction of the metal-element-containing layer 17b, the work function (flat-band voltage) of the select gate electrode SG can be changed appropriately to increase the threshold voltage of the select transistor appropriately. Still further, the metal-element-containing layer 17b is preferably formed of a metal oxide or a metal silicate. With this, the metal-element-containing layer 17b (15) can be formed easily, an unnecessary reaction of the metal-element-containing layer 17b (15) can be prevented, and the metal-element-containing layer 17b can be prevented from acting as a conductive film. Therefore, it is more preferable that the metal-element-containing layer 17b is formed from hafnium oxide, zirconium oxide, aluminum oxide (alumina), hafnium silicate (that is, a silicate made of silicon oxide and hafnium oxide), or zirconium silicate (that is, a silicate made of silicon oxide and zirconium oxide). Also, the metal-element-containing layer 17b may be configured of the metal oxide or the metal silicate with nitrogen further introduced thereto.

And, unlike the present embodiment, the gate dielectric film of the select transistor may be configured only of a metal oxide or a metal silicate. In this case, however, mobility of the channel region of the select transistor may be decreased, and the performance of the semiconductor device may be decreased. By contrast, in the present embodiment, the dielectric film 17a is formed so as to be in contact with the channel region (semiconductor region 10a) of the select transistor, and the metal-element-containing layer 17b is formed over that dielectric film 17a. Therefore, the metal-element-containing layer 17b made of a metal oxide or a metal silicate is not in contact with the channel region (semiconductor region 10a). Thus, a decrease in the mobility of the channel region (semiconductor region 10a) can be prevented, and the performance of the semiconductor device can be increased. Also, in the present embodiment, the dielectric film 17a is preferably thicker than the metal-element-containing layer 17b. With this, it is possible to suppress or prevent a decrease in the mobility of the channel region of the select transistor due to the presence of the metal-element-containing layer 17b near the channel region (semiconductor region 10a) of the select transistor.

On the other hand, the charge density of the impurities of the semiconductor region 10b under the memory gate electrode MG is determined mainly by both of impurities introduced to the semiconductor region 10b simultaneously when the impurities introduced to the semiconductor region 10a (impurities introduced in the ion implantation 6) and impurities introduced to the semiconductor region 10b by the ion implantation 18 using the select gate electrode SG as an ion-implantation inhibiting mask. And, in the case where the impurities ion-implanted to the semiconductor region 10b using the select gate electrode SG as an ion-implantation inhibiting mask in the process of the ion implantation 18 are n-type impurities (for example, arsenic), which are of a conducting type reverse to the conducting type (here, p-type) of the impurities introduced in the ion implantation 6, the net (effective) charge density of the impurities of the semiconductor region 10b can be decreased, and the threshold voltage of the memory transistor can be decreased.

That is, in the process of the ion implantation 6, in the semiconductor substrate 1 (p-type well 3), p-type (first conducting type) impurities are introduced (ion-implanted) to both of the region that later becomes the semiconductor region 10a (first channel region) positioned under the select gate electrode SG and the dielectric film 17 and the region that later becomes the semiconductor region 10b (second channel region) positioned under the memory gate electrode MG and the dielectric film 21. And, in the process of the ion implantation 18, in the semiconductor substrate 1 (p-type well 3), no impurities are introduced (ion-implanted) to the region that later becomes the semiconductor region 10a (first channel region) positioned under the select gate electrode SG and the dielectric film 17, and n-type (second conducting type reverse to the first conducting type) impurities are introduced (ion-implanted) to the region that later becomes the semiconductor region 10b (second channel region) positioned under the memory gate electrode MG and the dielectric film 21. Therefore, while impurities are introduced to the semiconductor region 10a under the select gate electrode SG in the ion implantation 6, and no impurities are introduced in the ion implantation 18, to the semiconductor region 10b under the memory gate electrode MG, impurities are introduced by both of the ion implantation 6 and the ion implantation 18. Therefore, the charge density (impurity density) of the impurities of the semiconductor region 10b under the memory gate electrode MG is determined by both of the impurities introduced by the ion implantation 6 and the impurities introduced by the ion implantation 18. Note that, to the semiconductor region 10a under the select gate electrode SG and the semiconductor region 10b under the memory gate electrode MG, p-type impurities ion-implanted at the time of forming the p-type well 3 are also introduced.

As can be seen also from the manufacturing process, p-type impurities (for example, boron) are introduced to both of the region (semiconductor region 10a) under the select gate electrode SG and the region (semiconductor region 10b) under the memory gate electrode MG with an approximately same density (p-type impurity density) so that an optimum charge density of the impurities as the channel region of the select transistor can be achieved in the semiconductor region 10a under the select gate electrode SG. This is because the p-type impurities are ion-introduced to both of the semiconductor region 10a and the semiconductor region 10b in the process of the ion implantation 6 since it is difficult to ion-implant the p-type impurities only to the region (semiconductor region 10a) under the select gate electrode SG without ion-implanting to the region (semiconductor region 10b) under the memory gate electrode MG. When the memory cell is in an unselected state (the select transistor is in an OFF state), the drain current is preferably low, therefore, the select transistor is desired to increase the threshold voltage to some degree, whilst the memory transistor is desired to decrease the threshold voltage at the time of erasing to increase a current value at the time of reading (drain current value). Therefore, since it is required that the select transistor increase the threshold voltage and the memory transistor decrease the threshold voltage, n-type impurities are introduced as counter impurities (impurities of a conducting type reverse to that of the impurities introduced to the semiconductor region 10a under the select gate electrode SG) to the semiconductor region 10b under the memory gate electrode MG to decrease the charge density of the impurities of the semiconductor region 10b. With this, the threshold voltage of the memory transistor can be decreased without decreasing the threshold voltage of the select transistor.

Therefore, in the present embodiment, the p-type impurities (impurities of the first conducting type) are introduced to the semiconductor region 10a (first channel region) under the select gate electrode SG (and n-type impurities are not introduced). With this, the charge density of the impurities of the semiconductor region 10a can be increased to decrease the leak current when the select transistor is in an OFF state. And, the p-type impurities (p-type impurities with the same density as that of the p-type impurities of the semiconductor region 10a) and the n-type impurities (impurities of the second conducting type reverse to the first conducting type) are both introduced to the semiconductor region 10b (second channel region) under the memory gate electrode MG. With this, the charge density of the impurities of the semiconductor region 10b can be decreased to decrease the threshold voltage of the memory transistor.

Therefore, in the present embodiment, the charge density of the impurities in the semiconductor region 10a (first channel region) positioned under the select gate electrode SG and the dielectric film 17 is different from the charge density of the impurities in the semiconductor region 10b (second channel region) positioned under the memory gate electrode MG and the dielectric film 21. The charge density of the impurities in the semiconductor region 10b (second channel region) is lower than the charge density of the impurities in the semiconductor region 10a (first channel region).

Here, the charge of the p-type impurities doped into the semiconductor region is negative in a depletion layer, and the charge of the n-type impurities is positive. Therefore, if the impurities doped into a semiconductor region are of the same conducting type, signs of the charges are the same, therefore the charge density of the impurities in that semiconductor region can be calculated by adding these impurity density together. On the other hand, as for the impurities of conducting types reverse to each other, the charges are cancelled out, and therefore the charge density of the impurities corresponds to a value obtained by subtracting the impurity density of one conducting type from the impurity density of the other conducting type. Thus, if one type of impurities is used for doping, the charge density of the impurities corresponds to the impurity density of those impurities. If impurities of plurality of types are used for doping, the impurity density of the impurities of the same conducting type are added together, whilst, as for the impurities of different conducting types, the impurity density corresponds to the impurity density of one type is subtracted from the impurity density of the other type. For example, in the case where n-type impurities (for example, phosphorus) with an impurity density of $10^{18}/cm^3$, are used for doping and another n-type impurities (for example, arsenic) with an impurity density of, for example, $3\times10^{17}/cm^3$, are used for doping, the charge density of the impurities is $1.3\times10^{18}/cm^3$, obtained by adding two impurities. Also, in the case where n-type impurities (for example, phosphorous) with an impurity concentration of $10^{18}/cm^3$, are used for doping and another p-type impurities (for example, boron) with an impurity density of, for example, $3\times10^{17}/cm^3$, are used for doping. In this case, the charge density of the impurities is $7\times10^{17}/cm^3$, which is a difference therebetween. Here, if the valence of charge included in the impurities for doping is equal to or larger than 2, the charge density of the impurities can correspond to a value obtained by multiplying the impurity density by the valence of charge. In both of the above two cases, the density of the n-type impurities is larger, therefore, the region functions as an n-type semiconductor region. If n-type impurities and p-type impurities are mixed and the density of the p-type impurities is larger, the region functions as a p-type semiconductor region. If n-type impurities and p-type impurities are mixed, they are cancelled out and a difference in impurity density can provide a function as effective impurities (donor or acceptor). Therefore, the charge density of the impurities can be considered as an effective impurity density in that semiconductor region.

Unlike the present embodiment, in the case of the comparative example of FIG. 22 where no component corresponding to the metal-element-containing layer 17b is formed, the density of the p-type impurities in the semiconductor region 210a under the select gate electrode 216 is increased to increase the threshold voltage of the select transistor, and the charge density of the impurities in the semiconductor region 210b under the memory gate electrode 223 is decreased by using counter impurities to decrease the threshold voltage of the memory transistor. In this case, the semiconductor region 210b under the memory gate electrode 223 is introduced with p-type impurities with density required to increase the threshold voltage of the select transistor and n-type impurities with density capable of canceling the p-type impurities to decrease the threshold voltage of the memory transistor. Therefore, a total amount of the density of the p-type impurities and the density of the n-type impurities in the semiconductor region 210b under the memory gate electrode 223 (a total amount of impurities) is increased.

By contrast, in the present embodiment, as described above, by providing the metal-element-containing layer 17b, the threshold voltage of the select transistor can be increased. Therefore, compared with the comparative example in which no metal-element-containing layer 17b is provided, the p-type impurity density (charge density of impurities) in the semiconductor region 10a under the select gate electrode SG can be decreased. Since the density of the p-type impurities in the semiconductor region 10a under the select gate electrode SG can be decreased, the density of the p-type impurities in the semiconductor region 10b under the memory gate electrode MG can also be decreased. Therefore, it is possible to decrease the density of the n-type impurities as counter impurities that have to be introduced by the ion implantation 18 to the semiconductor region 10b under the memory gate electrode MG so as to obtain a desired threshold voltage (low threshold voltage) of the memory transistor. Therefore, in the present embodiment, compared with the comparative example of FIG. 22 in which no component corresponding to the metal-element-containing layer 17b is formed, the total amount of the density of the p-type impurities and the density of the n-type impurities (total amount of the impurities) in the semiconductor region 10b under the memory gate electrode MG is decreased.

That is, in the case where the threshold voltage of the select transistor is the same on both of the semiconductor device in the comparative example of FIG. 22 and the semiconductor device according to the present embodiment of FIGS. 1 and 2, and the threshold voltage (initial threshold voltage Vthi before rewriting) of the memory transistor is the same on both devices, the total amount of the density of the p-type impurities and the density of the n-type impurities (total amount of impurities) in the semiconductor region 10b of the semiconductor device according to the present embodiment of FIGS. 1 and 2 is smaller (lower) than that in the semiconductor region 210b of the semiconductor device in the comparative example of FIG. 22.

Thus, in the present embodiment, not only the dielectric film 17a but also the metal-element-containing layer 17b is used for the gate dielectric film of the select transistor. Thus, compared with the comparative example of FIG. 22 where no metal-element-containing layer 17b is formed, the density of the p-type impurities of the semiconductor region 10a under the memory gate electrode MG can be decreased. Therefore, with a small amount of doping (introduction) of the n-type impurities as counter impurities in the semiconductor region 10, a low threshold voltage of the memory transistor can be achieved.

Figure 23:
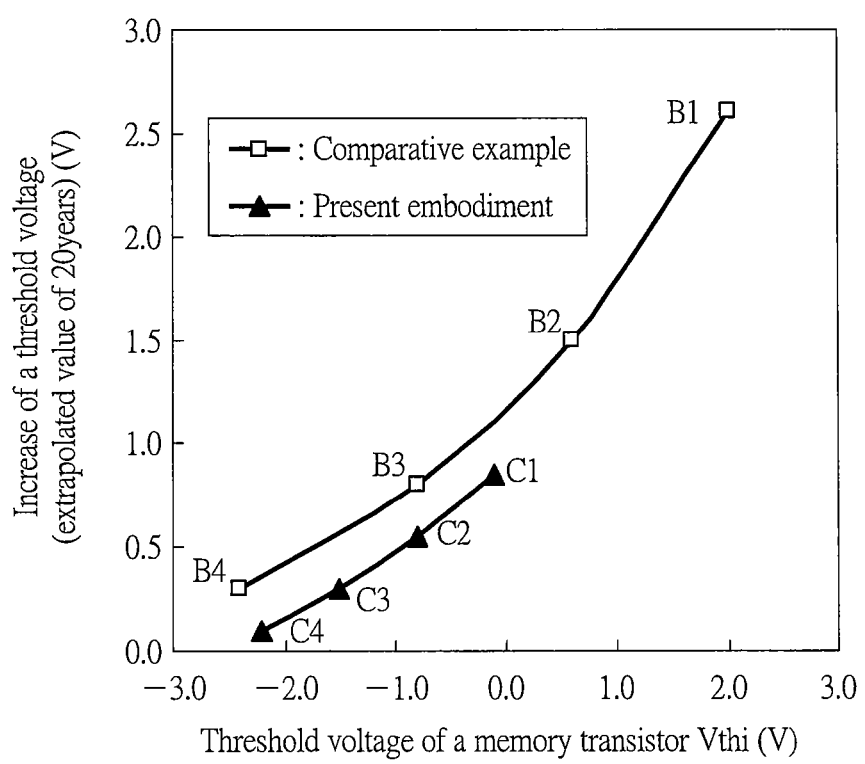
FIG. 23 is a graph showing a relation between an amount of increase of threshold voltage of a memory transistor held in an erase state for twenty years and threshold voltage of a memory transistor before rewriting.
Figure 52:
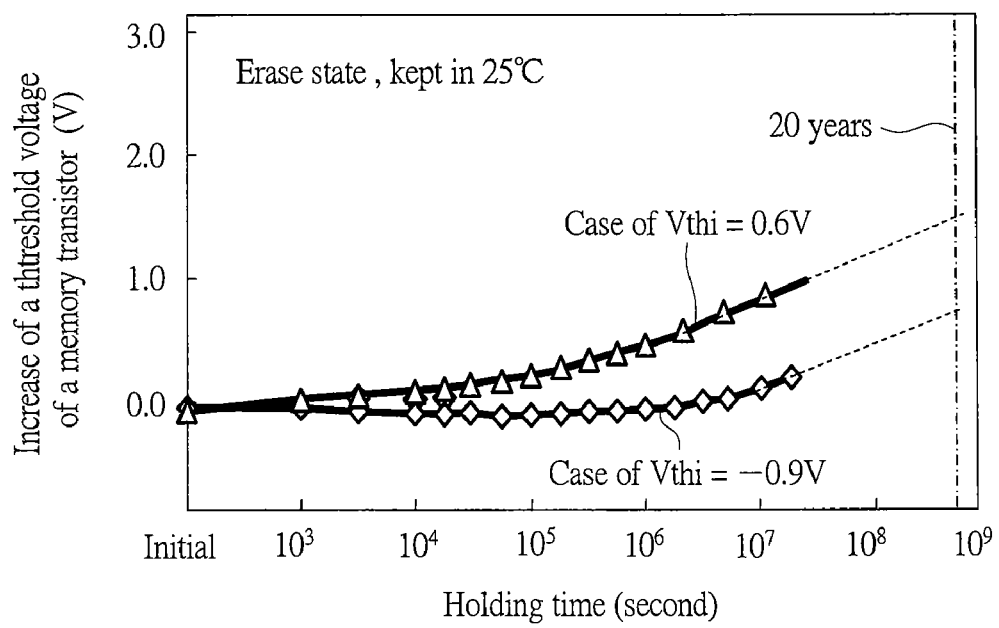
FIG. 52 is a graph showing change with time of threshold voltage of memory transistor in an erase state after rewriting hundred thousand times.

FIG. 23 is a graph showing a relation between an amount of increase (extrapolated value) of the threshold voltage of the memory transistor held in an erase state for twenty years after rewriting the memory transistor hundred thousand times at 25 degree Celsius and the threshold voltage Vthi (initial value of the threshold voltage) of the memory transistor before rewriting. The horizontal axis on the graph of FIG. 23 corresponds to the initial threshold voltage Vthi of the memory transistor before rewriting, that is, the initial threshold voltage Vthi before injecting charges into the ONO film (corresponding to the dielectric film 21 in the present embodiment) under the memory gate electrode. Also, the vertical axis on the graph of FIG. 23 corresponds to the amount of increase of the threshold voltage of the memory transistor held in an erase state for twenty years after rewriting the memory transistor hundred thousand times at 25 degree Celsius (a value, obtained through an extrapolation scheme, representing the amount of increase from a reference value, which is the threshold voltage at the time of the start of holding, after twenty years). For example, the amount of increase can be obtained through extrapolation as represented by dotted lines in the graph of FIG. 52 described above.

In the graph of FIG. 23, for the case of the semiconductor device (memory cell) in the comparative example of FIG. 22 (shown as "comparative example" in the graph of FIG. 23) and the case of the semiconductor device (memory cell) according to the present embodiment (shown as "present embodiment" in the graph of FIG. 23), the initial threshold voltage Vthi is varied by changing the doping amount (dose amount in a process corresponding to the ion implantation 18) of counter impurities introduced to the channel region (region corresponding to the semiconductor region 210b in the comparative example and corresponding to the semiconductor region 10b in the present embodiment) of the memory transistor and represented in the graph (plotted). That is, "comparative example" shown in the graph of FIG. 23 corresponds to the case where the gate dielectric film of the select transistor is formed only of the dielectric film 217 made of silicon oxide or silicon oxynitride without forming a component corresponding to the metal-element-containing layer 17b (memory cell in FIG. 22), and "present embodiment" shown in the graph of FIG. 23 corresponds to the case where the metal-element-containing layer 17b is provided between the dielectric film 17a and the select gate electrode SG (memory cell in FIGS. 1 and 2).

Note that, the threshold voltage of the memory transistor used in the graph of FIG. 23 is defined by a memory gate voltage (voltage applied to the memory gate electrode MG and 223) when a current flowing between diffusion layers (between the semiconductor region MS, 235 and the semiconductor region MD, 236) is 20 µA/µm with 1.5V being applied to the select gate electrode SG and 216, 1.0V being applied to the diffusion layer (semiconductor region MD and 236) on a select gate electrode SG and 216 side, 0V being applied to the well (p-type well regions 3 and 203), and 0V being applied to the diffusion layer (semiconductor region MS and 235) on a memory gate electrode MG and 223 side. And, the threshold voltage of the memory transistor at the time of the start of holding is set to −1.0V.

That is, the inventors manufactured eight types of non-volatile semiconductor storage devices (semiconductor chips in which a plurality of split-gate memory cells using MONOS films are formed) with test-sample codes B1, B2, B3, B4, C1, C2, C3, and C4 shown in a table of FIG. 24. Manufacturing conditions and characteristics of these non-volatile semiconductor storage devices B1, B2, B3, B4, C1, C2, C3, and C4 are shown in the table of FIG. 24.

In the table of FIG. 24, an "amount of hafnium in the metal-element-containing layer 17b" field corresponds to the amount (surface density) of hafnium in hafnium silicate forming the metal-element-containing layer 17b. A "dose amount of ion implantation 6" field corresponds to the dose amount of boron (B) impurities ion-implanted to regions corresponding to the semiconductor regions 10a, 10b, 210a, and 210b in a process corresponding to the ion implantation 6. And, in the table of FIG. 24, a "dose amount of ion implantation 18" field corresponds to the dose amount of arsenic (As) impurities as counter impurities ion-implanted to regions corresponding to the semiconductor regions 10b and 210b in a process corresponding to the ion implantation 18.

In these eight types of non-volatile semiconductor storage devices B1, B2, B3, B4, C1, C2, C3, and C4, a plurality of (here, approximately million) memory cells are formed. Therefore, the threshold voltages Vthi of the memory transistors of the plurality of memory cells formed in the same non-volatile semiconductor storage device are not exactly the same, but are varied (fluctuated) to some extent. Therefore, a center value (which approximately coincides with an average value) of the approximately million values) of the threshold voltages Vthi of the memory transistors of the plurality of (here, approximately million) memory cells formed in the same non-volatile semiconductor storage device is described in a "center value of memory-transistor threshold voltages Vthi before rewriting" field in the table of FIG. 24. The magnitude of variations (fluctuations) in threshold voltages Vthi of the memory transistors of the plurality of (here, approximately million) memory cells formed in the same non-volatile semiconductor storage device (for example, a difference between a maximum value and a minimum value) is described in a "variations in Vthi" field in the table of FIG. 24.

The test samples B1, B2, B3 and B4 correspond to non-volatile semiconductor storage devices in the comparative example of FIG. 22 in which the gate dielectric film of the select transistor is formed only of the dielectric film 217 made of silicon oxide or silicon oxynitride (here, a silicon oxide film) without forming a component corresponding to the metal-element-containing layer 17b. Therefore, since the metal-element-containing layer 17b is not formed, the "amount of hafnium of the metal-element-containing layer 17b" field in the table of FIG. 24 contains "no", that is, zero. The test samples C1, C2, C3 and C4 correspond to non-volatile semiconductor storage devices according to the present embodiment of FIGS. 1 and 2 in which the metal-element-containing layer 17b is formed between the dielectric film 17a and the select gate electrode SG. In the non-volatile semiconductor storage devices with test-sample codes C1, C2, C3, and C4, the metal-element-containing layer 17b is formed from hafnium silicate, and the amount of hafnium (surface density) in the metal-element-containing layer 17b is set to $3 \times 10^{14}$ atoms/cm$^2$. The amount of injection of counter impurities introduced to the channel region (semiconductor region 210b) of the memory transistor in a process corresponding to the ion implantation 6 (the amount corresponds to "dose amount in ion implantation 6" in the table of FIG. 24) is increased in the order of the test samples B1, B2, B3, and then B4. Therefore, the center value (average value) of the threshold voltages Vthi of the memory transistors before rewriting is decreased in the order of the test samples B1, B2, B3, and then B4. Similarly, the amount of injection of counter impurities introduced to the channel region (semiconductor region 10b) of the memory transistor in a process corresponding to the ion implantation 6 (the amount corresponds to "dose amount in ion implantation 6" in the table of FIG. 24) is increased in the order of the test samples C1, C2, C3, and then C4. Therefore, the center value (average value) of the threshold voltages Vthi of the memory transistors before rewriting is decreased in the order of the test samples C1, C2, C3, and then C4.

For each of these eight types of non-volatile semiconductor storage devices B1, B2, B3, B4, C1, C2, C3, and C4, the amount of increase (extrapolated value) of the threshold voltage of the memory transistor held in an erase state for twenty years after rewriting the memory transistor hundred thousand times at 25 degree Celsius was inspected and plotted (represented in the graph) on FIG. 23. The values in the "center value of memory-transistor threshold voltages Vthi before rewriting" field correspond to the values on the horizontal axis in FIG. 23. And, for easy understanding, in the graph of FIG. 23, a test-sample code (test-sample code in the table of FIG. 24) corresponding to each point is provided near the point.

The vertical axis on the graph of FIG. 23 represents the amount of increase of the threshold voltage of the memory transistor held in an erase state for twenty years after rewriting the memory transistor hundred thousand times at 25 degree Celsius. This amount of increase (amount of change) is preferably low (small). As this amount of increase is lower, the data holding characteristic can be regarded as being higher (more excellent). As is evident from the graph of FIG. 23, the data holding characteristic in an erase state is improved as the threshold voltage Vthi of the memory transistor before rewriting is lower. As is evident also from FIG. 23, the data holding characteristic in an erased state is improved more with respect to the same voltage Vthi (that is, the value on the vertical axis in the graph of FIG. 23 can be decreased) in the present embodiment in which the metal-element-containing layer 17b is provided than in the comparative example where no component corresponding to the metal-element-containing layer 17b is formed (that is, this is the case when the comparative example and the present embodiment are compared with each other at a value of the same position on the horizontal axis of the graph of FIG. 23). According to the results of the present embodiment in FIG.

23, by adjusting Vthi to be equal to or lower than 0V, a read current equal to or larger than 20 μA/μm with the memory gate being at a zero bias is obtained even after twenty years.

The reason why the data holding characteristic is improved as the threshold voltage Vthi before rewriting of the memory transistor is lower is considered as follows.

In a memory cell in which hot carriers are injected for rewriting, the hot carriers damage the dielectric films (corresponding to the silicon oxide films 21a and 221a) and their interfaces. This damage generates an interface state and trap. Then, charge and discharge for them or charge and discharge via them occur. In the case where data is held in an erase state after rewriting, since the threshold voltage of the memory transistor is low, the channel region (corresponding to the semiconductor region 10b or 210b) of the memory transistor (under the memory gate electrode MG, 223) is in a reversed state, and inversion-layer electrons exist. If a defect exists in the dielectric film (corresponding to the silicon oxide film 21a, 221a), it is considered that tunneling of the inversion-layer electrons occurs via the defect into the silicon nitride film (corresponding to the silicon nitride film 21b, 221b), then, the electrons are trapped into the silicon nitride film (corresponding to the silicon nitride film 21b, 221b) or canceled out with the previously-trapped holes. With this, it is considered that the increase of the threshold voltage (of the memory transistor) occurs.

The probability of tunneling of the inversion-layer electrons into the silicon nitride film (corresponding to the silicon nitride film 21b, 221b) is increased as the electric field applied to the dielectric film (corresponding to the silicon oxide film 21a, 221a) is larger. However, if the threshold voltage Vthi before rewriting is low, an amount of holes to be injected to achieve the threshold voltage in an erase state (in the above case, −1V, for example) is smaller than that in the case of a high Vthi. Therefore, it is considered that, the electric field applied to the dielectric film (corresponding to the silicon oxide film 21a, 221a) in an erase state is decreased, therefore, the probability of tunneling of the inversion-layer electrons into the silicon nitride film (corresponding to the silicon nitride film 21b, 221b) is decreased and an increase in the threshold voltage (of the memory transistor) is suppressed.

The reason why the data holding characteristic in an erase state is improved more with respect to the same Vthi in the present embodiment in which the metal-element-containing layer 17b is provided between the dielectric film 17a and the select gate electrode SG than in the comparative example of FIG. 22 in which no component corresponding to the metal-element-containing layer 17b is formed is considered as follows.

An increase in threshold voltage of the select transistor due to the provision of the metal-element-containing layer 17b can be expected in the present embodiment compared with the comparative example in which no metal-element-containing layer 17b is formed, therefore, the impurity density of the channel region (corresponding to the semiconductor region 10a) under the select gate electrode SG can be decreased. With this, in the present embodiment, in the semiconductor region 10a (channel region) under the select gate electrode SG, Coulomb scattering of carriers due to impurity ions is decreased, therefore, the mobility of the channel is increased significantly and the select transistor is sped up. Furthermore, the mobility of the channel region (corresponding to the semiconductor region 10b) under the memory gate electrode MG is determined by the total amount of impurity ions (a sum of p-type impurities and n-type impurities) injected thereinto. As described above, in comparison between the comparative example in which no metal-element-containing layer 17b is formed and the present embodiment in which the metal-element-containing layer 17b is provided, if the threshold voltages Vthi of both of the memory transistors are equal to each other, the total amount of the density of the p-type impurities and the density of the n-type impurities (total amount of impurity ions) in the channel region (corresponding to the semiconductor region 10b, 210b) in the present embodiment is smaller (lower) than that in the comparative example. Therefore, in the present embodiment, the total amount of impurity ions (total density) in the channel region under the memory gate electrode MG (corresponding to the semiconductor region 10b) can be decreased, therefore, the mobility of the memory transistor is increased and the memory transistor is sped up. As described above, according to the present embodiment, both of the select transistor and the memory transistor can be sped up. In other words, the threshold voltage defined with a read current of, for example, 20 μA/μm, can be decreased. Accordingly, in the present embodiment, the amount of holes injected to achieve a threshold voltage in an erase state (in this case, −1V, for example) is smaller than that in the comparative example (the case in which no metal-element-containing layer 17b is formed), therefore, the electric field applied to the dielectric film (silicon oxide film 21a) in a holding state is decreased. With the effects mentioned above, in the present embodiment, the data holding characteristic can be increased. Therefore, the performance of the semiconductor device with the non-volatile memory can be increased, and also the reliability of the semiconductor device with the non-volatile memory can be increased.

Figure 25:
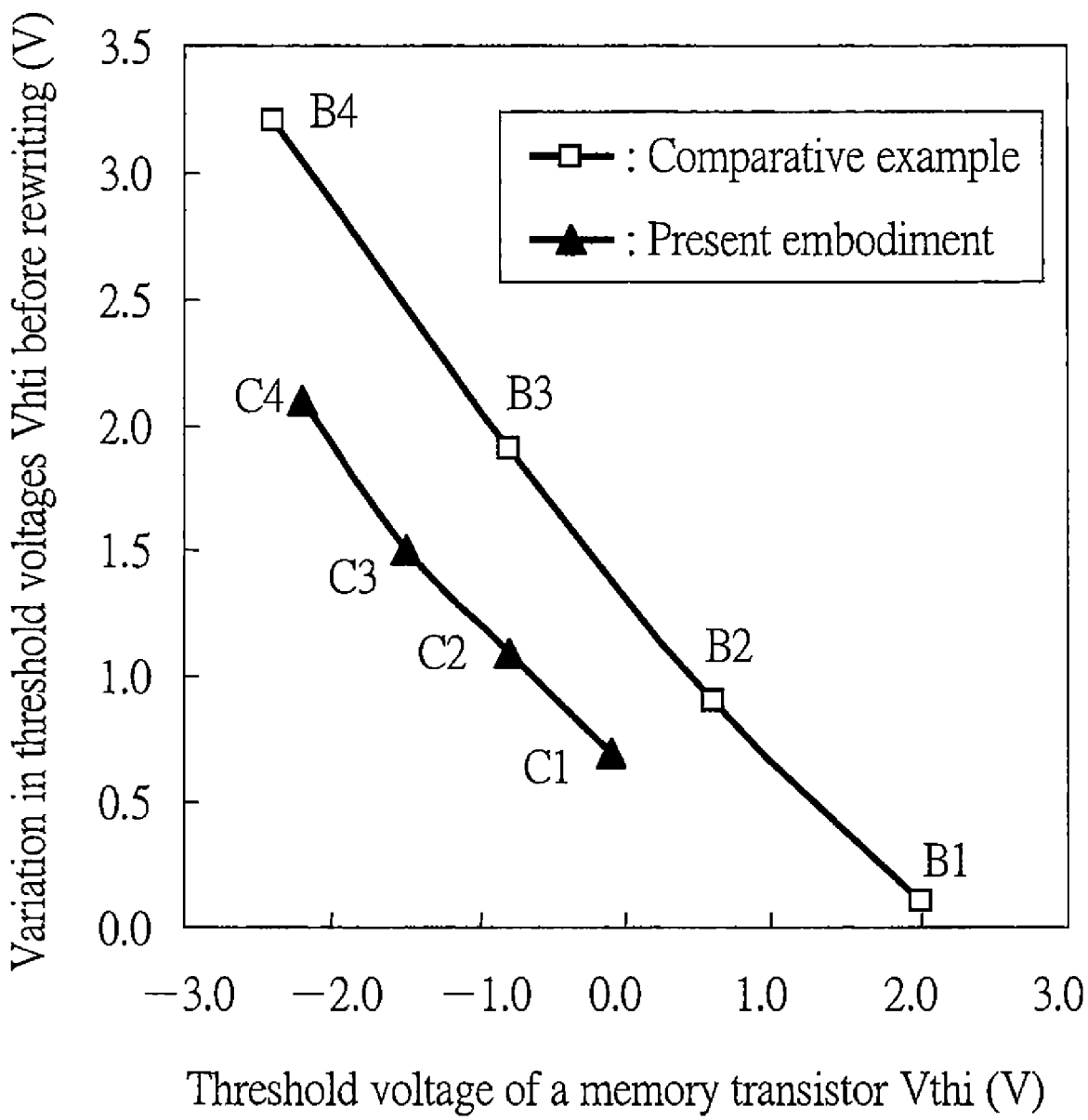
FIG. 25 is a graph showing a relation between a center value of threshold voltages of memory transistors before rewriting and variations in the threshold voltages of the memory transistors before rewriting.

FIG. 25 is a graph showing a relation between the center value of the threshold voltage Vthi of the memory transistors before rewriting and variations in threshold voltage Vthi of the memory transistor before rewriting (a difference between a maximum value and a minimum value of each of the million memory transistors in a chip).

The horizontal axis on the graph of FIG. 25 corresponds to the center value (which approximately coincides with the average value) of the threshold voltages Vthi of the memory transistors of the plurality of (here, approximately million) memory cells formed in the same semiconductor chip (non-volatile semiconductor storage device). The vertical axis on the graph of FIG. 25 corresponds to a difference between a maximum and a minimum of the threshold voltages Vthi of the memory transistors of the plurality of (here, approximately million) memory cells formed in the same semiconductor chip (non-volatile semiconductor storage device). That is, the horizontal axis on the graph of FIG. 25 corresponds to values in the "center value of threshold voltages Vthi of memory transistors before rewriting" field in the table of FIG. 24, and the vertical axis on the graph of FIG. 25 corresponds to values in the "variations in Vthi" field in the table of FIG. 24. Therefore, the eight types of non-volatile semiconductor storage devices B1, B2, B3, B4, C1, C2, C3, and C4 in the table of FIG. 24 are plotted on the graph of FIG. 25. For easy understanding, in the graph of FIG. 25, a test-sample code (test-sample code in the table of FIG. 24) corresponding to each point is provided near the point.

The graph of FIG. 25 shows both of the case where the non-volatile semiconductor storage devices B1, B2, B3, and B4 in the comparative example in which no component corresponding to the metal-element-containing layer 17b is formed (structure in FIG. 22) are plotted on the graph (represented as "comparative example" in the graph of FIG. 25) and the case where the non-volatile semiconductor storage devices C1, C2, C3, and C4 (having the structure of FIGS. 1 and 2) in which, as in the present embodiment, the metalelement-containing layer 17b is provided are plotted on the graph (represented as "present embodiment" in the graph of FIG. 25).

The vertical axis on the graph of FIG. 25 represents variations (difference in a maximum value and a minimum value) in threshold voltages Vthi of the memory transistor of the plurality of (here, approximately million) memory cells formed in the same semiconductor chip (non-volatile semiconductor storage device). Therefore, the variation in these threshold values Vthi are preferably small. If variations in threshold voltages Vthi of the memory transistor of the plurality of memory cells formed in the same semiconductor chip is large, there is a possibility of decreasing performance and reliability as the non-volatile semiconductor storage device.

From the graph of FIG. 25, it can be seen that, as the threshold voltage Vthi of the memory transistor before rewriting is decreased, variations in the threshold voltage Vthi is increased. Also as can be seen from the graph of FIG. 25, variations in the threshold voltages Vthi (values on the vertical axis on the graph of FIG. 25) can be suppressed (reduced) more in the present embodiment in which the metal-element-containing layer 17b (in FIGS. 24 and 25, the metal-element-containing layer 17b is formed of hafnium silicate) is provided with respect to the same threshold voltage Vthi than in the comparative example in which no component corresponding to the metal-element-containing layer 17b is provided (that is, in comparison between the comparative example and the present embodiment with values being at the same position on the horizontal axis in the graph of FIG. 25). In other words, in comparison by the same variations in threshold voltage Vthi (that is, in comparison between the comparative example and the present embodiment with values being at the same position on the vertical axis in the graph of FIG. 23), the threshold voltage Vthi of the memory transistor can be decreased more in the present embodiment in which the metal-element-containing layer 17b is provided than in the comparative example in which no component corresponding to the metal-element-containing layer 17b is formed.

The following is one of the reasons why the variations in the threshold voltage Vthi of the memory transistor can be decreased more in the present embodiment in which the metal-element-containing layer 17b is provided between the dielectric film 17a and the select gate electrode SG than in the comparative example in which no component corresponding to the metal-element-containing layer 17b is formed.

Figures 26, 27:
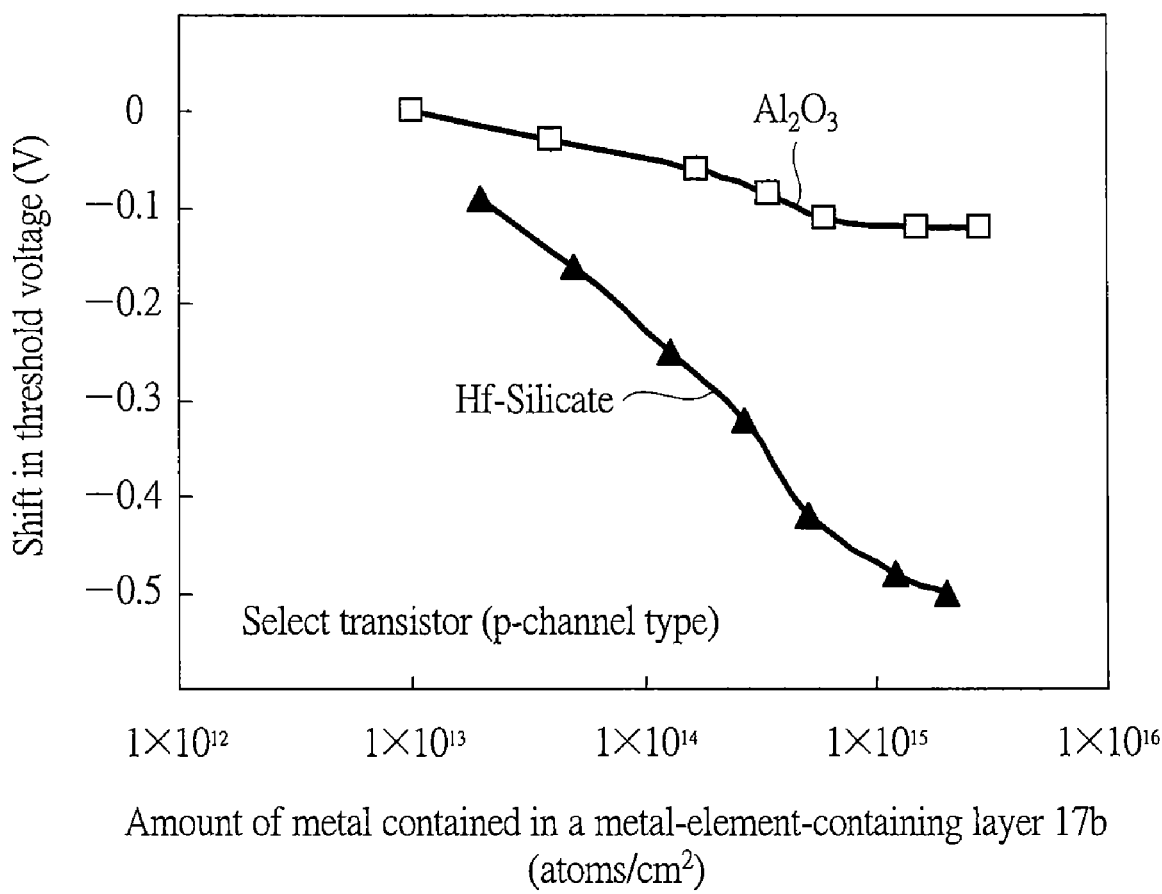
FIG. 26 shows an equation representing variation in threshold voltage caused by fluctuations of impurities.
FIG. 27 is a graph showing a relation between an amount obtained by converting an amount of metal contained in a metal-element-containing layer to surface density and an amount of shift in threshold voltage.

Variations in the threshold voltage Vthi due to impurity fluctuations can be given by an equation shown in FIG. 26, where the amount of implantation (mainly the amount of implantation in the ion implantation 6) of p-type impurities (for example, boron) into the channel region (corresponding to the semiconductor region 10b, 210b) under the memory gate electrode MG, 223 is $N_B$ and the amount of implantation (the amount of implantation in the ion implantation 18) of n-type impurities (for example, arsenic) is $N_{AS}$, according to the above-mentioned Non-Patent Document 5.

Here, q in the equation of FIG. 26 corresponds to an elementary electric charge ($1.6 \times 10^{-19}$ C), $C_{ox}$ corresponds to a capacitance density corresponding to a capacitor formed of the memory gate MG and the gate dielectric film 21, L corresponds to a gate length of the gate electrode MG, and W corresponds to a gate width of the gate electrode MG.

That is, from the equation of FIG. 26, it can be found that variations in the threshold voltage Vthi of the memory transistors are inversely proportional to a MOS capacity of the memory transistor, are inversely proportional to the square root of the area, and are proportional to the square root of the sum of impurity amounts (that is, $N_B+N_{AS}$). Since the MOS capacity and the area of the memory transistor can be regarded as to be nearly constant, variations in the threshold voltage Vthi of the memory transistors depend on the sum of impurity amounts ($N_B+N_{AS}$, that is, the sum of the density of the p-type impurities (mainly the amount of implantation in the ion implantation 6) and the density of the n-type impurities (the amount of implantation in the ion implantation 18) in the semiconductor region 10b, 210b under the memory gate electrode MG, 223). That is, as the total impurity density in the channel region (corresponding to the semiconductor region 10b, 210b) under the memory gate electrode MG, 223 (the sum of the p-type impurity density and the n-type impurity density) is larger, variations in the threshold voltage Vthi of the memory transistors are larger. As described above, when the comparative example in which no metal-element-containing layer 17b is formed and the present embodiment in which the metal-element-containing layer 17b is provided are compared with each other, if both of the threshold voltages Vthi of the memory transistors are equal to each other, the total amount of the density of the p-type impurities and the density of the n-type impurities in the channel area (corresponding to the semiconductor region 10b, 210b) under the memory gate MG, 223 (the total amount of impurities, that is, the amount corresponding to the above "$N_B+N_{AS}$") in the present embodiment is smaller than that in the comparative example. Therefore, in the present embodiment, the total amount of impurities in the channel region (semiconductor region 10b) under the memory gate electrode MG (the total amount of the density of the p-type impurities and the density of the n-type impurities, or the amount corresponding to the above "$N_B+N_{AS}$") can be decreased (reduced). Therefore, the variations of the threshold voltage Vthi of the memory transistor can be decreased (reduced). This is one of the reasons for decreasing (reducing) variations in the threshold voltage Vthi of the memory transistors by the present embodiment.

In order to increase program and erase speeds, a scheme of simultaneously rewriting (program and erase) a plurality of memory cells is used. However, when variations in the threshold voltage Vthi for each memory transistor in the semiconductor chip are large, it is required to increase the amount of electrons or the amount of holes to be injected into the dielectric film 21 so as to ensure a sufficient margin of the threshold voltage between a program state and an erase state. In this case, since the amount of hot carriers to be injected for each rewriting is increased, the damage is increased, therefore, problems such as deterioration in data holding characteristic and a decrease in tolerance for rewriting occur. For these problems, in the present embodiment, variations in the threshold voltage Vthi for each memory transistor in the semiconductor chip can be reduced, therefore, problems caused by large variations in threshold voltage Vthi as described above can be prevented from occurring, and the data holding characteristic and tolerance for rewriting can be improved. Thus, the performance of the semiconductor device with a non-volatile memory can be increased. And, the reliability of the semiconductor device with a non-volatile memory can be increased.

As described above, in the present embodiment, the select gate electrode SG made of polycrystalline silicon via the dielectric film 17 formed of the dielectric film 17a (silicon oxide or silicon oxynitride film) and the metal-element-containing layer 17b (a metal oxide or a metal silicate) is formed over the p-type well 3 (semiconductor region 10a) of the semiconductor substrate 1, and the memory gate electrode MG is formed over the p-type well 3 (semiconductor region 10a) via the dielectric film 21, which is an ONO multilayered film. With variations in threshold voltage due to Fermi level pinning of an interface between the metal-element-containing layer 17b and the select gate electrode SG, the amount of impurities doped into the semiconductor regions 10a and the semiconductor regions 10b can be decreased. Therefore, the threshold voltage of the memory transistor can be decreased, and variations in threshold voltage of the memory transistors can also be decreased. With this, the electric field applied to the dielectric film 21 is decreased, therefore, the data holding characteristic is improved. Therefore, a non-volatile semiconductor storage device excellent in data holding characteristic and capable of operating at high speed can be achieved. And, performance and reliability of the semiconductor device with a non-volatile memory can be increased.

Here, in the present embodiment, the case in which hafnium silicate or alumina is used for the metal-element-containing layer 17b has been described. Alternatively, for the metal-element-containing layer 17b, a hafnium oxide ($HfO_2$), a zirconium oxide ($ZrO_2$), other metal oxides with a dielectric characteristic, a silicate, which is a compound made of any of these metal oxides (hafnium oxide, zirconium oxide, or other metal oxides) and silicon oxide, or a compound made of a plurality of metal oxide such as hafnium oxide and alumina can be used. In any case using any of these materials for the metal-element-containing layer 17b, the threshold voltage of the select transistor can be adjusted with variations in threshold voltage due to Fermi level pinning of the interface of the polycrystalline silicon electrode (select gate electrode SG). Therefore, with a low total impurity density (sum of the p-type impurity density and the n-type impurity density) of the channel region (corresponding to the semiconductor region 10b) of the memory transistor, the threshold voltage of the memory transistor can be adjusted to be low. With this, improvement in data holding characteristic and an increase in resistance for rewriting of the non-volatile memory can be achieved.

And, although the case of the n-channel (that is, the case where the select transistor is formed of an n-channel MISFET) has been mainly described in the present embodiment, the present embodiment can be applied to the case where the metal-element-containing layer 17b is provided under the select gate electrode SG made of p-type polycrystalline silicon with a p-type channel (that is, the select transistor is formed of a p-channel MISFET). By using a metal-element-containing layer 17b similar to that of the case where the select transistor is formed of an n-channel MISFET in the case where the select transistor is formed of a p-channel MISFET, the threshold voltage of the select transistor is increased in a negative direction (here, "increasing the threshold voltage in a negative direction" means that the threshold voltage is changed from −1 V to −2 V). Therefore, even in the case where the select transistor is formed of a p-channel MISFET, as in the case where the select transistor is formed of an n-channel MISFET, by providing the metal-element-containing layer 17b between the dielectric film 17a and the select gate electrode, the threshold voltage of the select transistor is controlled. Therefore, the impurity density of the channel regions of the select transistor and the memory transistor can be decreased (suppressed), and effects similar to those in the case where the select transistor is formed of an n-channel MISFET can be obtained.

Note that, the amount of change in threshold voltage of the select transistor due to provision of the metal-element-containing layer 17b is different between the case where the select gate electrode SG is formed of a p-type polycrystalline silicon (the case where the select transistor is formed of a p-channel MISFET) and the case where the select gate electrode SG is formed of an n-type polycrystalline silicon (the case where the select transistor is formed of an n-channel MISFET). FIG. 27 is a graph showing, as with FIG. 21 described above, a relation between an amount obtained by converting the amount of metal contained in the metal-element-containing layer 17b to a surface density and the amount of shift of the threshold voltage (or the amount of shift in flat-band voltage). While FIG. 21 shows a case where the select gate electrode SG is formed of an n-type polycrystalline silicon (the select transistor is formed of an n-channel MISFET), FIG. 27 shows a case where the select gate electrode SG is formed of a p-type polycrystalline silicon (the select transistor is formed of a p-channel MISFET). And, as with FIG. 21, the dielectric film 17a is formed of a silicon oxide film in FIG. 27.

The horizontal axis on the graph of FIG. 27 corresponds to, as with FIG. 21, a value obtained by converting the amount of metal contained in the metal-element-containing layer 17b to a surface density. The vertical axis on the graph of FIG. 27 corresponds to, as with FIG. 21, the amount of change in threshold voltage (that is, the amount of change in flat-band voltage) of the select transistor due to provision of the metal-element-containing layer 17b. And, as with the value on the vertical axis on the graph of FIG. 21, the value on the vertical axis on the graph of FIG. 27 takes, as a reference value, the threshold voltage of the select transistor in the case where only the dielectric film 17a is used to configure the gate dielectric film of the select transistor without using the metal-element-containing layer 17b, and represents the amount of change in threshold voltage of the select transistor from that reference value. And, as with the graph of FIG. 21, in the graph of FIG. 27, the case where hafnium silicate made of hafnium, silicon, and oxygen is used as the metal-element-containing layer 17b (represented by black triangles in the graph of FIG. 27) and the case where alumina (aluminum oxide) is used as the metal-element-containing layer 17b (represented by white squares in the graph of FIG. 27) are represented in the graph.

As shown in the graph of FIG. 21, in the case where the select transistor is formed of an n-channel MISFET, if the surface density of the metal element forming the metal-element-containing layer 17b (corresponding to the horizontal axis on the graph of FIG. 21) is increased, the threshold voltage (or flat-band voltage) of the select transistor is shifted (changed) in a positive direction. As shown in the graph of FIG. 27, in the case where the select transistor is formed of a p-channel MISFET, if the surface density of the metal element forming the metal-element-containing layer 17b (corresponding to the horizontal axis on the graph of FIG. 27) is increased, the threshold voltage (or flat-band voltage) of the select transistor is shifted (changed) in a negative direction. Also, as shown in the graph of FIG. 27, in the case where alumina is used for the metal-element-containing layer 17b, the amount of shift in threshold voltage of the select transistor (corresponding to the vertical axis on the graph of FIG. 27) is saturated at approximately 0.15V. And, in the case where a hafnium oxide film is used for the metal-element-containing layer 17b, the value at which the amount of shift in threshold voltage of the select transistor (corresponding to the vertical axis on the graph of FIG. 27) is saturated (saturation shift amount) is extremely large, the value reaches a value equal to or larger than 0.5V. Therefore, the amount of metal of the metal-element-containing layer 17b formed between the dielectric film 17a and the select gate electrode SG (corresponding to the horizontal axis on the graph of FIGS. 21 and 27) is preferably optimized for use according to the polarity of the select transistor and the type of metal element forming the metal-element-containing layer 17b.

And, in the case where the select transistor is formed of an n-channel MISFET and the select gate electrode SG is made of n-type silicon, the threshold voltage has a positive value. With the introduction of the metal-element-containing layer 17b, the threshold voltage of the select transistor is shifted in a positive direction as shown in FIG. 21. In the case where the select transistor is formed of a p-channel MISFET and the select gate electrode SG is made of p-type silicon, the threshold voltage has a negative value. With the introduction of the metal-element-containing layer 17b, the threshold voltage of the select transistor is shifted in a negative direction as shown in FIG. 27. Therefore, both of the case in which the select transistor is n-channel type and the case in which the select transistor is p-channel type, the metal-element-containing layer 17b formed between the select gate electrode SG and the dielectric film 17a acts so as to increase an absolute value of the threshold voltage of the MISFET (select transistor) formed of the select gate electrode SG (that is, increase the threshold voltage of the select transistor). Note that, by introducing a silicon oxynitride film containing nitrogen with a high density between the select gate electrode SG made of p-type silicon and the dielectric film 17a, the threshold voltage can be shifted in a negative direction. With nitrogen of the amount equal to or smaller than $5\times10^{15}$ atoms/cm$^2$ in value obtained through conversion to the surface density, the absolute value of the threshold voltage can be adjusted between 0 to 0.5V.

And, in order to obtain the memory cell structure in FIGS. 1 and 2 according to the present embodiment, in the manufacturing process described in FIGS. 5 to 20 above, after forming the dielectric film 14, the metal-element-containing layer 15 made of a metal oxide or a metal silicate is deposited (formed) over the dielectric film 14, then, the polycrystalline silicon film 16 is formed over the dielectric film 14 over which the metal-element-containing layer 15 is deposited. Then, the polycrystalline silicon film 16 is processed to form the select gate electrode SG. With this, the gate dielectric film of the select transistor can be configured of the dielectric film 17 having a multilayered structure of the dielectric film 17a formed of the dielectric film 14 and the metal-element-containing layer 17b configured of the metal-element-containing layer 15 over the dielectric film 14 (dielectric film 17a). As another manufacturing process (manufacturing process in another form) for obtaining the memory cell structure in FIGS. 1 and 2 according to the present embodiment, a portion corresponding to the metal-element-containing layer 17b can be formed through ion implantation. The manufacturing process in this case is described with reference to FIGS. 28 to 31.

Figure 28:
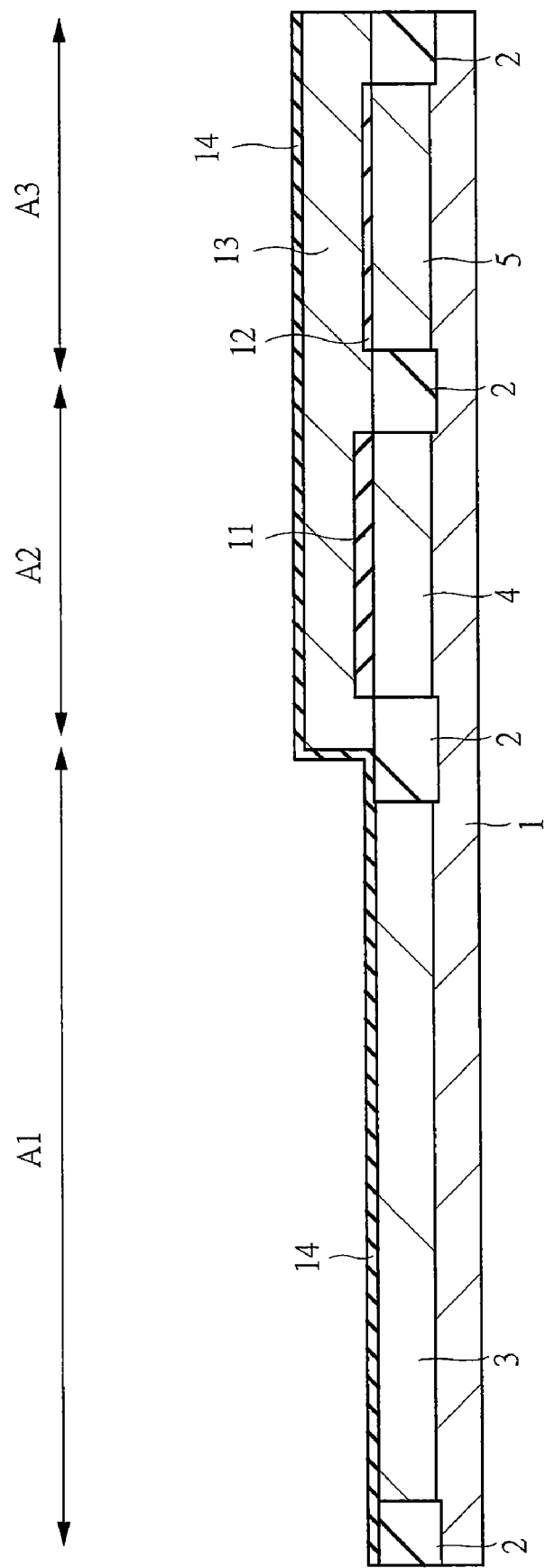
FIG. 28 is a cross-sectional diagram of main parts of the semiconductor device during manufacturing process according to another embodiment of the present invention.

FIGS. 28 to 31 are cross-sectional diagrams of main parts of the semiconductor device during manufacturing process of another form. Also in the manufacturing process described herein, processes up to the process of forming the dielectric film 14 are similar to those described with reference to FIGS. 5 to 9 above. That is, after the structure of FIG. 8 is obtained by performing processes similar to those described in FIGS. 5 to 8, the dielectric film 14 is formed in a manner similar to that described in FIG. 9, the structure shown in FIG. 28 is obtained.

Figure 29:
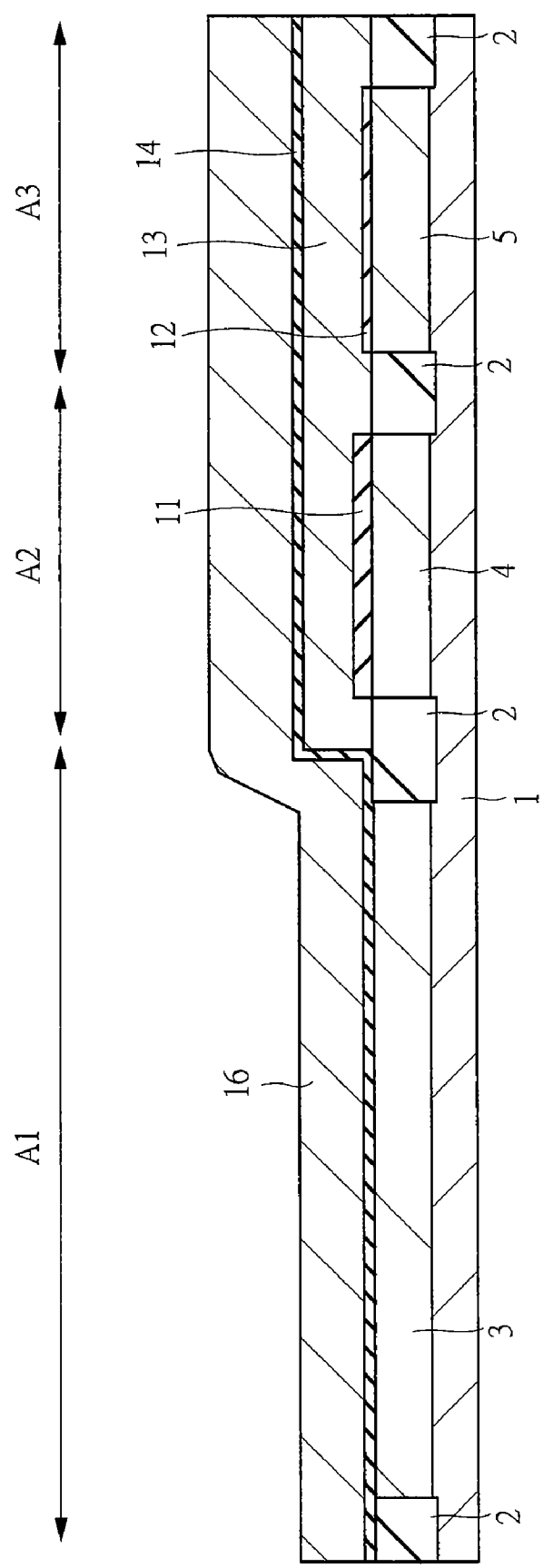
FIG. 29 is a cross-sectional diagram of the main parts of the semiconductor device during manufacturing process continued from FIG. 28.

Next, unlike the case of FIG. 9 described above, the metal-element-containing layer 15 is not formed at this stage and, as shown in FIG. 29, the polycrystalline silicon film 16 is formed over the semiconductor substrate 1 (that is, over the dielectric film 14).

Figure 30:
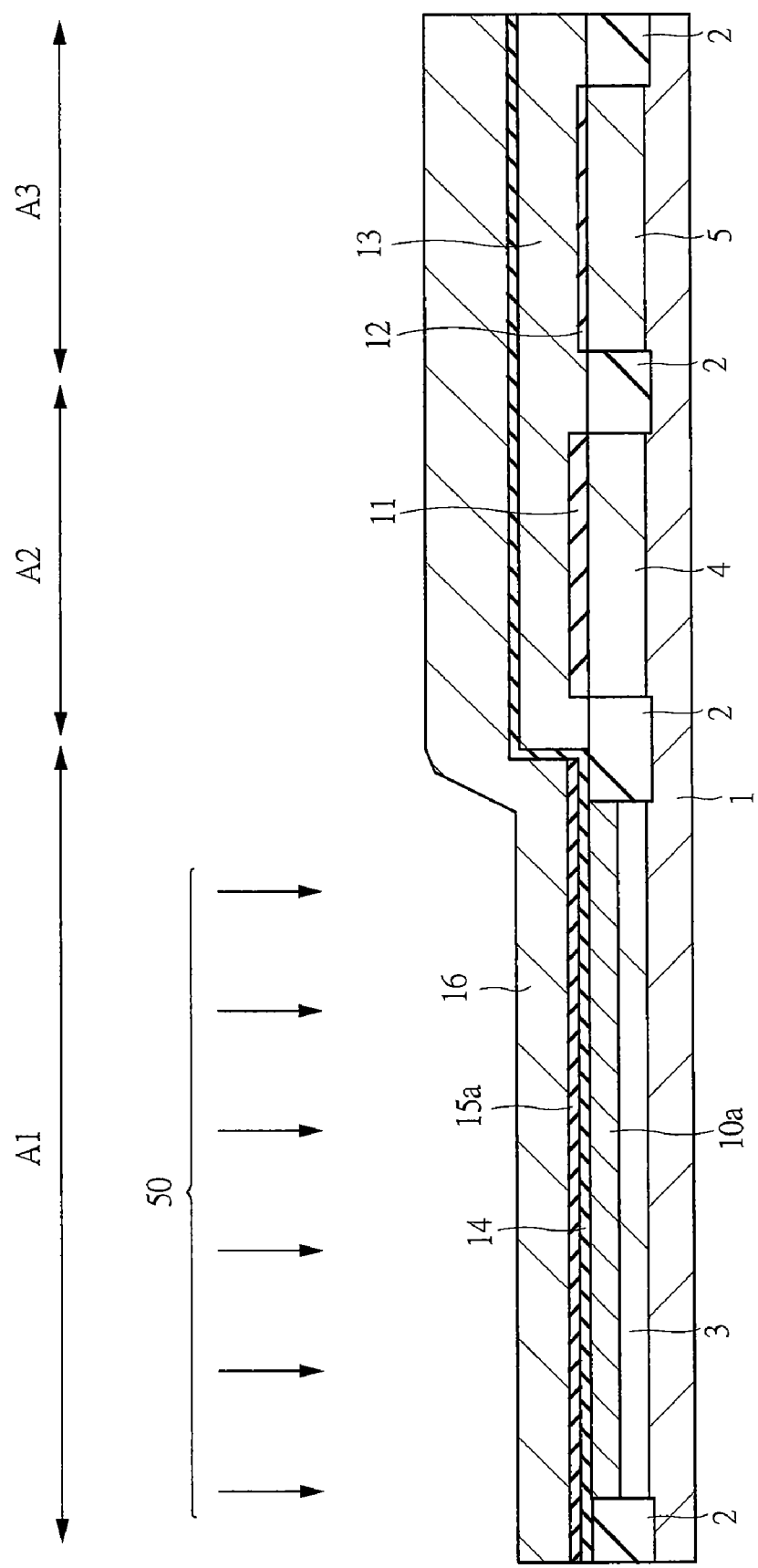
FIG. 30 is a cross-sectional diagram of the main parts of the semiconductor device during manufacturing process continued from FIG. 29.

Next, as shown in FIG. 30, an ion implantation 50 is performed to introduce a metal element into an interface (or portion near the interface) between the polycrystalline silicon film 16 and the dielectric film 14. At this time, ion-implantation energy is controlled so that distribution of the injected metal element has a peak (maximum density) near the interface between the polycrystalline silicon film 16 and the dielectric film 14. With this, the state in which the metal element is restrictively introduced (localized) near the interface between the polycrystalline silicon film 16 and the dielectric film 14 can be formed, and the metal-element-containing layer 15a with the metal element being introduced (to the interface) between the polycrystalline silicon film 16 and the dielectric film 14 is formed. The metal-element-containing layer 15a is a portion corresponding to the metal-element-containing layer 15. The metal element introduced in the ion implantation 50 is preferably hafnium (Hf), zirconium (Zr), or aluminum (Al). Note that, since the metal element is introduced to the interface between the polycrystalline silicon film 16 and the dielectric film 14 in the memory cell portion A1, it is more preferable to perform the ion implantation 50 with the memory periphery circuit portions (the high-voltage element portion A2 and the normal element portion A3) being covered with a photoresist pattern (not shown) as an ion-implantation inhibiting mask.

Figure 31:
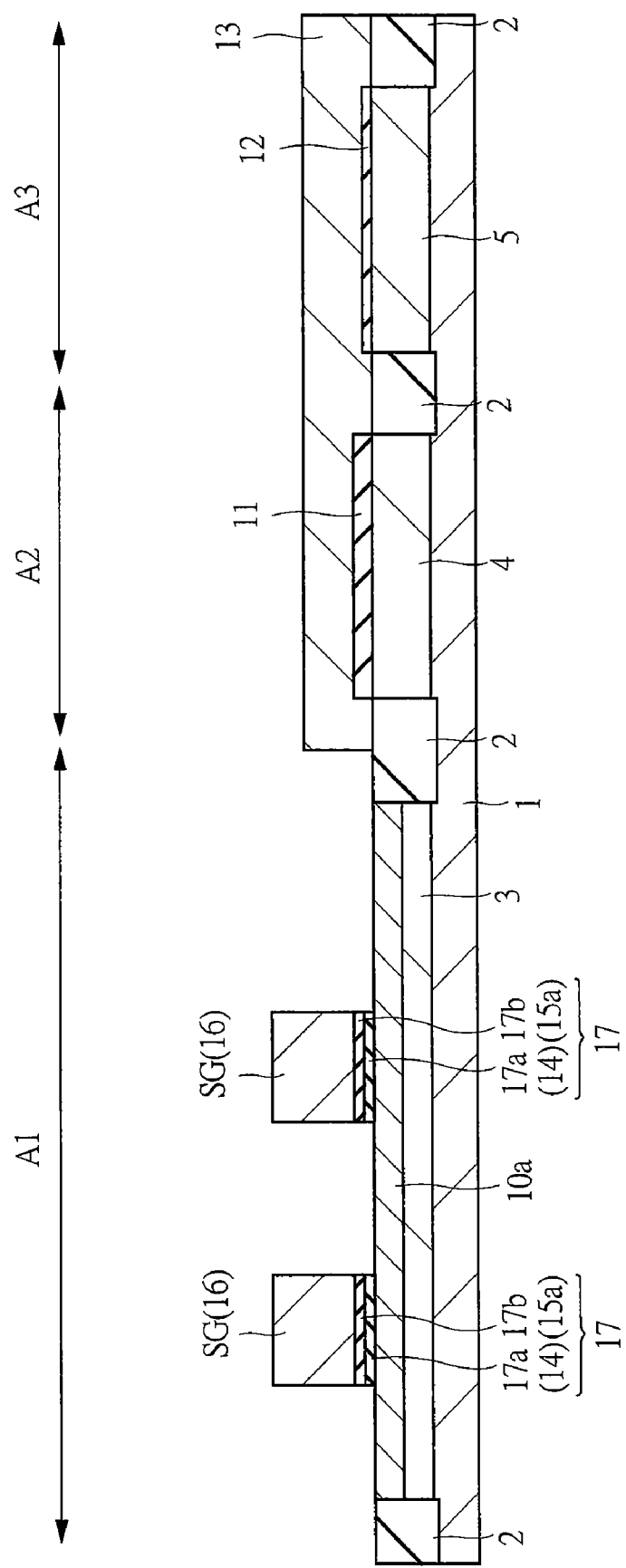
FIG. 31 is a cross-sectional diagram of the main parts of the semiconductor device during manufacturing process continued from FIG. 30.

Then, in a manner similar to that described in FIG. 11, as shown in FIG. 31, the polycrystalline silicon film 16 is selectively etched (removed) by using, for example, photolithography method and dry etching method, to form the select gate electrode SG composed of the patterned polycrystalline silicon film 16.

The dielectric film 14 left under the select gate electrode SG and the metal-element-containing layer 15a (at the interface) between the dielectric film 14 and the select gate electrode SG become the dielectric film (gate dielectric film) 17 positioned between the select gate electrode SG and the channel region and functioning as a gate dielectric film of the select transistor. Therefore, the dielectric film 17, which is a gate dielectric film of the select transistor, has a multilayered structure including the dielectric film 17a formed of the dielectric film 14 made of silicon oxide or silicon oxynitride and the metal-element-containing layer 17b formed of the metal-element-containing layer 15a (at the interface) between the dielectric film 14 (dielectric film 17a) and the select gate electrode SG.

Processes after forming the select gate electrode SG are similar to those described with reference to FIGS. 11 to 20, therefore, explanation thereof is omitted.

Also in the case where the processes in FIGS. 28 to 31 are used to manufacture a semiconductor device (memory cell), as described above with reference to FIG. 21 and FIG. 27, the threshold voltage of the select transistor (flat-band voltage of the select gate electrode SG) can be controlled by the mount of metal of the metal-element-containing layer 17b. That is, by adjusting the amount of metal element (dose amount) introduced in the ion implantation 50, the values on the horizontal axis in FIGS. 21 and 27 (the mount of metal of the metal-element-containing layer 17b) can be controlled. Therefore, by the ion implantation 50, the metal-element-containing layer 17b can be provided at the interface between the dielectric film 17a and the select gate electrode SG, therefore, the threshold voltage of the select transistor can be increased. Thus, the impurity density of the channel region (semiconductor region 10a) of the select transistor can be decreased as described above. Also, the total amount of impurities in the channel region (semiconductor region 10b) of the memory transistor can be decreased. With this, the data holding characteristic can be improved. Furthermore, variations in threshold voltage of the memory transistors can be decreased.

Still further, by using ion implantation to form a component corresponding to the metal-element-containing layer 17b, the metal element can be introduced only to the limited region where the threshold voltage is desired to be changed with its metal type or amount being changed. That is, the ion implantation 50 can be selectively performed in part of the memory cell portion A1 using the ion-implantation inhibiting mask. Therefore, it is possible to divide the memory cell portion A1 into a plurality of sections, and to change the type and the amount of metal element introduced to the interface between the dielectric film 17a and the select gate electrode SG for each section as required.

Figure 32:
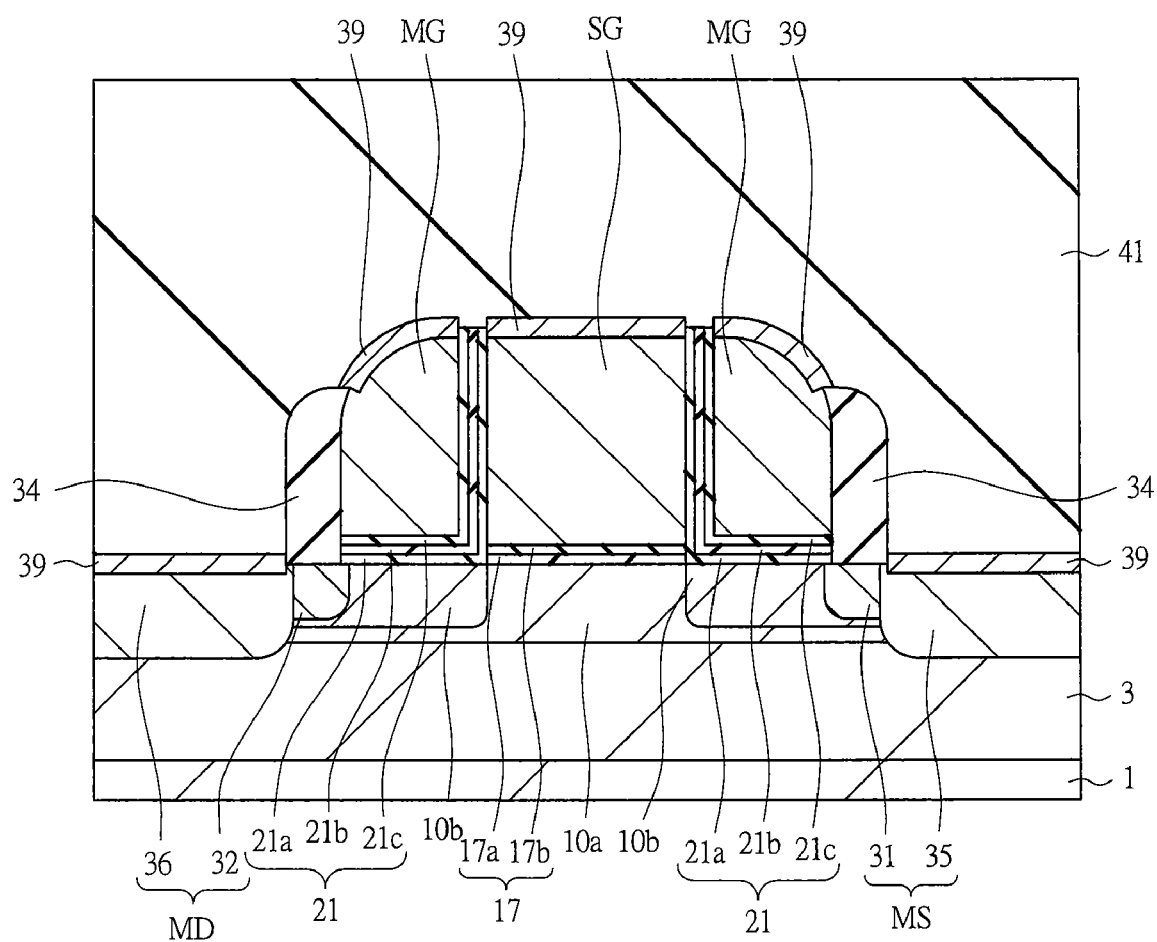
FIG. 32 is a cross-sectional diagram of main parts of the semiconductor device according to another embodiment of the present invention.

Still further, in the present embodiment, the case in which one memory cell is formed from one select transistor and one memory transistor has been described. Alternatively, it is possible to form a memory cell formed from one select transistor and two memory transistors by eliminating the process of removing the polycrystalline silicon spacer 23 on one side of the select gate electrode SG in FIG. 15 and forming the memory gate electrode MG over both side walls of the select gate electrode SG via the dielectric film 21. In the case of such a memory cell, two bits of information can be stored in one memory cell. FIG. 32 shows a structure of the memory cell formed in this method. In FIG. 32 corresponding to FIG. 1 described above, the memory gate electrode MG is formed over both side walls of the select gate electrode SG via the dielectric film 21. Also in the case of a memory cell as in FIG. 32, as with the memory cell in FIGS. 1 and 2, by providing the metal-element-containing layer 17b between the dielectric film 17a and the select gate electrode SG, the threshold voltage of the select transistor is increased. With this, the impurity density of the channel region (semiconductor region 10b) under the select gate electrode SG can be decreased. Furthermore, the total amount of impurities in the channel region (semiconductor region 10b) under the memory gate electrode MG can be decreased. Also in the case of a memory cell as in FIG. 32, as with the memory cell in FIGS. 1 and 2, improvement in data holding characteristic, improvement in tolerance for rewriting, reduction in variations in threshold voltage of the memory transistor, and others can be achieved.

Second Embodiment

In the first embodiment described above, the dielectric film 17 having a multilayered structure of the dielectric film 17a and the metal-element-containing layer 17b is used as the gate dielectric film of the select transistor in the memory cell portion A1. However, in the memory periphery circuit portions (high-voltage element portion A2 and the normal element portion A3), a single silicon oxide film is used for the gate dielectric film of the MISFET. By contrast, in a second embodiment, not only for the gate dielectric film of the select transistor in the memory cell portion A1 but also for the gate dielectric film of the MISFET in the element portion A3 of the memory periphery circuit portions, a dielectric film similar to the gate dielectric film of the select transistor in the memory cell portion A1 (dielectric film 17 having a multilayered structure of the dielectric film 17a and the metal-element-containing layer 17b) is used. Therefore, in a semiconductor device according to the present embodiment, the structures of the memory cell portion A1 and the high-voltage element portion A2 of the memory periphery circuit portions are similar to those according to the first embodiment, but the structure of the element portion A3 of the memory periphery circuit portions is different from that according to the first embodiment. Therefore, in a manufacturing process described below, a description is made with reference to FIGS. 33 to 40 mainly on parts different from those according to the first embodiment.

FIGS. 33 to 40 are cross-sectional diagrams of main parts of the semiconductor device during manufacturing process according to the present embodiment. Processes up to those depicted in FIG. 6 are similar to those according to the first embodiment, and therefore are not described herein. Processes following those in FIG. 6 will be described.

Figure 33:
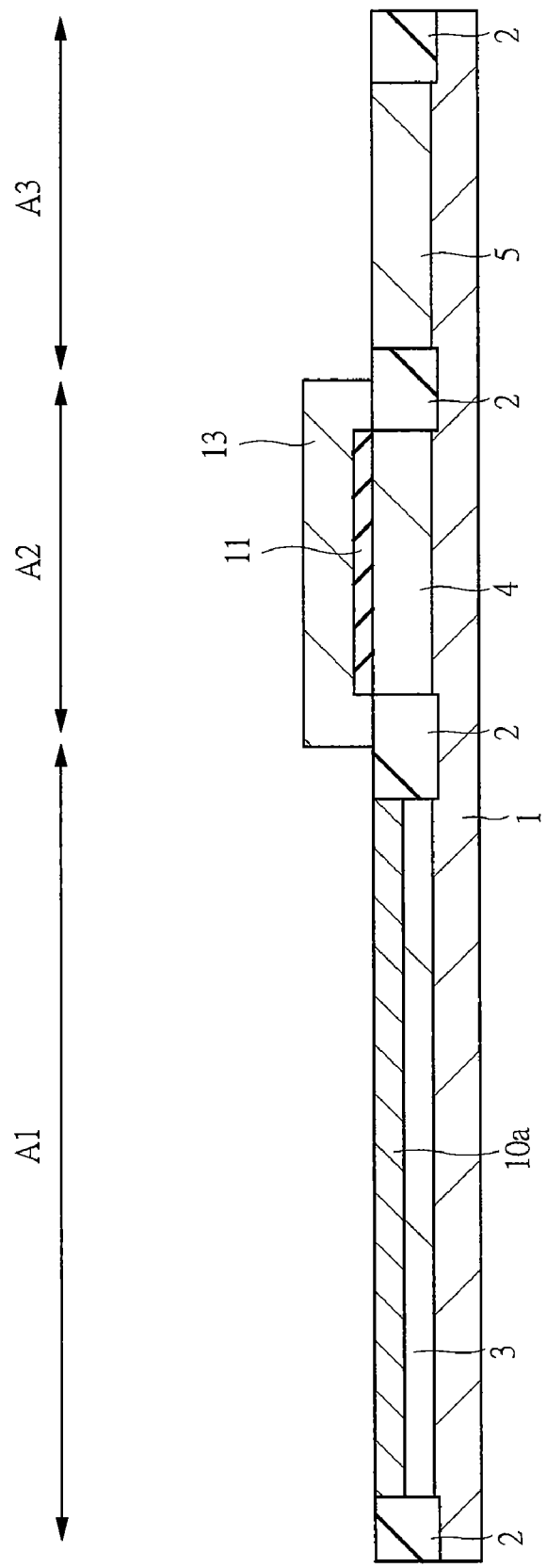
FIG. 33 is a cross-sectional diagram of main parts of the semiconductor device during manufacturing process according to another embodiment of the present invention.

As with the first embodiment, after the structure in FIG. 6 is obtained, as shown in FIG. 33, the thick gate dielectric film 11 required in the high-voltage element portion A2 is formed through oxidation (thermal oxidation) or the like. Then, over the semiconductor substrate 1 (that is, the gate dielectric film 11), the polycrystalline silicon film 13 having a thickness on the order of, for example, 150 nm is deposited through CVD method, for example. Then, by using photolithography method, dry etching method and the like, the polycrystalline silicon film 13 and the gate dielectric film 11 in the memory cell portion A1 and the element portion A3 are removed. With this, the state becomes such that the gate dielectric film 11 and the polycrystalline silicon film 13 are formed only in the high-voltage element portion A2.

Figure 34:
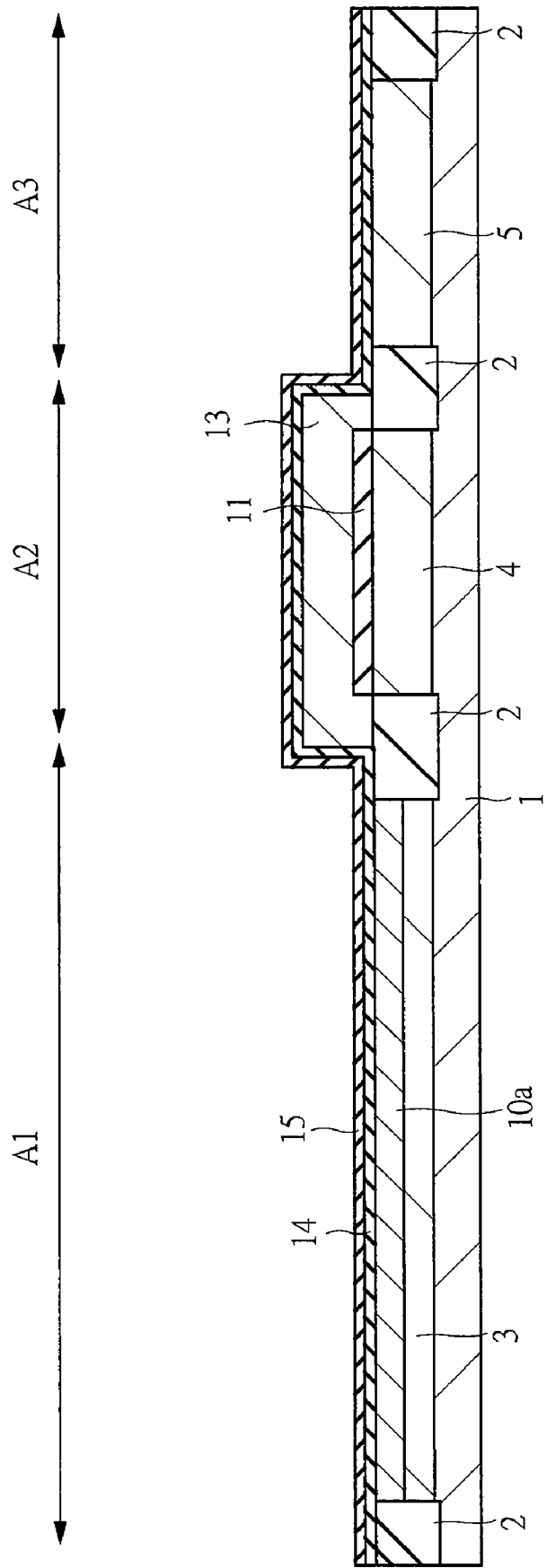
FIG. 34 is a cross-sectional diagram of the main parts of the semiconductor device during manufacturing process continued from FIG. 33.

Next, after a natural oxide film over the surface of the semiconductor substrate 1 is removed by cleaning with dilute hydrofluoric acid or the like, oxidation (thermal oxidation) is performed to form the dielectric film (silicon oxide film) 14, as shown in FIG. 34. Oxidation is performed under oxidation conditions (conditions for forming the dielectric film 14 formed of a silicon oxide film) in which, for example, a silicon oxide film (dielectric film 14) having a thickness on the order of 1 to 3 nm is formed over the semiconductor substrate 1. With this, the dielectric film 14 formed of a silicon oxide film having a thickness of, for example, 2 nm, is formed over the semiconductor substrate 1 of the memory cell portion A1 and the element portion A3 of the periphery circuit portions (the surface of the p-type wells 3 and 5). At this time, the oxide film (dielectric film 14 formed of a silicon oxide film) grows also over the polycrystalline silicon film 13. Note that, as the dielectric film 14, a silicon oxynitride film can be formed in place of the silicon oxide film. Therefore, in the present embodiment, as with the first embodiment described above, the dielectric film 14 is formed of a silicon oxide film or a silicon oxynitride film.

Next, the metal-element-containing layer 15 is formed over the dielectric film 14. For example, the metal-element-containing layer 15 can be formed by, as with the first embodiment, depositing a metal oxide (metal oxide film) or a metal silicate (metal silicate film) over the dielectric film 14 by CVD method, such as MOCVD or ALCVD. The material forming the metal-element-containing layer 15 is similar to that according to the first embodiment (a metal oxide or a metal silicate), therefore, is not described herein.

And, the threshold voltage of each transistor (a select transistor in the memory cell portion A1 or a MISFET in the element portion A3) can be adjusted with the amount of metal element contained in the metal-element-containing layer 15 and the impurity density of the channel region (corresponding to the semiconductor region 10a) under the select gate electrode of the memory cell formed over the memory cell portion A1, or the impurity density of the channel regions of the n-type and p-type MISFETS formed in the element portion A3. For example, the select gate transistor can be set to have a current value of $10^{-9}$ A/μm in an OFF state where the voltage to be applied to the select gate electrode is zero. Also, as shown in FIGS. 21 and 27, the amount of shift of the threshold voltage (flat-band voltage) is varied depending on the material of the metal-element-containing layer 17b (15) and the gate electrode. For example, in the case where hafnium silicate is used as the material of the metal-element-containing layer 17b (15), if the amount of metal in the metal-element-containing layer 17b is larger than $5\times10^{14}$ atoms/cm$^2$, the amount of shift in threshold voltage of the p-channel MISFET in the element portion A3 (using a voltage in the case where the metal-element-containing layer 17b is not formed over the gate dielectric film of the MISFET as a reference value, the amount of change from the reference value of the threshold voltage when the metal-element-containing layer 17b is provided) is equal to or larger than 0.5V, therefore, a problem in which it is difficult to adjust the threshold voltage and suppress short-channel effect with the impurity density of the channel region. And, in the case where alumina is used as the material of the metal-element-containing layer 17b (15), if the amount of metal in the metal-element-containing layer 17b is too large, there is a problem in which the amount of shift in threshold voltage of the n-channel MISFET in the element portion A3 (using a voltage in the case where the metal-element-containing layer 17b is not formed over the gate dielectric film of the MISFET as a reference value, the amount of change from the reference value of the threshold voltage when the metal-element-containing layer 17b is provided) is too large. Therefore, in the present embodiment in which the metal-element-containing layer 17b (15) is applied to both of the memory cell portion A1 and the element portion A3, the amount of metal contained in the metal-element-containing layer 17b (15) is preferably equal to or smaller than $5\times10^{14}$ atoms/cm$^2$ in surface density.

After depositing the metal-element-containing layer 15, nitrogen may be introduced into the metal-element-containing layer 15 by plasma nitriding, heat treatment in an atmosphere of ammonia or the like. Thereafter, superfluous nitrogen can be vaporized as required by heat treatment at relatively high temperature in dilute oxygen.

Figure 35:
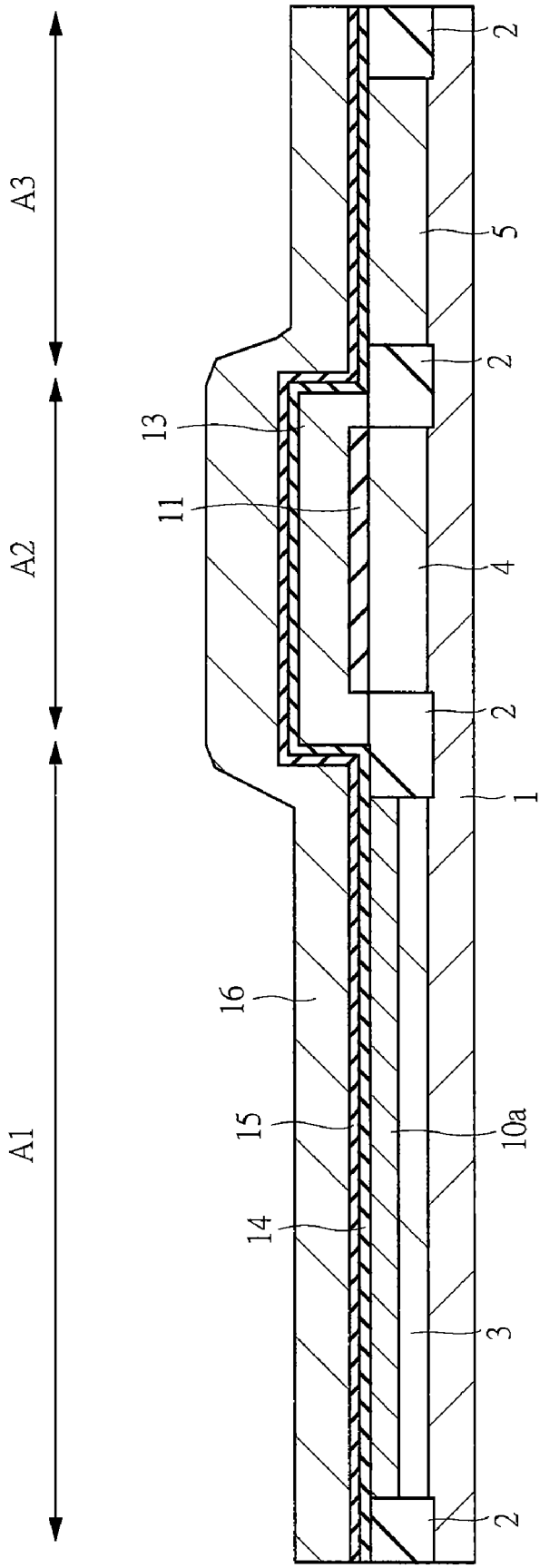
FIG. 35 is a cross-sectional diagram of the main parts of the semiconductor device during manufacturing process continued from FIG. 34.

Next, as shown in FIG. 35, the polycrystalline silicon film 16 having a thickness on the order of, for example, 150 nm, is deposited over the semiconductor substrate 1 by using, for example, CVD method. Then, in a formation planned region for forming an n-channel MISFET in the memory cell portion A1 and the element portion A3, n-type impurities, for example phosphorus (P), is doped into the polycrystalline silicon film 16 with high density. On the other hand, in a formation planned region for forming a p-channel MISFET in the memory cell portion A3, p-type impurities, for example boron (B), is doped into the polycrystalline silicon film 16 with high density. Then, heat treatment is performed for activation.

Figure 36:
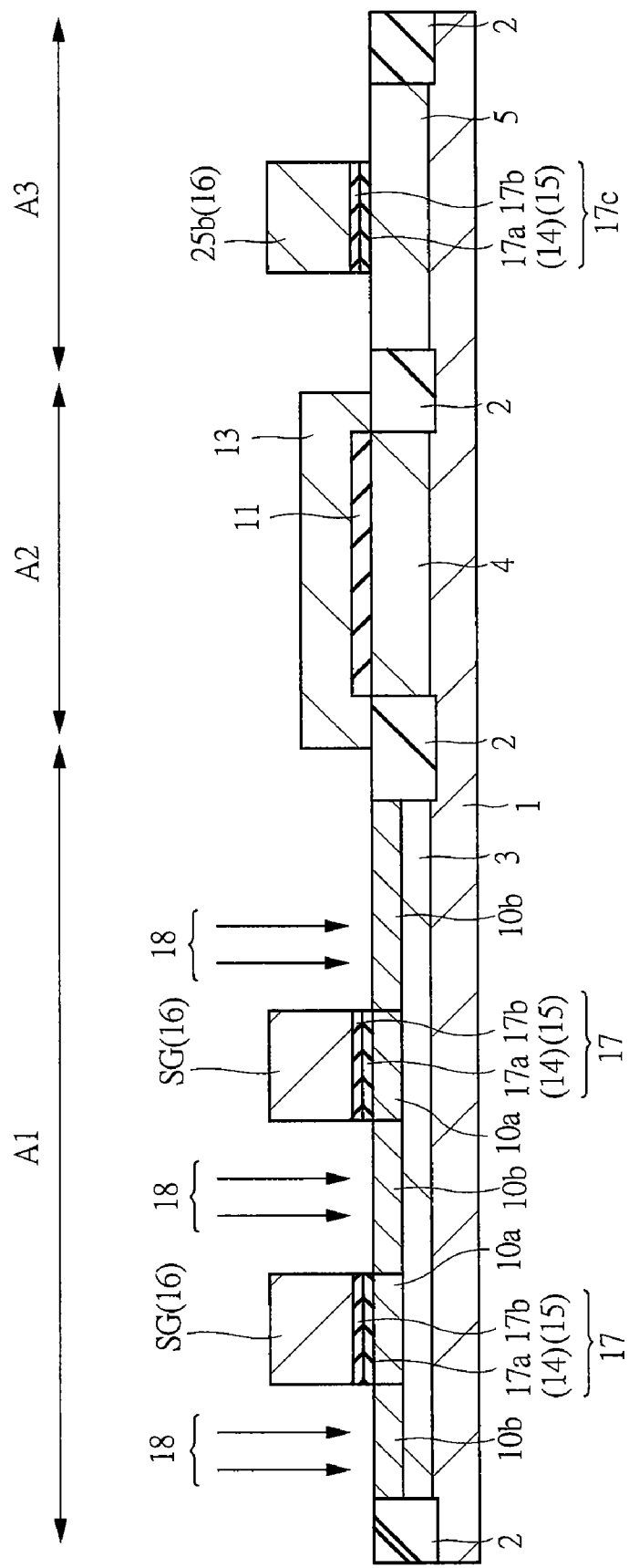
FIG. 36 is a cross-sectional diagram of the main parts of the semiconductor device during manufacturing process continued from FIG. 35.

Next, as shown in FIG. 36, the polycrystalline silicon film 16 is selectively etched (that is, patterned) by using photolithography method and dry etching method to form the select gate electrode SG of the memory cell portion A1 and the gate electrode 25b of the element portion A3 formed of the patterned polycrystalline silicon film 16. With this, in the memory cell portion A1, a formation planned region for the memory gate electrode MG formed later is exposed.

In the memory cell portion A1, the dielectric film 14 and the metal-element-containing layer 15 left under the select gate electrode SG become the dielectric film (gate dielectric film) 17 positioned between the select gate electrode SG and the channel region and functioning as a gate dielectric film of the select transistor. Therefore, the dielectric film 17, which is a gate dielectric film of the select transistor, has a multilayered structure of the dielectric film 17a formed of the dielectric film 14 and the metal-element-containing layer 17b formed of the metal-element-containing layer 15 over the dielectric film 14 (17a). On the other hand, in the element portion A3 of the memory periphery circuit portions, the dielectric film 14 and the metal-element-containing layer 15 left under the select gate electrode 25b become the dielectric film (gate dielectric film) 17c positioned between the gate electrode 25b and the channel region and functioning as a gate dielectric film of the MISFET of the element portion A3. Therefore, the gate dielectric film of the MISFET of the element portion A3 in the memory periphery circuit portion is formed of the dielectric film 17c having a structure similar to that of the gate dielectric film of the select transistor in the memory cell portion A1 with the same processes. The dielectric film 17c has a multilayered structure of the dielectric film 17a formed of the dielectric film 14 and the metal-element-containing layer 17b formed of the metal-element-containing layer 15 over the dielectric film 14 (17a). Since the dielectric film 14 is formed of a silicon oxide film or a silicon oxynitride film, in the dielectric films 17 and 17c, the dielectric film 17b is formed of a silicon oxide film or a silicon oxynitride film.

Next, the high-voltage element portion A2 and the element portion A3 of the memory periphery circuit portions are covered with a photoresist pattern (not shown). Then, in the memory cell portion A1, the ion implantation 18 of impurities is performed using the select gate electrode SG as an ion-implantation inhibiting mask. As the impurities to be implanted through the ion implantation 18, n-type impurities (for example, arsenic or phosphorus) can be selected as required. By this ion implantation 18, in the memory cell portion A1, the impurities are ion-implanted into a region not covered with the select gate electrode SG. With this, the semiconductor region 10b in which impurities are implanted by the ion implantation 18 is formed in the region of (the semiconductor region 10a in) the p-type well 3 not covered with the select gate electrode SG.

With the impurities introduced in the ion implantation 18 and the impurities introduced in the ion implantation 6, the impurity density (charge density of the impurities) of the region (channel region) under the memory gate electrode MG to be formed later is adjusted. Also in the present embodiment, as with the first embodiment, by providing the metal-element-containing layer 17b to the select transistor in the memory cell portion A1, the amount (dope amount) of impurities introduced in the ion implantation 6 can be decreased, compared with the case where the metal-element-containing layer 17b is not provided. Therefore, the amount of implantation (dose amount) in the ion implantation 18 required for decreasing the threshold voltage of the memory transistor can be decreased. Furthermore, in the element portion A3 of the memory periphery circuit portions, by providing the metal-element-containing layer 17b to the gate dielectric film of the MISFET, an absolute value of the threshold value of the MISFET in the element portion A3 of the memory periphery circuit portions is increased, therefore, the impurity density (amount of impurities introduced in the ion implantation 8) of the channel region in the element portion A3 of the memory periphery circuit portions can be decreased. Note that, in the element portion A3 of the memory periphery circuit portions, in the process of the ion implantation 8, different impurities are ion-implanted between a formation planned region for forming an n-channel MISFET and a formation planned region for forming a p-channel MISFET.

Figure 37:
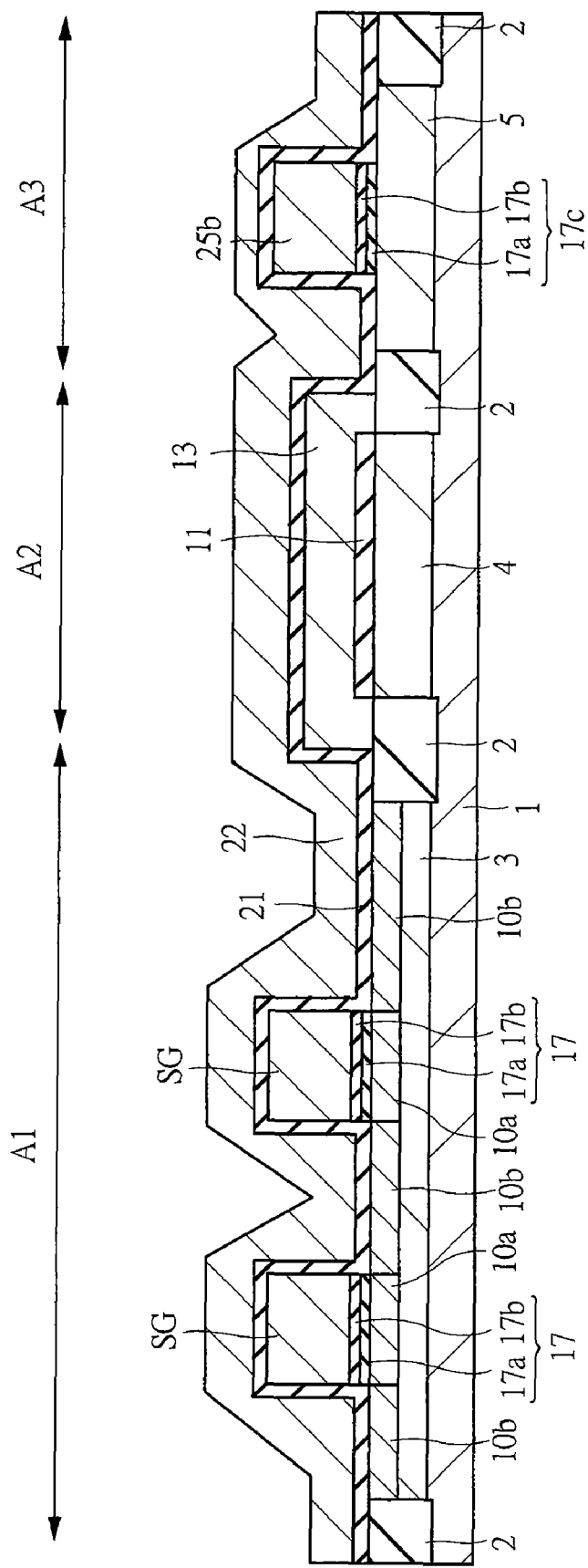
FIG. 37 is a cross-sectional diagram of the main parts of the semiconductor device during manufacturing process continued from FIG. 36.

Next, with the same scheme as that of the first embodiment, as shown in FIG. 37, the dielectric film 21 is formed over the semiconductor substrate 1. As with the first embodiment, the dielectric film 21 is formed of a multilayered film of the silicon oxide film 21a, the silicon nitride film 21b, and the silicon oxide film 21c. However, in FIG. 37 and thereafter, it is illustrated simply as the dielectric film 21 for easy viewing.

Next, the polycrystalline silicon film 22 doped with phosphorus (P) or the like is deposited over the entire main surface of the semiconductor substrate 1 (that is, over the dielectric film 21) by CVD method or the like. The deposition film thickness of the polycrystalline silicon film 22 is on the order of, for example, 100 nm.

Figure 38:
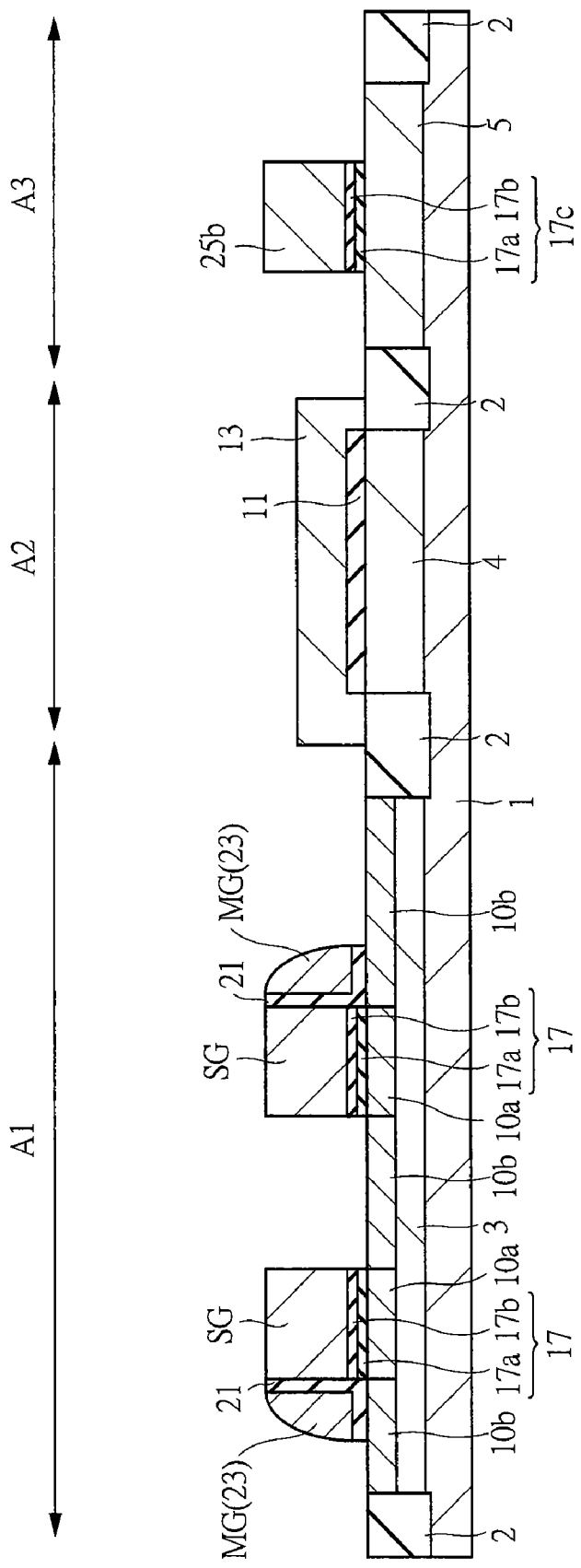
FIG. 38 is a cross-sectional diagram of the main parts of the semiconductor device during manufacturing process continued from FIG. 37.

Next, as shown in FIG. 38, by etching (dry etching, anisotropic etching, or etching back) the polycrystalline silicon film 22 for the deposition film thickness (on the order of 100 nm), polycrystalline silicon spacers 23, which become the memory gate electrode MG later, over the side surfaces of the select gate electrode SG and the multilayered structure of the dielectric film 17. Then, the polycrystalline silicon spacer 23, the dielectric film 21, and the like on one side of the select gate electrode SG are removed by photolithography method and dry etching method or the like. With this, the structure in FIG. 38 can be obtained. The polycrystalline silicon spacer 23 left adjacently to the other side of the select gate electrode SG via the dielectric film 21 becomes the memory gate electrode MG.

Figure 39:
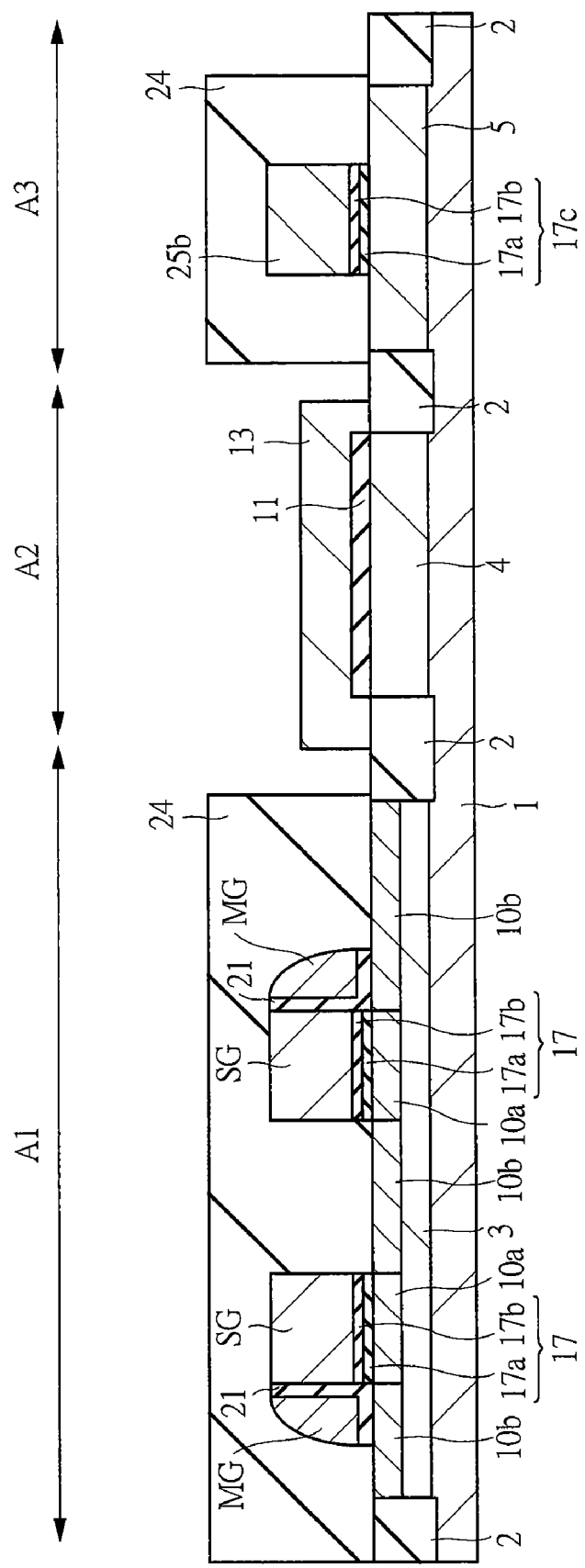
FIG. 39 is a cross-sectional diagram of the main parts of the semiconductor device during manufacturing process continued from FIG. 38.

Next, as shown in FIG. 39, the silicon oxide film 24 is deposited over the entire main surface of the semiconductor substrate 1 by, for example, CVD method. Then, by using, for example, photolithography method and dry etching method or the like, the silicon oxide film 24 other than that over the memory cell portion A1 and the element portion A3 of the memory periphery circuit portions is removed to expose the surface of the polycrystalline silicon film 13 in the high-voltage element portion A2. The memory cell portion A1 and the element portion A3 are now in the state of being covered with the silicon oxide film 24.

Next, n-type impurities are doped into the polycrystalline silicon film 13 of a formation planned region for an n-channel MISFET of the high-voltage element portion A2. Also, p-type impurities are doped into the polycrystalline silicon film 13 of a formation planned region for a p-channel MISFET (not shown). Then, after heat treatment for activation is performed, as shown in FIG. 40, the polycrystalline silicon film 13 is patterned by using, for example, photolithography method and dry etching method or the like, to form the gate electrode 25a of a MISFET formed in the high-voltage element A2.

Next, with the high-voltage element portion A2 being covered (masked) with a photoresist pattern (not shown) formed by photolithography method, the silicon oxide film 24 protecting the memory cell portion A1 and the element portion A3 is removed.

Processes thereafter are similar to those in the first embodiment. That is, as shown in FIG. 40, the n$^-$-type semiconductor regions 31, 32, and 33 are formed, the side-wall dielectric film 34 is formed, the n$^+$-type semiconductor regions 35, 36, and 37 are formed, and the metal silicide layer 39 is formed. Furthermore, as with the first embodiment, the interlayer dielectric film 41, the contact hole 42, the plug 43, the wiring opening 45, the wiring 46, and others are formed, which are not illustrated or described herein.

Figure 40:
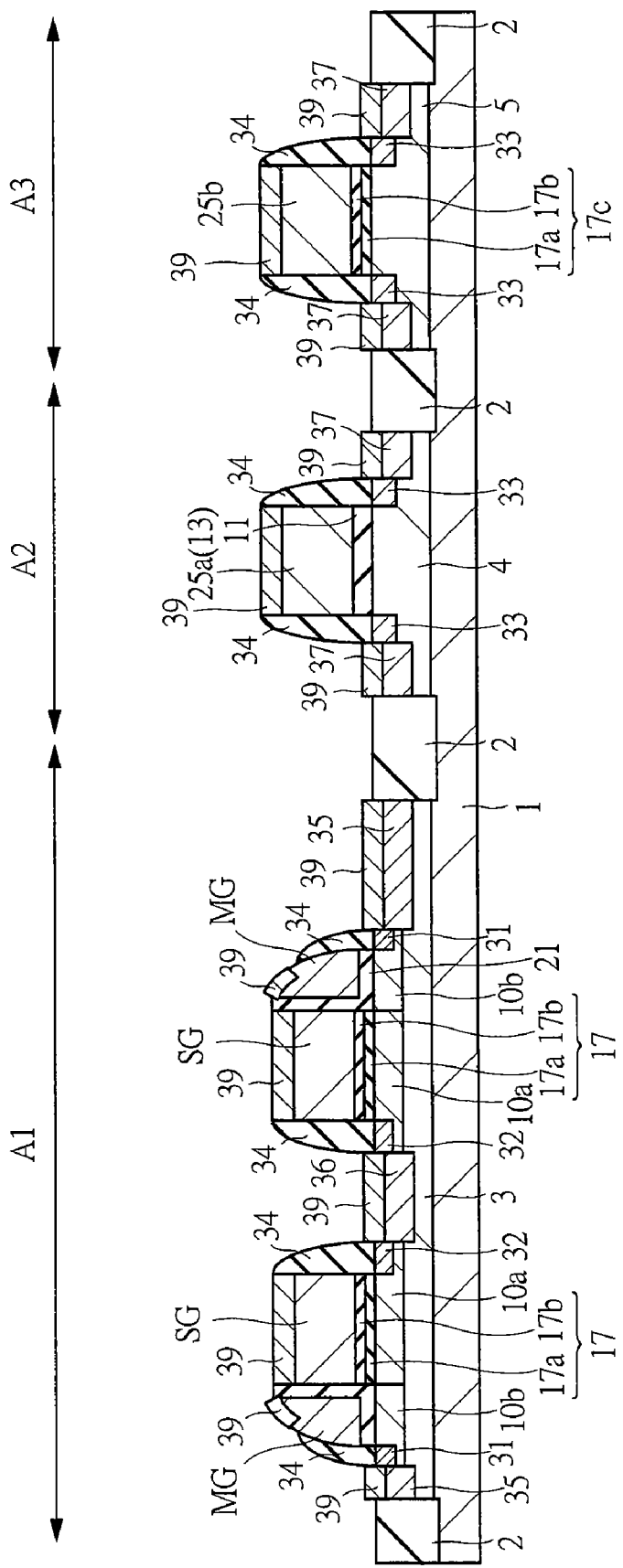
FIG. 40 is a cross-sectional diagram of the main parts of the semiconductor device during manufacturing process continued from FIG. 39.

In this manner, as shown in FIG. 40, a semiconductor device (non-volatile semiconductor storage device) in which the dielectric films 17 and 17c having a multilayered structure of the dielectric film 17a and the metal-element-containing layer 17b are used for the gate dielectric film of the select transistor in the memory cell portion A1 and the MISFET in the element portion A3 of the memory periphery circuit portion is manufactured.

In the semiconductor device according to the present embodiment, as with the semiconductor device according to the first embodiment, in the select transistor in the memory cell portion A1, the metal-element-containing layer 17b made of a metal oxide or a metal silicate is provided (at an interface) between the dielectric film 17a and the select gate electrode SG. Furthermore, in the semiconductor device according to the present embodiment, in the MISFET in the element portion A3 of the memory periphery circuit portion, the metal-element-containing layer 17b made of a metal oxide or a metal silicate is provided (at an interface) between the dielectric film 17a and the gate electrode 25b.

Therefore, the semiconductor device (non-volatile semiconductor storage device) according to the present embodiment has a feature not only of achieving improvement in memory characteristic, such as data holding characteristic and tolerance for rewriting of the memory cell of the memory cell portion A1 described in the first embodiment, but also of achieving a speed-up of the element portion A3 of the memory periphery circuit portion.

In the present embodiment, by providing the metal-element-containing layer 17b between the dielectric film 17a and the select gate electrode SG in the memory cell A1, and providing the metal-element-containing layer 17b between the dielectric film 17a and the gate electrode 25b in the element portion A3, the threshold voltage of the select transistor in the memory cell portion A1 and the threshold voltage of the MISFET (MISFET formed of the gate electrode 25b) in the element portion A3 can be controlled (increased). Therefore, the impurity density of the channel region (semiconductor region 10a) of the select transistor (under the select gate electrode SG) in the memory cell portion A1 and the channel region of the transistor (under the gate electrode 25) in the element portion A3 of the memory periphery circuit portion can be decreased. Thus, Coulomb scattering of carriers caused by impurity ions is decreased, therefore, the mobility of the channel is significantly increased. With this, the select transistor in the memory cell A1 and the MISFET (transistor) in the element portion A3 can be sped up simultaneously. Furthermore, the mobility of the channel region (semiconductor region 10b) of the memory transistor (under the memory gate electrode MG) in the memory cell portion A1 is determined by the total amount of impurity ions implanted thereinto (the sum of impurity amounts implanted by the ion implantation 6 and the ion implantation 18). According to the present embodiment, as with the first embodiment, the total amount of impurity ions in the channel region (semiconductor region 10b) of the memory transistor in the memory cell portion A1 can be decreased, the mobility of the memory transistor is increased and can be sped up. In this manner, according to the present embodiment, the select transistor and the memory transistor in the memory cell portion A1 and further the MISFET (transistor) in the element portion A3 of the periphery circuit portion can be sped up together. Therefore, performance of the semiconductor device with a non-volatile memory can be increased. Also, reliability of the semiconductor device with a non-volatile memory can be increased.

Thus, according to the present embodiment, in addition to improvement in data holding characteristic and an increase of tolerance for rewriting described in the first embodiment, speed-up of the transistor in the memory periphery circuit portion can also be achieved.

Note that, in the present embodiment, it is needless to say that, as with the first embodiment, hafnium silicate or alumina can be used for the metal-element-containing layer 17b, furthermore, a hafnium oxide (HfO$_2$), a zirconium oxide (ZrO$_2$), and their metal oxides with a dielectric characteristic, or, a silicate, which is a compound made of any of these metal oxides (hafnium oxide, zirconium oxide, or other metal oxides) and silicon oxide, or a compound made of a plurality of metal oxide such as a hafnium oxide and alumina can be used for the metal-element-containing layer 17b. In any case of using any of these materials for the metal-element-containing layer 17b, the threshold voltage of the select transistor in the memory cell portion A1 and the transistor (MISFET) in the element portion A3 of the memory periphery circuit portion can be adjusted with variation in threshold voltage caused by Fermi level pinning of the interface of the polycrystalline silicon electrode (select gate electrode SG). With this, the performance of both transistors can be improved. Note that, in the present embodiment, since threshold voltage adjustment on both of the p-channel MISFET and the n-channel MISFET in the element portions A3 of the memory periphery circuit portion is required, the surface density of the metal element forming the metal-element-containing layer 17b in the dielectric films 17 and 17c (that is, the amount of metal of the metal-element-containing layer 17b in the dielectric films 17 and 17c) is preferably equal to or lower than $1 \times 10^{15}$ atoms/cm².

Furthermore, in the present embodiment, the method in which the metal-element-containing layer 15 is deposited over the dielectric film 14 before forming the select gate electrode SG in the memory cell portion A1 and the gate electrode 25b in the element portion A3 is used. However, as has been described in the first embodiment with reference to FIGS. 28 to 31, a component corresponding to the metal-element-containing layer 17b (metal-element-containing layer 15a) can be formed also by depositing the polycrystalline silicon film 16 without depositing the metal-element-containing layer 15 over the dielectric film 14, then, ion-injecting a metal element, such as hafnium into the interface between the polycrystalline silicon film 16 and the dielectric film 14 by ion implantation. In this case, the metal-element-containing layer 17b of the dielectric film 17, which is a gate dielectric film of the select transistor in the memory cell portion A1, and the metal-element-containing layer 17b of the dielectric film 17c, which is a gate dielectric film of the MISFET in the element portion A3 of the memory periphery circuit portions, are configured of the metal-element-containing layer 15a formed in the process of the ion implantation 50. Also in this case, by adjusting the amount of implantation in the ion implantation 50 for forming the metal-element-containing layer 15a (metal-element-containing layer 17b), as described in FIGS. 21 and 27, the threshold voltages (flat-band voltages) of the select transistor in the memory cell portion A1 and the MISFET in the element portion A3 of the memory periphery circuit portions can be controlled. Furthermore, by using ion implantation for forming a component corresponding to the metal-element-containing layer 17b, the metal element can be introduced only to a region where the threshold voltage is desired to be changed with changing the type and amount of the metal element.

Still further, in the present embodiment, the case in which one select transistor and one memory transistor are used to form one memory cell has been described. Alternatively, also in the present embodiment, as with FIG. 32 in the first embodiment, the process of removing the polycrystalline silicon spacer 23 on one side of the select gate electrode SG can be eliminated, and by forming the memory gate electrode MG over both side walls of the select gate electrode SG via the dielectric film 21, a memory cell composed of one select transistor and two memory transistors can be formed. In such a memory cell, two bits of information can be stored in one memory cell. Also in such a memory cell, by applying the present embodiment, improvement in data holding characteristic, improvement in tolerance for rewriting, reduction in variations in threshold voltage of the memory transistor, and others can be achieved.

Third Embodiment

In the first and second embodiments described above, the case in which the present invention is applied to a split-gate-type memory cell using a trap dielectric film (corresponding to the dielectric film 21) as a charge storage unit has been described. In a third embodiment, the present invention is applied to a split-gate-type memory cell of a floating-gate type.

In the present embodiment, only the memory cell portion is extracted from a semiconductor device (non-volatile semiconductor storage device), and a structure and a manufacturing process of the memory cell portion are described with reference to FIGS. 41 to 45.

FIGS. 41 to 45 are cross-sectional diagrams of main parts of the semiconductor device during manufacturing process according to the present embodiment, and show the memory cell portion (region corresponding to the memory cell portion A1 in the first and second embodiments). Regions corresponding to the memory periphery circuit portions (the high-voltage element portion A2 and the normal element portion A3) in the first and second embodiments are omitted.

Figure 41:
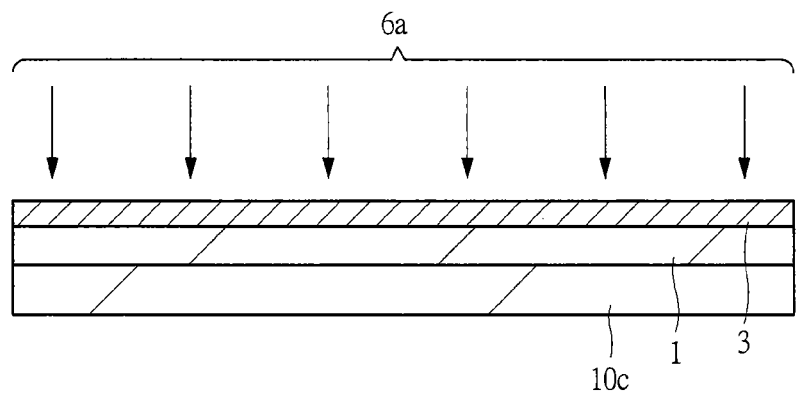
FIG. 41 is a cross-section view of main parts of the semiconductor device during manufacturing process according to another embodiment of the present invention.

In order to manufacture the semiconductor device according to the present embodiment, firstly, as shown in FIG. 41, an element isolation region (corresponding to the element isolation region 2, not shown herein) is formed over the semiconductor substrate 1 similar to that in the first embodiment, and then p-type impurities are ion-implanted, therefore, the p-type well 3 over the surface of the semiconductor substrate 1 to a predetermined depth.

Next, in order to adjust a threshold voltage of the select transistor to be formed later, an ion implantation 6a is performed onto the p-type well 3. This ion implantation 6a corresponds to the ion implantation 6 in the first and second embodiments. In the ion implantation 6a, p-type impurities, such as boron (B), are ion-implanted. With this ion implantation 6a, a semiconductor region (p-type semiconductor region) 10c corresponding to the semiconductor region 10a in the first and second embodiments is formed.

To set the threshold voltage of the select transistor to be formed over the memory cell portion at a desired value, the ion implantation 6a is introduced so as to adjust the impurity density of the semiconductor region 10c later functioning as a channel region of the select transistor. As with the first and second embodiments, also in the present embodiment, by providing the metal-element-containing layer 17b (which has not yet been formed at this stage), a threshold voltage of the select transistor higher than that in the case the metal-element-containing layer 17b is not provided can be obtained. Therefore, in consideration of this, the ion implantation 6a is performed with a less dose amount than a dose amount required in the case where the metal-element containing layer 17b is not provided.

Figure 42:
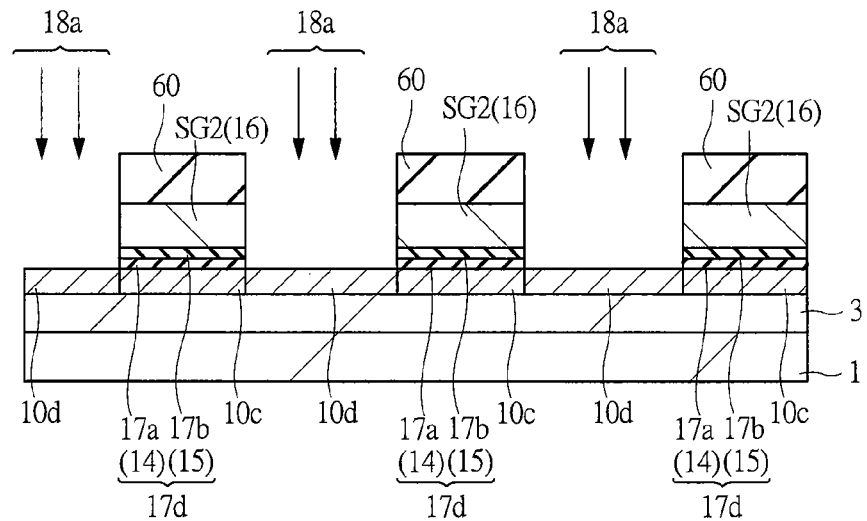
FIG. 42 is a cross-sectional diagram of the main parts of the semiconductor device during manufacturing process continued from FIG. 41.

Next, after a natural oxide film over the surface of the semiconductor substrate 1 is removed by cleaning with dilute hydrofluoric acid or the like, oxidation (thermal oxidation) is performed to form the dielectric film 14 composed of a silicon oxide film, as shown in FIG. 42. Note that, as the dielectric film 14, a silicon oxynitride film can be used in place of a silicon oxide film. Then, the metal-element-containing layer 15 similar to that in the first and second embodiments is formed over the dielectric film 14 by using a similar scheme. Therefore, the metal-element-containing layer 15 is formed of a metal oxide film or a metal silicate film. Note that, the threshold voltage of the select transistor can be adjusted with the amount of metal element contained in the metal-element-containing layer 15 and the impurity density of the channel region (corresponding to the semiconductor region 10c) under the select gate electrode of the memory cell.

After depositing the metal-element-containing layer 15, according to need, nitrogen may be introduced into the metal-element-containing layer 15 by plasma nitriding, heat treatment in an atmosphere of ammonia or the like. Thereafter, superfluous nitrogen can be vaporized as required by heat treatment at relatively high temperature in dilute oxygen or the like.

Next, the polycrystalline silicon film 16 having a thickness on the order of, for example, 150 nm, is deposited over the semiconductor substrate 1 (that is, over the dielectric film 14 on which the metal-element-containing layer 15 is deposited) by using, for example, CVD method or the like. Then, n-type impurities, such as phosphorous (P) is doped into the polycrystalline silicon film 16 with a high density, and then heat treatment is performed for activating the introduced impurities. Then, by using CVD method or the like, a silicon oxide film (dielectric film) 60 having a thickness on the order of, for example, 150 nm, is deposited over the polycrystalline silicon film 16. Then, by using photolithography method and dry etching method or the like, the silicon oxide film 60 and the polycrystalline silicon film 16 are selectively etched (removed), and a select gate electrode SG2 of the memory cell is formed. The select gate electrode SG2 is composed of the patterned polycrystalline silicon film 16, and the silicon oxide film 60 is left over the select gate electrode SG2. With this, a formation planned region for a memory gate electrode MG2, which will be described below, is exposed. The select gate electrode SG2 corresponds to the select gate electrode SG in the first and second embodiments.

The dielectric film 14 and the metal-element-containing layer 15 left under the select gate electrode SG2 become a dielectric film (gate dielectric film or first layer) 17d positioned between the select gate electrode SG2 and the channel region (semiconductor region 10c) and functioning as a gate dielectric film of the select transistor. Therefore, the dielectric film 17d, which is a gate dielectric film of the select transistor, has a multilayered structure of the dielectric film 17a formed of the dielectric film 14 and the metal-element-containing layer 17b formed of the metal-element-containing layer 15 over the dielectric film 17a (14). Since the dielectric film 14 is formed of a silicon oxide film or a silicon oxynitride film, the dielectric film 17b is formed of a silicon oxide film or a silicon oxynitride film The dielectric film 17d corresponds to the dielectric film 17 in the first and second embodiments, and has a structure similar to that of the dielectric film 17. That is, the gate dielectric film (that is, dielectric film 17d positioned under the select gate electrode SG2) of the select transistor (MISFET formed of the select gate electrode SG2) according to the present embodiment has a structure similar to that of the gate dielectric film (that is, dielectric film 17 positioned under the select gate electrode SG).

Next, an ion implantation 18a of impurities is performed by using the select gate electrode SG2 as an ion-implantation inhibiting mask as required. This ion implantation 18a corresponds to the ion implantation 18 in the first and second embodiments. With this ion implantation 18a, in the memory cell portion, impurities are ion-implanted into a region not covered with the select gate electrode SG2. With this, a semiconductor region 10d introduced with the impurities implanted by the ion implantation 18a is formed in the region not covered with the select gate electrode SG2 of (the semiconductor region 10c in) the p-type well 3. With this, the structure of FIG. 42 can be obtained. For the impurities doped in the ion implantation 18a, n-type impurities (for example, arsenic, phosphorus or the like) can be selected according to need.

With the impurities introduced in this ion implantation 18a and the impurities introduced in the ion implantation 6a, the impurity density (charge density of the impurities) of the region (channel region) under the memory gate electrode MG2 to be later formed is adjusted. Also, as with the first and second embodiments, also in the present embodiment, by providing the metal-element-containing layer 17b, the amount (dose amount) of impurities doped in the ion implantation 6a is decreased compared with the case in which the metal-element-containing layer 17b is not provided. Therefore, the doping amount (dose amount) of impurities introduced in the ion implantation 18a required for decreasing the threshold voltage of the memory transistor can be decreased.

Figure 43:
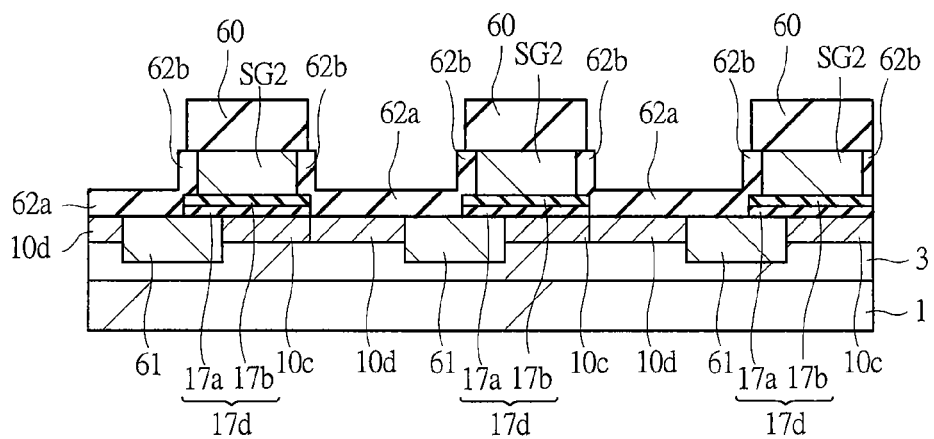
FIG. 43 is a cross-sectional diagram of the main parts of the semiconductor device during manufacturing process continued from FIG. 42.

Next, as shown in FIG. 43, n-type impurities, such as phosphorous (P), are ion-implanted to one side of the select gate SG2 with high density using a photoresist pattern (not shown) as an ion-implantation inhibiting mask, to form an n-type semiconductor region 61. The n-type semiconductor region 61 is a semiconductor region functioning as a source or a drain, and is formed over the p-type well 3 on one side of the select gate SG2.

Next, after sacrificial oxidation, a silicon oxide film 62a having a thickness on the order of, for example, 10 nm, is formed over the semiconductor substrate 1 by thermal oxidation. At this time, a side surface of the select gate electrode SG2 is also oxidized to form a silicon oxide film 62b over the side surface of the select gate electrode SG2. With this, the structure of FIG. 43 can be achieved.

Figure 44:
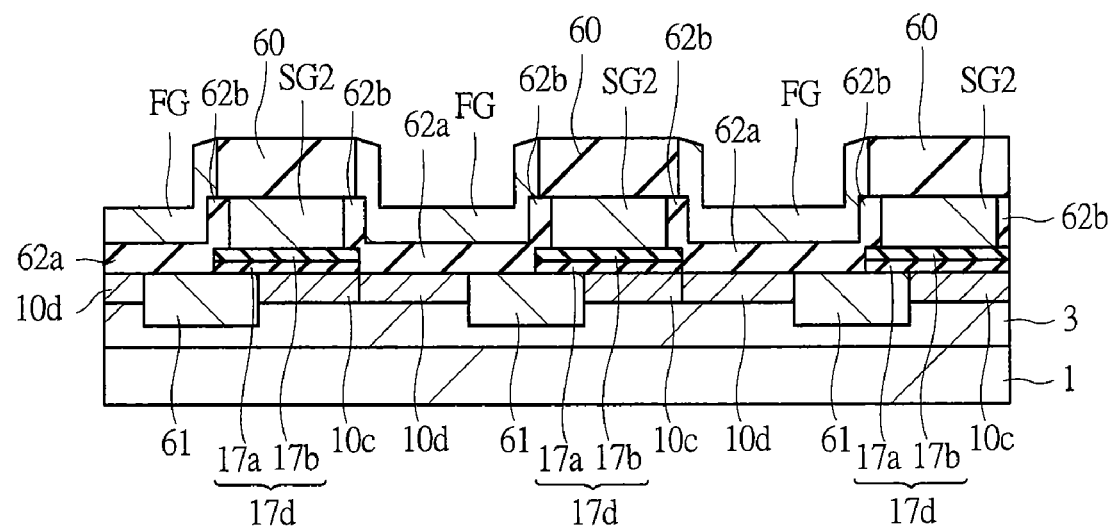
FIG. 44 is a cross-sectional diagram of the main parts of the semiconductor device during manufacturing process continued from FIG. 43.

Next, by using CVD method or the like, an amorphous silicon film is deposited over the semiconductor substrate 1. Then, this amorphous silicon film is etched back by anisotropic etching or the like. With this, as shown in FIG. 44, a floating-gate electrode (floating gate) FG is formed. The silicon oxide film 62a under the floating-gate electrode FG can function as a gate dielectric film of the floating-gate electrode FG.

Next, a first silicon oxide film having a thickness on the order of, for example, 4 to 7 nm, is formed over the semiconductor substrate 1 by thermal oxidation. Over the first silicon oxide film, a silicon nitride film having a thickness on the order of, for example, 8 to 10 nm, is deposited (formed). Over the silicon nitride film, a second silicon oxide film having a thickness on the order of, for example, 7 to 8 nm, is deposited (formed). With this, a dielectric film (ONO multilayered film) 63 having a multilayered structure formed of these first silicon oxide film, silicon nitride film, and second silicon oxide film is formed. Here, in FIG. 45, for easy viewing of the drawing, the multilayered film of the first silicon oxide film, the silicon nitride film, and the second silicon oxide film is shown simply as the dielectric film 63.

Figure 45:
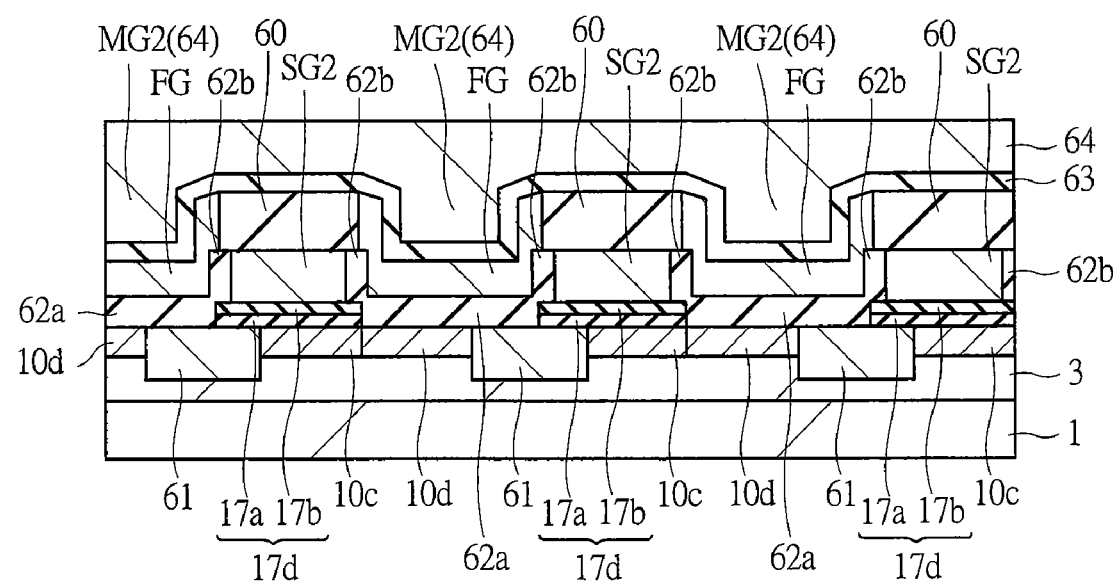
FIG. 45 is a cross-sectional diagram of the main parts of the semiconductor device during manufacturing process continued from FIG. 44.

Next, a polycrystalline silicon film 64 doped with phosphorus (P) or the like is deposited (formed) over the semiconductor substrate 1 by CVD method or the like. Next, polycrystalline silicon film 64 is patterned by known lithography and dry-etching technologies. This patterned polycrystalline silicon film 64 (a portion of the polycrystalline silicon film 64 which is positioned over the floating-gate electrode FG via the dielectric film 63) can function as the memory gate electrode MG2 of the memory transistor. With this, the basic structure of the memory cell shown in FIG. 45 is completed.

Then, as required, an interlayer dielectric film and wiring are formed, but these are not described herein.

The present embodiment has a feature in which, in the split-gate-type memory cell of a floating-gate type using the floating-gate electrode FG surrounded by the dielectric films (dielectric films 62a, 62b, and 63) as the charge storage unit, the gate dielectric film of the select transistor (transistor formed of the select gate electrode SG2) has a structure similar to that of the gate dielectric film of the select transistor in the first and second embodiments.

That is, in the first and second embodiments, the layer (second layer) formed between the memory gate electrode MG and the semiconductor substrate 1 (semiconductor region 10b) and having a charge storage unit therein is formed of an ONO multilayered film (dielectric film 21). By contrast, in the present embodiment, the layer (second layer) formed between the memory gate electrode MG2 and the semiconductor substrate 1 (semiconductor region 10b) and having a charge storage unit therein is formed of a conductive film (floating-gate electrode FG) surrounded by the dielectric films (dielectric films 62a, 62b, and 63). The floating-gate electrode FG (conductive film) functions as a charge storage unit.

Also in the present embodiment, the gate dielectric film of the select transistor (transistor formed of the select gate electrode SG2) is not formed of a single film of silicon oxide or silicon oxynitride. Instead, the metal-element-containing layer 17b formed of a metal oxide or a metal silicate is provided (at an interface) between the dielectric film 17a made of silicon oxide or silicon oxynitride and the select gate electrode SG2. With this, by adjusting the threshold voltages of the select transistor and the memory transistor, improvement in data holding characteristic and speed-up of the memory are achieved.

That is, also in the present embodiment, by providing the gate dielectric film of the select transistor of the memory cell having a structure similar to that in the first and second embodiments (that is, the metal-element-containing layer 17b is provided between the dielectric film 17a and the select gate electrode SG2), compared with the case where the metal-element-containing layer 17b is not provided, if the threshold voltage is the same, as described in the first and second embodiments, the impurity density in the channel regions of both of the select transistor and the memory transistor (in FIG. 45, the channel region of the select transistor corresponds to the semiconductor region 10c, whilst the channel region of the memory transistor corresponds to the semiconductor region 10d) can be suppressed (reduced). Therefore, mobility of the channel can be improved, and variations in threshold voltage can be suppressed. As a result, resistance for rewriting and data holding characteristic of the non-volatile memory can be improved. Therefore, the performance of the semiconductor device with a non-volatile memory can be increased. Also, reliability of the semiconductor device with a non-volatile memory can be increased.

Furthermore, also in the present embodiment, as described in the first and second embodiments, the amount of metal in the metal-element-containing layer 17b (15), the impurity density of the channel regions (semiconductor regions 10c and 10d), and the polarities of the transistors can be changed as required.

Still further, also in the present embodiment, as described in the first embodiment with reference to FIGS. 28 to 31, a component (metal-element-containing layer 15a) corresponding to the metal-element-containing layer 17b can be formed by depositing the polycrystalline silicon film 16 over the dielectric film 14 without depositing the metal-element-containing layer 15, and ion-implanting a metal element, such as hafnium, to the interface between the polycrystalline silicon film 16 and the dielectric film 14 by ion implantation.

Fourth Embodiment

In the first to third embodiments described above, the case in which the present invention is applied to a split-gate-type memory cell in which the gates (gate electrodes) of the select transistor and the memory transistor are separated has been described. In a fourth embodiment, the present invention is applied to a memory cell in which the gate (gate electrode) is shared by the select transistor and the memory transistor. In the present embodiment, an exemplary case in which a floating-gate-type is used as the memory transistor is employed, and a manufacturing process and a structure of the memory cell portion are described using FIGS. 46 to 50.

FIGS. 46 to 50 are cross-sectional diagrams of main parts of the semiconductor device during manufacturing according to the present embodiment. A memory cell portion (region corresponding to the memory cell portion A1 in the first and second embodiments) is illustrated and regions corresponding to the memory periphery circuit portions (the high-voltage element portion A2 and the normal element portion A3) and the like in the first and second embodiments are omitted.

Figure 46:
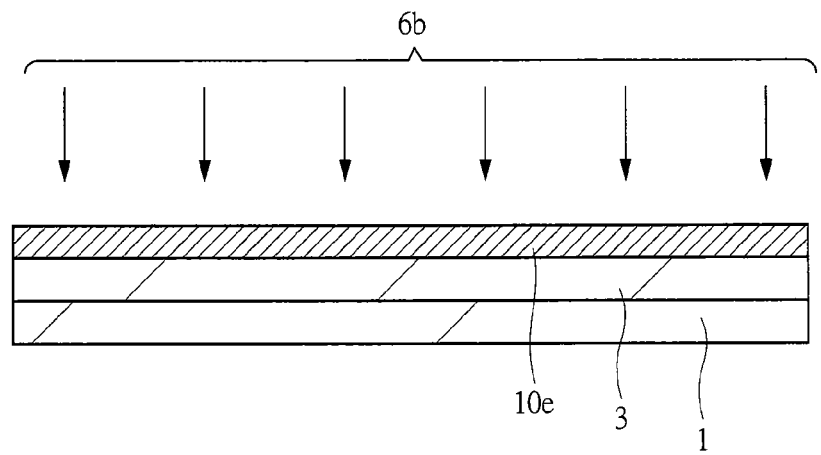
FIG. 46 is a cross-sectional diagram of main parts of the semiconductor device during manufacturing process according to another embodiment of the present invention.

In order to manufacture the semiconductor device according to the present embodiment, firstly, as shown in FIG. 46, an element isolation region (corresponding to the element isolation region 2, not shown herein) is formed over the semiconductor substrate 1 similar to that in the first embodiment, and then ion-implantation of p-type impurities and the like are performed to form the p-type well 3 over the surface of the semiconductor substrate 1 to a predetermined depth.

Next, in order to adjust the threshold voltage of a transistor (memory transistor) to be formed later, an ion implantation 6b is performed for the p-type well 3. In this ion implantation 6b, p-type impurities, such as boron (B), are ion-implanted. With this ion implantation 6b, a semiconductor region (p-type semiconductor region) 10e is formed over an upper layer portion of the p-type well 3.

To set the threshold voltage of the transistor to be formed over the memory cell portion at a desired value, the ion implantation 6b is performed so as to adjust the impurity density of the semiconductor region 10e later functioning as a channel region. As with the first to third embodiments, also in the present embodiment, by providing the metal-element-containing layer 17b (which has not yet been formed at this stage), the threshold voltage is changed compared with the case in which the metal-element-containing layer 17b is not provided. Therefore, in consideration of this, the ion implantation 6b is performed with a less dose amount than a dose amount required in the case where the metal-element containing layer 17b is not provided. Note that, the ion implantation 6b is performed by successively introducing boron (B) impurities and n-type arsenic (As) impurities, and the threshold voltage can be further decreased by a buried-channel scheme.

Figure 47:
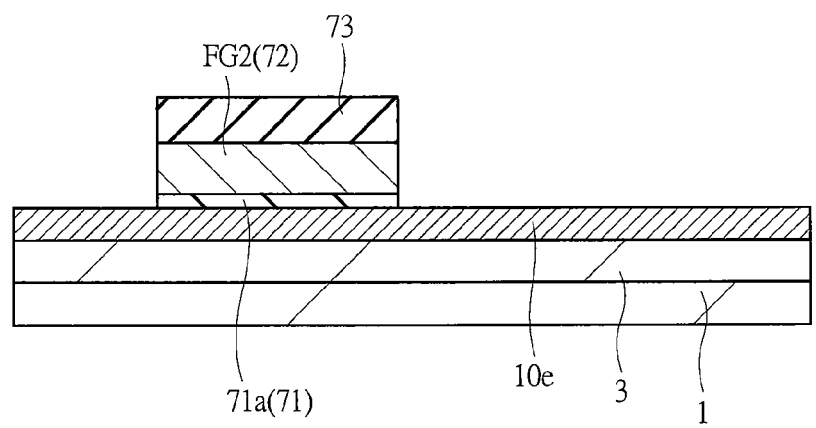
FIG. 47 is a cross-sectional diagram of the main parts of the semiconductor device during manufacturing process continued from FIG. 46.

Next, after a natural oxide film over the surface of the semiconductor substrate 1 is removed by cleaning with dilute hydrofluoric acid or the like, oxidation (thermal oxidation) is performed to form the silicon oxide film 71 serving as a gate dielectric film under the floating gate. Then, by CVD method or the like, an amorphous silicon film 72 serving as a floating-gate electrode and a silicon oxide film 73 are sequentially deposited over the semiconductor substrate 1 (that is, over the silicon oxide film 71). Then, by photolithography method and dry etching method and the like, the silicon oxide film 73, the amorphous silicon film 72, and the silicon oxide film 71 are selectively etched (patterned) to form a multilayered member of the dielectric film 71, the amorphous silicon film 72, and the silicon oxide film 73 being patterned. This patterned amorphous silicon film 72 becomes a floating-gate electrode (floating gate) FG2, and the dielectric film 71 under the floating-gate electrode FG2 becomes the gate dielectric film 71a. Thus, the structure of FIG. 47 is obtained.

Figure 48:
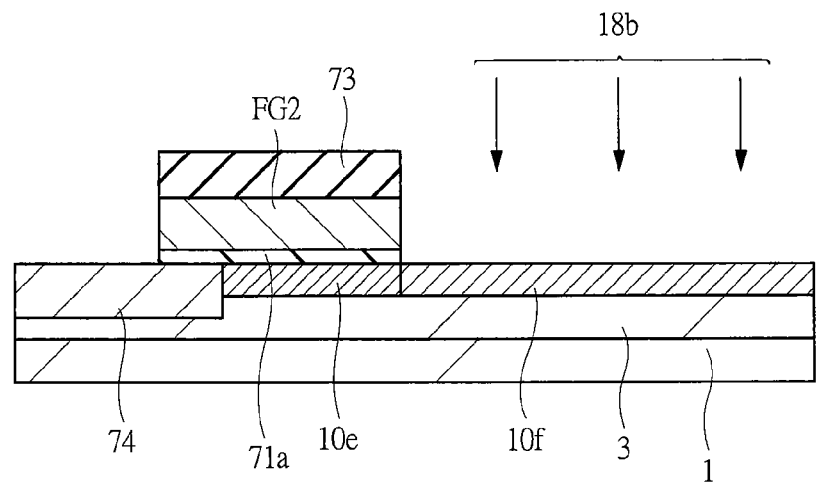
FIG. 48 is a cross-sectional diagram of the main parts of the semiconductor device during manufacturing process continued from FIG. 47.

Next, as shown in FIG. 48, an n-type semiconductor region (impurity diffusion layer) 74 functioning as a source or a drain is formed on (the p-type well 3 of) one side of the floating-gate electrode FG2. The n-type semiconductor region can be formed by ion-implanting n-type impurities, such as phosphorus (P) with high density, with the other side of the floating-gate electrode FG2 being covered with a photoresist pattern (not shown) or the like. Then, according to need, as schematically illustrated with arrows in FIG. 48, by performing an ion implantation 18b of impurities using the silicon oxide film 73 and the floating-gate electrode FG2 as ion-implantation inhibiting masks, the impurity density of the channel region of the select transistor is adjusted. By this ion implantation 18b, the impurities are ion-implanted to a region not covered with the floating-gate electrode FG2 in the memory cell portion. Thus, a semiconductor region 10f to which the impurities are introduced by an ion implantation 18b is formed in the region not covered with the floating-gate electrode FG2 of (the semiconductor region 10e in) the p-type well 3. With this, the structure of FIG. 48 is obtained. Note that, the semiconductor region 10f may be formed first, and then the n-type semiconductor region 74 may be formed.

Figure 49:
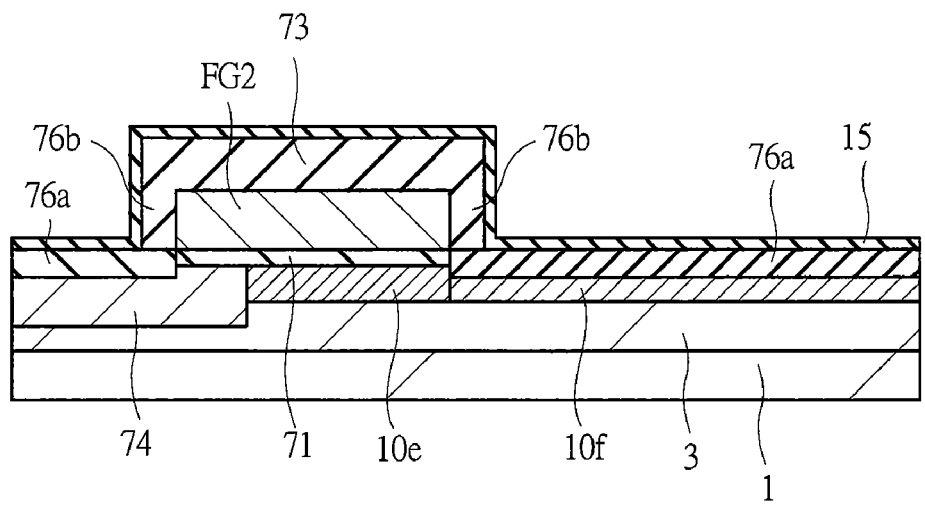
FIG. 49 is a cross-sectional diagram of the main parts of the semiconductor device during manufacturing process continued from FIG. 48.

As shown in FIG. 49, by oxidation (thermal oxidation), a silicon oxide film 76a serving as a gate dielectric film of the select transistor is formed over the surface of the semiconductor substrate 1. At this time, the side surfaces of the floating-gate electrode FG2 are also oxidized, and a silicon oxide film 76b is formed over the side surfaces of the floating-gate electrode FG2. This silicon oxide film 76b is interposed between the floating-gate electrode FG2 and a memory gate (here, the gate electrode GD also serves as a memory gate) that is later formed to electrically separate them from each other. Here, in FIG. 49, the silicon oxide film 76b and the silicon oxide film 73 are both formed of silicon oxide, and therefore are illustrated as being integrated.

Next, the metal-element-containing layer 15 is formed over the silicon oxide films 73, 76a, and 76b using a scheme similar to that in the first to third embodiments. Therefore, the metal-element-containing layer 15 is formed of a metal oxide film or a metal silicate film. Note that, the threshold voltages of the memory transistor and the select transistor can be adjusted with the amount of metal elements contained in this metal-element-containing layer 15 and the impurity density of the channel region (corresponding to the semiconductor regions 10e and 10f) under (the gate electrode of) the transistor.

After depositing the metal-element-containing layer 15, according to need, nitrogen may be introduced into the metal-element-containing layer 15 by plasma nitriding, heat treatment in an atmosphere of ammonia or the like. Thereafter, superfluous nitrogen can be vaporized as required by heat treatment at relatively high temperature in dilute oxygen or the like.

Figure 50:
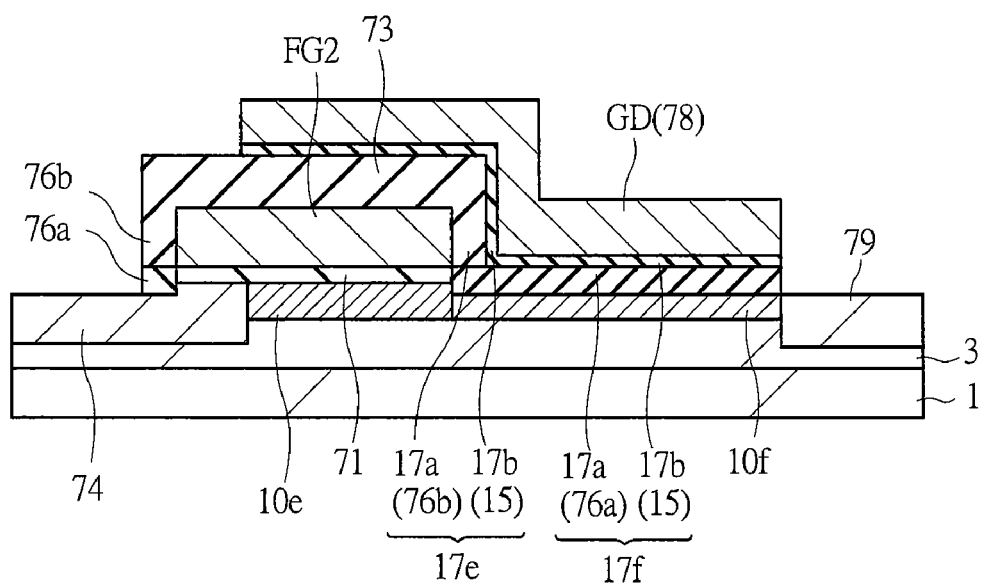
FIG. 50 is a cross-sectional diagram of the main parts of the semiconductor device during manufacturing process continued from FIG. 49.
Figure 51:
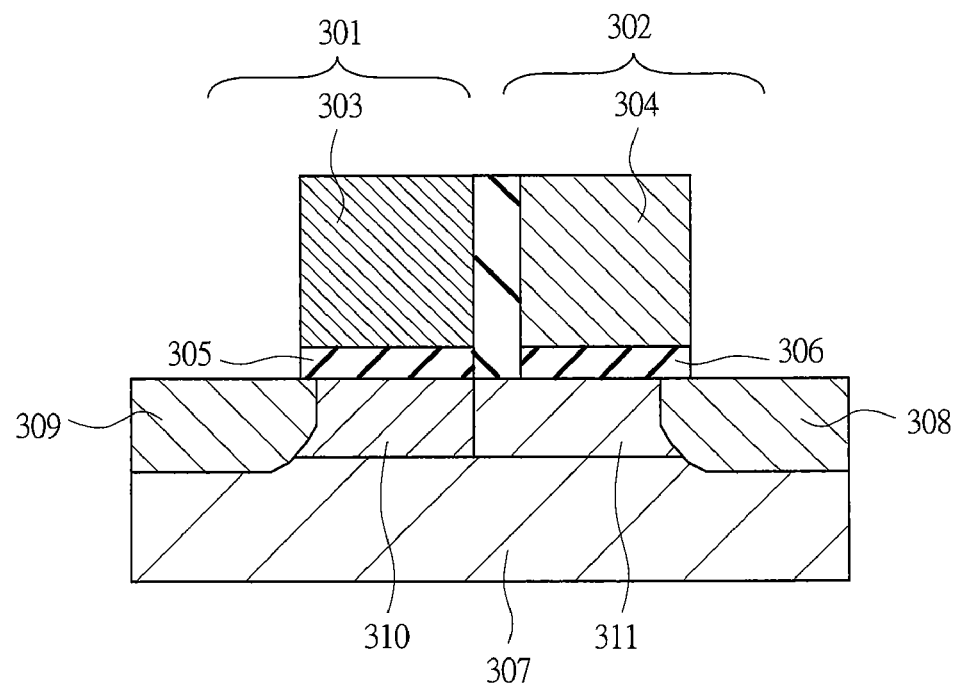
FIG. 51 is a cross-sectional diagram showing a split-gate-type memory cell composed of a select transistor and a memory transistor studied by the present inventors.

Next, as shown in FIG. 50, a polycrystalline silicon film 78 doped with phosphorus (P) or the like is deposited (formed) over the semiconductor substrate 1 by CVD method or the like. Then, by patterning the polycrystalline silicon film 78 using photolithography method and dry etching method, for example, the gate electrode GD common to the select transistor and the memory transistor is formed. Then, an n-type semiconductor region 79 that can function as a source or a drain is formed on one side of the gate electrode GD by ion implantation or the like. With this, the basic structure of the memory cell shown in FIG. 50 is completed. Then, as required, an interlayer dielectric film and wiring are formed, but these are not described herein.

In the memory structure according to the present embodiment, programming is performed by injecting electrons from the channel to the floating gate (floating-gate electrode FG2) with a source side injection scheme. And, erasing is performed by drawing the electrons injected in the floating gate (floating-gate electrode FG2) into the gate electrode GD with tunneling by applying a positive high voltage on the gate electrode GD.

In the memory cell according to the present embodiment, the gate electrode GD serves as a gate electrode of the select transistor and a gate electrode of the memory transistor. And, the multilayered film of the silicon oxide film 76a and the metal-element-containing layer 115 positioned under the gate electrode GD becomes the dielectric film (gate dielectric film) 17e functioning as a gate dielectric film of the select transistor, and the multilayered film of the silicon oxide film 76b and the metal-element-containing layer 15 positioned between the gate electrode GD and the floating-gate electrode FG2 becomes the dielectric film (gate dielectric film) 17f functioning as a gate dielectric film of the memory transistor.

Therefore, both of the dielectric film 17e as a gate dielectric film of the select transistor and the dielectric film 17f functioning as a gate dielectric film of the memory transistor have a multilayered structure of the dielectric film 17a formed of the silicon oxide film 76a or the silicon oxide film 76b and the metal-element-containing layer 17b formed of the metal-element-containing layer 15 over the dielectric film 17a. In the case where silicon oxynitride film is formed in place of the silicon oxide films 76a and 76b, the dielectric film 17a of the dielectric films 17e and 17f are formed of the silicon oxynitride film.

The present embodiment has a feature in which, in the memory cell in which the gate electrode is shared by the select transistor and the memory transistor, both of the gate dielectric films of the select transistor and the memory transistor have a structure similar to that of the gate dielectric film of the select transistor in the first and second embodiments. That is, also in the present embodiment, both of the gate dielectric films of the select transistor and the memory transistor are not formed of a single film of silicon oxide nor silicon oxynitride. Instead, the metal-element-containing layer 17b formed of a metal oxide or a metal silicate is provided (at an interface) between the dielectric film 17a made of silicon oxide or silicon oxynitride and the gate electrode GD. With this, by adjusting the threshold voltages of the select transistor and the memory transistor, the impurity density of the channel region of each transistor can be decreased. Thus, improvement in data holding characteristic, improvement in tolerance for rewriting, and speed-up of the memory can be achieved.

That is, in the present embodiment, by providing both of the gate dielectric films of the select transistor and the memory transistor having a structure similar to that of the gate dielectric film of the select transistor in the first and second embodiments (that is, the metal-element-containing layer 17b is provided between the dielectric film 17a and the gate electrode DG), compared with the case where the metal-element-containing layer 17b (15) is not provided, if the threshold voltage is the same, as described in the first and second embodiments, the impurity density of the channel regions (in FIG. 50, corresponding to the semiconductor regions 10e and 10f) of both of the select transistor and the memory transistor can be suppressed (reduced). Therefore, mobility of the channel can be improved. And, since Fermi level pinning supports an increase in work function of the gate, as described in Non-Patent Document 6, a difference in work function between the p-type silicon substrate and the n-type silicon substrate is decreased, for example. Thus, in a holding state (where the voltage applied to the gate electrode DG is zero), the electric field applied to the gate dielectric films above and under the floating-gate electrode FG2 is decreased, therefore, an effect of improving the data holding characteristic can be obtained.

Therefore, the performance of the semiconductor device with a non-volatile memory can be improved. Also, reliability of the semiconductor device with a non-volatile memory can be increased.

Also, in the present embodiment, as described in the first and second embodiments, the amount of metal in the metal-element-containing layer 17b (15), the impurity density of the channel regions (semiconductor regions 10e and 10f), and the polarities of the transistors can be changed as required.

And, in the present embodiment, as described in the first embodiment with reference to FIGS. 28 to 31, a component (metal-element-containing layer 15a) corresponding to the metal-element-containing layer 17b can be formed by depositing the polycrystalline silicon film 78 without depositing the metal-element-containing layer 15, and ion-implanting a metal element, such as hafnium to the interface between the polycrystalline silicon film 78 and the silicon oxide film 76a by ion implantation.

And, in the present embodiment, the case of the memory transistor of a floating-gate-type has been described. However, in place of the floating gate, a silicon nitride film can be used for application of a memory transistor of a MONOS scheme.

Hereinabove, the present invention achieved by the inventors has been explained specifically based on the embodiments thereof. However, the invention is not restricted to those embodiments. It is obvious that various changes and modifications may be made in a scope of the invention without departing from a gist of the invention.

The present invention is suitable for application to a semiconductor device including a non-volatile memory and a method of manufacturing the same.

What is claimed is:

1. A semiconductor device comprising:
a semiconductor substrate;
a first gate electrode and a second gate electrode each formed over an upper portion of the semiconductor substrate and adjacent to each other;
a first layer formed between the first gate electrode and the semiconductor substrate and functioning as a gate dielectric film of the first gate electrode;
a second layer formed between the second gate electrode and the semiconductor substrate and including a charge storage portion;
a first channel region formed over the semiconductor substrate and positioned under the first gate electrode and the first layer; and
a second channel region formed over the semiconductor substrate and positioned under the second gate electrode and the second layer,
wherein the first layer contains a metal element,
wherein impurities having a reverse conducting type with respect to a conducting type of impurities in the first channel region are doped into the second channel region, and
wherein the second channel region includes a region in which an effective charge density of impurities is lower than a charge density of impurities in the first channel region.

2. The semiconductor device according to claim 1,
wherein the first layer includes a first dielectric film composed of silicon oxide or silicon oxynitride formed over the semiconductor substrate and a metal-element-containing layer formed between the first gate electrode and the first dielectric film.

3. The semiconductor device according to claim 2,
wherein the metal element forming the metal-element-containing layer is hafnium, zirconium, or aluminum.

4. The semiconductor device according to claim 2,
wherein the metal-element-containing layer is made of metal oxide or metal silicate.

5. The semiconductor device according to claim 2,
wherein a surface density of the metal element forming the metal-element-containing layer in the first layer is $1 \times 10^{12}$ to $2 \times 10^{15}$ atoms/cm$^2$.

6. The semiconductor device according to claim 2,
wherein the first dielectric film is thicker than the metal-element-containing layer.

7. The semiconductor device according to claim 2,
wherein the first gate electrode, at least a region thereof contacting with the first layer, is made of silicon.

8. The semiconductor device according to claim 2,
wherein the metal-element-containing layer acts so as to increase an absolute value of a threshold voltage of a MISFET using the first gate electrode as a gate electrode.

9. The semiconductor device according to claim 1,
wherein the charge density of the impurities in the second channel region is lower than the charge density of the impurities in the first channel region.

10. The semiconductor device according to claim 9,
wherein impurities of a first conducting type are introduced into the first channel region, and
wherein the impurities of the first conducting type and impurities of a second conducting type reverse to the first conducting type are introduced into the second channel region.

11. The semiconductor device according to claim 10,
wherein the charge density of the impurities in the first channel region is $5 \times 10^{16}$ to $1 \times 10^{18}$/cm$^3$.

12. The semiconductor device according to claim 1,
wherein the second layer is formed of a multilayered film of a silicon oxide film, a silicon nitride film, and a silicon oxide film.

13. The semiconductor device according to claim 1,
wherein the second layer is formed between the second gate electrode and the semiconductor substrate and between the first gate electrode and the second gate electrode, and
wherein the first gate electrode and the second gate electrode are adjacent to each other via the second layer.

14. The semiconductor device according to claim 1,
wherein the second layer is formed of a conductive film surrounded by a dielectric film, and the conductive film functions as the charge storage portion.

15. The semiconductor device according to claim 1,
wherein the semiconductor device includes a non-volatile memory, and
wherein the first gate electrode and the second gate electrode are gate electrodes forming the non-volatile memory.

* * * * *